(12) United States Patent
Thiel et al.

(10) Patent No.: US 10,727,457 B2
(45) Date of Patent: *Jul. 28, 2020

(54) SYSTEM FOR SUPPLYING POWER TO A PORTABLE BATTERY USING AT LEAST ONE SOLAR PANEL

(71) Applicant: LAT Enterprises, Inc., Raleigh, NC (US)

(72) Inventors: Laura Thiel, Raleigh, NC (US); Giancarlo Urzi, Raleigh, NC (US); Carlos Cid, Raleigh, NC (US)

(73) Assignee: LAT ENTERPRISES, INC., Raleigh, NC (US)

( * ) Notice: Subject to any disclaimer, the term of this patent is extended or adjusted under 35 U.S.C. 154(b) by 143 days.

This patent is subject to a terminal disclaimer.

(21) Appl. No.: 15/975,116

(22) Filed: May 9, 2018

(65) Prior Publication Data

US 2018/0258882 A1 Sep. 13, 2018

Related U.S. Application Data

(63) Continuation-in-part of application No. 15/886,351, filed on Feb. 1, 2018, now Pat. No. 10,531,590, which
(Continued)

(51) Int. Cl.
*H01M 2/06* (2006.01)
*H01M 2/10* (2006.01)
(Continued)

(52) U.S. Cl.
CPC .......... *H01M 2/1005* (2013.01); *A41D 1/002* (2013.01); *A41D 1/04* (2013.01); *A41D 13/015* (2013.01);
(Continued)

(58) Field of Classification Search
CPC ............ H01M 2/1006; H01M 2/1061; H01M 2/1066; A41D 1/002; A41D 1/005;
(Continued)

(56) References Cited

U.S. PATENT DOCUMENTS 1,901,232 A * 3/1933 Glowacki ............... F21V 21/02
174/491
RE21,577 E 9/1940 Brownlee
(Continued)

FOREIGN PATENT DOCUMENTS

JP 2003174179 A 6/2003
KR 101159750 B1 3/2012
(Continued)

OTHER PUBLICATIONS

Electropaedia; Battery and Energy Technologies; printout from Jul. 2, 2012; pp. 1-5 (Year: 2012).

*Primary Examiner* — Edward J. Schmiedel
(74) *Attorney, Agent, or Firm* — Neo IP

(57) ABSTRACT

A system for supplying power to a portable battery pack including a battery enclosed by a wearable and replaceable pouch or skin using at least one solar panel is disclosed, wherein the pouch or skin can be provided in different colors and/or patterns. Further, the pouch or skin can be MOLLE-compatible. The battery comprises a battery element housed between a battery cover and a back plate, wherein the battery element, battery cover, and back plate have a slight curvature or contour. Further, the battery comprises flexible leads.

20 Claims, 59 Drawing Sheets

Related U.S. Application Data is a continuation-in-part of application No. 15/836,259, filed on Dec. 8, 2017, now Pat. No. 10,476,054, application No. 15/975,116, which is a continuation-in-part of application No. 15/836,299, filed on Dec. 8, 2017, said application No. 15/836,259 is a continuation-in-part of application No. 15/720,270, filed on Sep. 29, 2017, now Pat. No. 10,461,289, said application No. 15/836,299 is a continuation-in-part of application No. 15/720,270, filed on Sep. 29, 2017, now Pat. No. 10,461,289, and a continuation-in-part of application No. 15/664,776, filed on Jul. 31, 2017, said application No. 15/720,270 is a continuation-in-part of application No. 15/664,776, filed on Jul. 31, 2017, which is a continuation-in-part of application No. 15/470,382, filed on Mar. 27, 2017, application No. 15/975,116, which is a continuation-in-part of application No. 15/390,802, filed on Dec. 27, 2016, now Pat. No. 9,990,813, said application No. 15/720,270 is a continuation-in-part of application No. 14/520,821, filed on Oct. 22, 2014, now Pat. No. 9,780,344, said application No. 15/470,382 is a continuation of application No. 14/516,217, filed on Oct. 16, 2014, now Pat. No. 9,494,108, and a continuation-in-part of application No. 14/516,127, filed on Oct. 16, 2014, now abandoned, said application No. 15/390,802 is a continuation-in-part of application No. 14/156,094, filed on Jan. 15, 2014, now abandoned.

(51) Int. Cl.
| | |
|---|---|
| *F02K 1/72* | (2006.01) |
| *F02K 1/76* | (2006.01) |
| *H02S 40/38* | (2014.01) |
| *A41D 13/015* | (2006.01) |
| *A41D 1/00* | (2018.01) |
| *A41D 1/04* | (2006.01) |
| *A45C 13/10* | (2006.01) |

(52) U.S. Cl.
CPC ............... *A45C 13/10* (2013.01); *F02K 1/72* (2013.01); *F02K 1/763* (2013.01); *H01M 2/1016* (2013.01); *H02S 40/38* (2014.12); *F05D 2260/96* (2013.01); *H01M 2220/30* (2013.01)

(58) Field of Classification Search
CPC ...... A41D 1/04; A41D 13/015; A41D 27/205; A45C 3/001; A45C 13/08; A45C 13/10; A45C 13/36
See application file for complete search history.

(56) References Cited

U.S. PATENT DOCUMENTS

| | | | | |
|---|---|---|---|---|
| 2,450,369 | A | * | 9/1948 | Alexander ........... H01R 13/562 439/448 |
| 2,501,725 | A | | 3/1950 | Knopp |
| 3,952,694 | A | | 4/1976 | McDonald |
| 3,968,348 | A | | 7/1976 | Stanfield |
| 4,080,677 | A | | 3/1978 | Koehler |
| 4,656,770 | A | | 4/1987 | Nuttle |
| 4,872,414 | A | | 10/1989 | Asquith |
| 4,944,916 | A | | 7/1990 | Franey |
| 5,185,042 | A | | 2/1993 | Ferguson |
| 5,245,943 | A | | 9/1993 | Hull et al. |
| 5,326,297 | A | | 7/1994 | Loughlin |
| 5,421,287 | A | | 6/1995 | Yonover |
| 5,522,943 | A | * | 6/1996 | Spencer ................ H01L 31/042 136/245 |
| 5,537,022 | A | | 7/1996 | Huang |
| 5,653,367 | A | | 8/1997 | Abramson |
| 5,680,026 | A | | 10/1997 | Lueschen |
| 5,736,954 | A | | 4/1998 | Veazey |
| 6,239,701 | B1 | | 5/2001 | Vasquez et al. |
| 6,259,228 | B1 | | 7/2001 | Becker et al. |
| 6,303,248 | B1 | | 10/2001 | Peterson |
| 6,313,396 | B1 | | 11/2001 | Glenn |
| 6,351,908 | B1 | | 3/2002 | Thomas |
| 6,380,713 | B2 | | 4/2002 | Namura |
| 6,415,734 | B1 | | 7/2002 | LaPuzza |
| 6,727,197 | B1 | | 4/2004 | Wilson et al. |
| 6,784,833 | B1 | | 8/2004 | Evans |
| 7,074,520 | B2 | | 2/2006 | Probst et al. |
| 7,124,593 | B2 | | 10/2006 | Feher |
| 7,141,330 | B2 | | 11/2006 | Aoyama |
| 7,624,453 | B2 | | 12/2009 | Rene et al. |
| 7,695,334 | B2 | | 4/2010 | Yonover et al. |
| 7,798,090 | B2 | | 9/2010 | Hatfield |
| 7,805,114 | B1 | | 9/2010 | Quintana et al. |
| 7,878,678 | B1 | | 2/2011 | Stamatatos |
| 8,258,394 | B2 | | 9/2012 | Baruh |
| 8,720,762 | B2 | | 5/2014 | Hilliard et al. |
| 8,736,108 | B1 | | 5/2014 | Nielson et al. |
| 8,832,981 | B2 | | 9/2014 | Desaulniers |
| 8,945,328 | B2 | | 2/2015 | Longinotti-Buitoni et al. |
| 8,984,666 | B1 | | 3/2015 | LoBue |
| 9,029,681 | B1 | | 5/2015 | Nielson et al. |
| 9,093,586 | B2 | | 7/2015 | Lentine et al. |
| 9,138,022 | B2 | | 9/2015 | Walker |
| 9,141,143 | B2 | | 9/2015 | Morita |
| 9,143,053 | B1 | | 9/2015 | Lentine et al. |
| 9,144,255 | B1 | | 9/2015 | Perciballi |
| 9,496,448 | B2 | | 11/2016 | Cruz-Campa et al. |
| 9,508,881 | B2 | | 11/2016 | Tauke-Pedretti et al. |
| 9,531,322 | B2 | | 12/2016 | Okandan et al. |
| 9,548,411 | B2 | | 1/2017 | Nielson et al. |
| 9,559,219 | B1 | | 1/2017 | Okandan et al. |
| 9,709,362 | B2 | | 7/2017 | Shelley |
| 9,780,344 | B2 | | 10/2017 | Thiel et al. |
| 2003/0098060 | A1 | | 5/2003 | Yoshimi |
| 2004/0154076 | A1 | | 8/2004 | Yoo |
| 2004/0237178 | A1 | | 12/2004 | Landeros |
| 2005/0210722 | A1 | | 9/2005 | Graef et al. |
| 2007/0030146 | A1 | | 2/2007 | Shepherd |
| 2007/0245444 | A1 | | 10/2007 | Brink |
| 2008/0190476 | A1 | | 8/2008 | Baruh |
| 2008/0223428 | A1 | | 9/2008 | Zeira |
| 2008/0223431 | A1 | | 9/2008 | Chu |
| 2009/0004909 | A1 | * | 1/2009 | Puzio ........................ B27B 5/29 439/460 |
| 2009/0114690 | A1 | * | 5/2009 | Landay ................ A45C 7/0054 224/575 |
| 2009/0164174 | A1 | | 6/2009 | Bears et al. |
| 2009/0229655 | A1 | | 9/2009 | Lee |
| 2009/0272773 | A1 | | 11/2009 | Andrade |
| 2009/0279810 | A1 | | 11/2009 | Nobles |
| 2011/0097069 | A1 | | 4/2011 | Braithwaite |
| 2011/0100425 | A1 | | 5/2011 | Osamura et al. |
| 2011/0290683 | A1 | | 12/2011 | High et al. |
| 2012/0025766 | A1 | | 2/2012 | Reade et al. |
| 2012/0045929 | A1 | | 2/2012 | Streeter et al. |
| 2012/0060261 | A1 | | 3/2012 | Raviv |
| 2012/0186000 | A1 | | 7/2012 | Raviv |
| 2013/0049991 | A1 | | 2/2013 | Mothaffar |
| 2013/0263922 | A1 | | 10/2013 | Jung et al. |
| 2013/0294712 | A1 | | 11/2013 | Seuk |
| 2014/0072864 | A1 | | 3/2014 | Suzuta et al. |
| 2014/0082814 | A1 | | 3/2014 | Rober et al. |
| 2014/0101831 | A1 | | 4/2014 | Balzano |
| 2015/0114444 | A1 | | 4/2015 | Lentine et al. |
| 2015/0114451 | A1 | | 4/2015 | Anderson et al. |
| 2015/0128845 | A1 | | 5/2015 | Desaulniers |
| 2015/0216245 | A1 | | 8/2015 | Kinsley |
| 2015/0263377 | A1 | | 9/2015 | Brooks et al. |
| 2015/0295617 | A1 | | 10/2015 | Lai et al. |

(56) References Cited

U.S. PATENT DOCUMENTS

| | | | |
|---|---|---|---|
| 2016/0112004 A1* | 4/2016 | Thiel | H02S 40/42 |
| | | | 136/246 |
| 2016/0118634 A1* | 4/2016 | Thiel | A41D 1/002 |
| | | | 429/99 |
| 2016/0360146 A1 | 12/2016 | Smith | |
| 2017/0045337 A1 | 2/2017 | Kim | |
| 2017/0229692 A1 | 8/2017 | Thiel et al. | |
| 2017/0245567 A1 | 8/2017 | Fathollahi et al. | |
| 2017/0280797 A1 | 10/2017 | Bayliss | |
| 2018/0053919 A1 | 2/2018 | Thiel et al. | |
| 2018/0062197 A1 | 3/2018 | Thiel et al. | |
| 2018/0102518 A1 | 4/2018 | Thiel et al. | |

FOREIGN PATENT DOCUMENTS

| | | |
|---|---|---|
| KR | 101145898 B1 | 5/2012 |
| KR | 101159750 B1 | 6/2012 |
| KR | 101294972 B1 | 12/2012 |
| KR | 101294972 B1 | 8/2013 |
| WO | 2016061508 A1 | 4/2016 |

\* cited by examiner

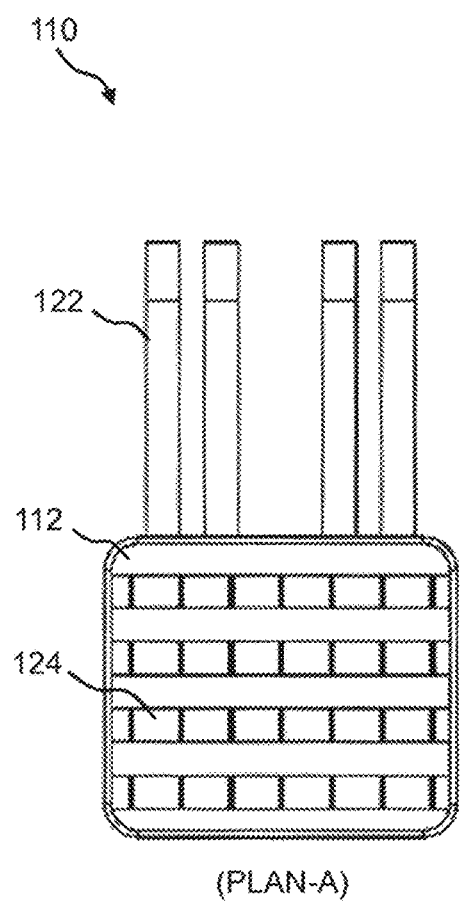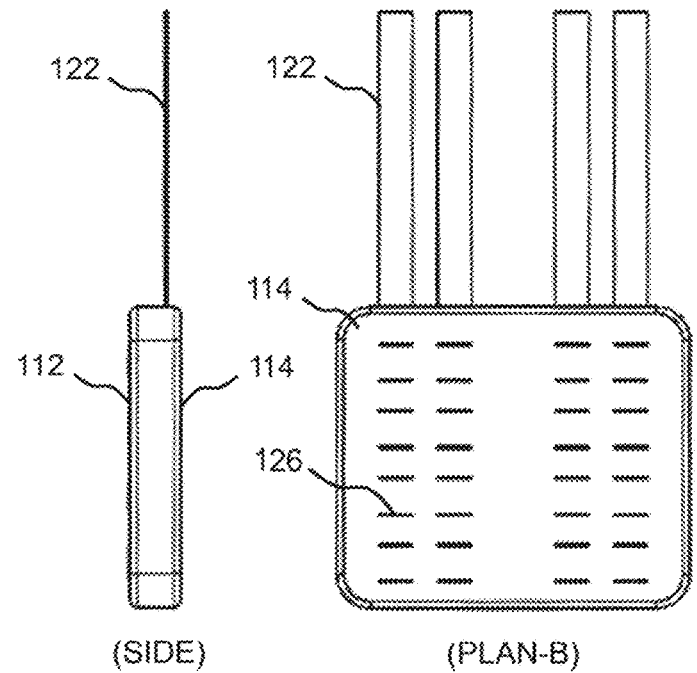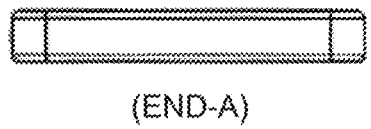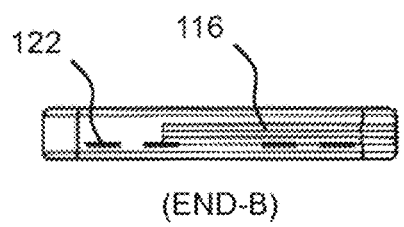
FIG. 9A (PLAN-A)  FIG. 9B (SIDE)  FIG. 9C (PLAN-B)  FIG. 9D (END-A)  FIG. 9E (END-B)

SYSTEM FOR SUPPLYING POWER TO A PORTABLE BATTERY USING AT LEAST ONE SOLAR PANEL

CROSS REFERENCE TO RELATED APPLICATIONS

This application is related to and claims priority from the following U.S. patents and patent applications: this application is a continuation-in-part of U.S. application Ser. No. 15/390,802, filed Dec. 27, 2016, a continuation-in-part of U.S. application Ser. No. 15/886,351, filed Feb. 1, 2018, and a continuation-in-part of U.S. application Ser. No. 15/836,299, filed Dec. 8, 2017. U.S. application Ser. No. 15/390,802 is a continuation-in-part of U.S. application Ser. No. 14/156,094, filed Jan. 15, 2014. U.S. application Ser. No. 15/886,351 is a continuation-in-part of U.S. application Ser. No. 15/836,259, filed Dec. 8, 2017, which is a continuation-in-part of U.S. application Ser. No. 15/720,270, filed Sep. 29, 2017, which is a continuation-in-part of U.S. application Ser. No. 14/520,821, filed Oct. 22, 2014. U.S. application Ser. No. 15/720,270 is also a continuation-in-part of U.S. application Ser. No. 15/664,776, filed Jul. 31, 2017, which is a continuation-in-part of U.S. application Ser. No. 15/470,382, filed Mar. 27, 2017, which is a continuation-in-part of U.S. application Ser. No. 14/516,127, filed Oct. 16, 2014. U.S. application Ser. No. 15/836,299 is a continuation-in-part of U.S. application Ser. No. 15/664,776, filed Jul. 31, 2017, and a continuation-in-part of U.S. application Ser. No. 15/720,270, filed Sep. 29, 2017. U.S. application Ser. No. 15/664,776 is a continuation-in-part of U.S. application Ser. No. 15/470,382, filed Mar. 27, 2017, which is a continuation-in-part of U.S. application Ser. No. 14/516,127, filed Oct. 16, 2014. U.S. application Ser. No. 15/720,270 is a continuation-in-part of U.S. application Ser. No. 14/520,821, filed Oct. 22, 2014, and a continuation-in-part of U.S. application Ser. No. 15/664,776, filed Jul. 31, 2017, which is a continuation-in-part of U.S. application Ser. No. 15/470,382, filed Mar. 27, 2017, which is a continuation-in-part of U.S. application Ser. No. 14/516,127, filed Oct. 16, 2014. Each of the U.S. Applications mentioned above is incorporated herein by reference in its entirety.

BACKGROUND OF THE INVENTION

1. Field of the Invention

The present invention relates generally to portable equipment for military, law enforcement, aviation, personal survival, hiking, sporting, recreation, hunting, water sports, and camping applications and, more particularly, to a system for supplying power to a portable battery pack including one or more batteries enclosed by a wearable and replaceable pouch or skin using at least one solar panel.

2. Description of the Prior Art

Portable power sources are used in, for example, military applications, law enforcement applications, aviation applications, wilderness and personal survival applications, hiking and camping applications, sporting and recreation applications, hunting applications, land surveying and expedition applications, and disaster relief efforts. For example, portable battery packs exist for carrying in a backpack or for wearing on the body. These battery packs, however, can be heavy and inconvenient to access and connect to devices requiring electrical power. Further, some applications require that the appearance of the battery pack blend with the environment in which they are used. Current battery packs, however, might not offer flexibility of appearance or the consumer is forced to buy one battery pack for one environment and a different battery pack for a different environment.

Additionally, portable battery packs are increasingly required to provide power to a plurality of peripheral electronic devices. The plurality of peripheral electronic devices is often connected to a power distribution and data hub, which supplies power to the plurality of peripheral electronic devices and transfers data between the plurality of peripheral electronic devices.

Prior art patent documents include the following:

U.S. Pat. No. 2,501,725 for instrument structure for portable testing voltmeters by inventor Knopp, filed Apr. 9, 1945 and issued Mar. 28, 1950, is directed to portable electric voltage testers and more particularly in the instruments used in such testers; for indicating the values of alternating and direct current voltages, and the polarity of unidirectional current circuits tested; the presence or absence of electrical energy on metallic parts in the vicinity of electrical energy sources; etc.

U.S. Pat. No. 5,537,022 for enclosed battery holder by inventor Huang, filed Aug. 22, 1995 and issued Jul. 16, 1996, is directed to an enclosed battery charger including a seat, a cover, and a conductive metal plate means. The seat is provided with a partition which has one end thereof extending upwardly to form a partition rib for preventing contact of two conductive metal plates. A front wall of the seat is provided with an inverted-L shaped hook piece, and a rear wall of the seat is provided with an engaging hole. The cover is provided with a rib having a rib section projected from an inner side thereof. The rib and rib section of the cover enclose a rib of the seat. The cover also has a hook piece which is retained by the engaging hole. The cover further has a slot corresponding to the hook piece of the front wall. A push-button switch and a metal piece are further provided to control connection of electricity. A post is disposed in the seat for preventing the wires and the conductive metal plates from slipping off. In addition, an insulated plate is passed through a slot in the cover to be disposed between the batteries and the conductive metal plates for preventing abnormal electricity discharge.

U.S. Pat. No. 5,653,367 for holster arrangement for a transportable communications device by inventor Abramson, filed Sep. 27, 1995 and issued Aug. 5, 1997, is directed to a holster arrangement for a transportable communications device that is worn by a user and is arranged to have a holder portion positioned on either side of the user's torso. Straps extending from a shoulder pad are utilized to support the holder portion and to secure the holster arrangement to the user. The holder portion is arranged to support a case in varied positions with the case being mountable on the holder portion at a substantially vertical position and at angular positions to the holder portion. Two angular mounting positions are provided to facilitate the use of the holster arrangement when fitted to either side of the user. The case for holding the communications device is readily detached from the holder of the holster arrangement.

U.S. Pat. No. 5,680,026 for tool belt with battery assembly by inventor Lueschen, filed Mar. 21, 1994 and issued Oct. 21, 1997, is directed to an apparatus comprising: a battery assembly including exactly five parallel rows of C cells, each row having exactly four C cells arranged end to end in series, all of the rows being electrically connected together in series, a casing which surrounds the rows, a cable having a first end inside the casing, the first end of the cable having a first lead electrically connected to one end of the series connection of the rows, and the first end of the cable having a second lead electrically connected to the other end of the series connection of the rows, the cable having a second end outside the casing, and a male connector electrically connected to the second end of the cable; a belt adapted to be worn around the waist of a user, the belt having an adjustable girth so as to fit users having different waist sizes; a pocket supported by the belt and slideably movable along the girth of the belt, the pocket closely housing the battery assembly; and a portable, hand held, electrically powered cable tie tensioning tool, the tool having a female connector connected to the male connector of the battery assembly.

U.S. Pat. No. 6,259,228 for battery pack and protective pouch therefor by inventors Becker et al., filed Feb. 11, 2000 and issued Jul. 10, 2001, is directed to a protective housing for a jump-starting battery pack includes a flexible sheet of multi-layered, electrically insulating fabric material including inner and outer nylon layers and a foam padding layer sandwiched therebetween adapted to be folded around the case of a battery pack positioned in the middle of the sheet and held closed by Velcro-type closures. Retaining straps secure the battery pack in place, one of the straps having stacks of secured-together folds positioned on opposite sides of the case to provide supports on which the connector clamps of the battery pack jumper cables can be clamped, with the cables projecting from the open top of the housing to serve as handles.

U.S. Pat. No. 6,380,713 for battery pack by inventor Namura, filed Apr. 25, 2001 and issued Apr. 30, 2002, is directed to a battery pack holding a first block adjacent to a second block in a case. The first and second blocks are a plurality of circular cylindrical batteries arranged in the same horizontal plane. The first and second blocks are each made up of N batteries lined up side-by-side in parallel fashion to form a lateral battery array, and M perpendicular batteries in close proximity to an electrode end of the lateral battery array and oriented at right angles to the batteries of the lateral battery array. The circular cylindrical batteries of the first and second blocks are arranged with point-by-point symmetry about the center of the rectangular case. Further, the electrode ends of perpendicular batteries protrude beyond a side of the lateral battery array towards the neighboring block to provide center region space between the first and second blocks.

U.S. Pat. No. 6,727,197 for wearable transmission device by inventors Wilson et al., filed Nov. 17, 2000 and issued Apr. 27, 2004, is directed to a knitted, woven, or braided textile ribbon including fibers and having a length and selvage edges and one or more transmission elements running the length of the ribbon in place of one or more of the fibers and integrated with the fibers to transmit data and/or power along the length of the ribbon.

U.S. Pat. No. 6,870,089 for system and apparatus for charging an electronic device using solar energy by inventor Gray, filed Nov. 12, 2002 and issued Mar. 22, 2005, is directed to a system and apparatus for charging an electronic device using solar energy. In one form, a portable storage apparatus operable to charge a battery associated with an electronic device is disclosed. The apparatus includes a first material configured to provide a storage space for storing articles. The storage space includes an interior portion and an exterior portion. The apparatus further includes a first flexible solar panel coupled to an exterior portion of the portable storage apparatus and integrated as a part of the first material. A second positional solar panel is also provided and coupled to an interior portion of the portable storage apparatus. The apparatus further includes a universal 12-volt charge port coupled to the first and second solar panels and operable to receive a charge conductor for charging the electronic device.

US Publication No. 20050140331 for solar bag with internal battery by inventor McQuade, filed Dec. 16, 2004 and published Jun. 30, 2005, is directed to a bag, such as a backpack, comprising a battery internal to the bag, a solar panel assembly affixed to the front exterior of the bag, and a universal connecting system wire. The solar panel assembly includes a solar panel. The solar panel charges the battery and also provide power to an electronic device. The universal connecting system wire connects the battery to the electronic device. The solar panel assembly protects the solar panel from damage. Wire routing channels are provided for routing the universal connecting system wire from the battery to the electronic device. The battery may be charged from an external source.

US Publication No. 20050161079 for system and apparatus for charging an electronic device using solar energy by inventor Gray, filed Mar. 21, 2005 and published Jul. 28, 2005, is directed to a system and apparatus for charging an electronic device using solar energy. In one form, an apparatus for charging an electronic device is provided. The apparatus includes a first charge port operable to be connected to an energy source and an energy repository operable to store energy provided by the energy source and to actively couple energy provided by the energy source to an electronic device. The apparatus further includes a second charge port operable to be connected to the electronic device to provide either the stored energy or the active energy to the electronic device.

U.S. Pat. No. 7,074,520 for contoured casing of mating clamshell portions for an electrochemical cell by inventors Probst et al., filed Nov. 4, 2005 and issued Jul. 11, 2006, is directed to an electrochemical cell of either a primary or a secondary chemistry housed in a casing having opposed major side walls of a contoured shape.

US Publication No. 20060225781 for portable solar panel with attachment points by inventor Locher, filed Apr. 3, 2006 and published Oct. 12, 2006, is directed to a portable solar tarp or a field portable battery charger employing a solar tarp, utilizing flexible solar panels, solar fabric, or solar film. Around the perimeter of the solar tarp is a series of attachment points for straps. The attachment points can be grommets, loops, buckles, hooks, buttons, or grab loops and lines, and to which connected various straps (webbing, line, cord, or cable). The present invention further discloses a versatile, adjustable strapping system utilizing straps, buckles, and hooks. The present invention strapping system can attach almost any object to nearly any other object, such as back packs, luggage, vehicles, boats, permanent and portable shelters and buildings, mechanical equipment, and natural objects such as trees, rocks. The solar panel according to the present invention can have the photovoltaic cells wired individually, or in a single line, because when parts of the photovoltaic system is subjected to shade, or if due to space constraint, parts of the photovoltaic system is covered or folded away, the remaining photovoltaic cells with useable energy are still able to function at peak capacity, since the covered cells will not become an energy drain upon the remaining cells. Further, the photovoltaic system is able to harness all available energy, regardless of the required or desired voltage and/or amperage for the system, thus converting any and all available energy into a useable current to either recharge batteries, or power a load.

U.S. Pat. No. 7,141,330 for secondary battery accommodation case by inventor Aoyama, filed Mar. 4, 2003 and issued Nov. 28, 2006, is directed to a secondary battery accommodation case with improved exterior surface having no parting line in two or more exterior faces out of four exterior faces encircling the battery accommodation portion. It comprises a substantially rectangular bottom case having a battery accommodation portion for accommodating secondary batteries and a top case to be assembled with the bottom case for closing the battery accommodation portion. In the assembled condition of the top case and the bottom case, the exterior face of the top case closing the secondary battery accommodation portion is made equal to or lower than two or more open edges out of four exterior faces encircling the battery accommodation portion in the bottom case.

US Publication No. 20080210728 for solar backpack by inventor Bihn, filed Jul. 10, 2007 and published Sep. 4, 2008, is directed to a solar backpack comprising: a backpack; a solar panel assembly attached to the top half of the backpack, wherein the solar panel assembly protrudes at an angle between 5 and 45 degrees above the front portion of the backpack to allow the user to walk and charge their batteries at the same time; a battery contained in the backpack and in electrical communication with the solar panel; an interchangeable battery recharge cord for recharging external battery operated devices.

US Publication No. 20080011799 for solar energy backpack combination device by inventor Chang, filed Mar. 2, 2007 and published Jan. 17, 2008, is directed to a solar energy backpack combination device, in which a solar energy backpack is provided with a plurality of item carrying pockets each configured with an electric power unit. Joining devices are used to install the electric power units into the plurality of item carrying pockets of the solar energy backpack to face the light. The electric power units are each configured with a solar panel facing the light, and the solar panel is electrically connected to an electric storage device configured with a battery charging slot and a storage battery, and the storage battery is electrically connected to a plurality of connecting terminals. Accordingly, light rays are converted into electrical energy and stored in the electric storage devices, whereafter an electric power consuming device can be connected to the solar energy backpack to obtain the needed electric power from the storage battery of the electric storage device.

US Publication No. 20090279810 for battery bag by inventor Nobles, filed May 6, 2008 and published Nov. 12, 2009, is directed to a battery bag assembly including an elongated watertight bag (WTB), a sealable access port (SAP), a battery tray (BT), a power feed-through (PFT), and an electric power conduit (EPC). SAP has an elongated configuration extending along an elongated length of the WTB. BT is disposed within the WTB so that its elongated configuration is aligned with the elongated length of the WTB. BT has electrical connector sockets (EPSs) mounted thereon for mating with oppositely sexed connectors provided on batteries. PFT is disposed on a wall of the watertight bag. PFT is configured to provide a watertight seal for an electrical conductor passing from an interior of the watertight bag to an exterior of the watertight bag. EPC is electrically connected for coupling electric power from the EPSs on the BT to a remote device.

US Publication No. 20100109599 for portable solar charging apparatus by inventors Lin et al., filed Nov. 5, 2008 and published May 6, 2010, is directed to a portable solar charging apparatus includes a retaining base, a snoot, a photoelectric conversion module, a power connector and a joint mechanism. The snoot is mounted onto the retaining base, and a containing space is formed between the retaining base and the snoot. The photoelectric conversion module is contained in the containing space and mounted onto the retaining base. The photoelectric conversion module includes an accumulator and a solar chip electrically connected to the accumulator. The solar chip is installed corresponding to the snoot. The power connector is connected to the retaining base and electrically coupled to the accumulator. The joint mechanism is connected to the retaining base and disposed outside the containing space. The invention allows a portable electronic product to be charged and used anytime and improves the overall photoelectric conversion efficiency.

US Publication No. 20120045929 for PALS compliant routing system by inventors Streeter et al., filed Aug. 23, 2011 and published Feb. 23, 2012, is directed to a PALS compliant routing system including flexible fabric cabling routed through the webbing of a PALS grid. A first connector or device is coupled to the cabling. Other connectors coupled to the cabling subsystem include a retention mechanism configured to retain them in the channels of the PALS webbing.

US Publication No. 20130294712 for ammunition magazine pouch by inventor Seuk, filed Oct. 30, 2012 and published Nov. 7, 2013, is directed to a hydration pouch including an elastic band that compresses the bottom portion of the hydration bladder inside the pouch to more evenly distribute the fluid contents of the bladder vertically within the pouch, thereby preventing the pooling of the fluid contents in the bottom of the bladder.

US Publication No. 20140072864 for packaging material for lithium ion battery, lithium ion battery, and method for manufacturing lithium ion battery by inventors Suzuta et al., filed Nov. 8, 2013 and published Mar. 13, 2014, is directed to a packaging material for a lithium ion battery including: a base material layer that is formed from a film obtained by biaxially stretching a multi-layered coextruded film including a first thermoplastic resin layer having rigidity and chemical resistance and being disposed at an outer side thereof, a second thermoplastic resin layer having a capability of propagating stress and adhesiveness, and a third thermoplastic resin layer having toughness; a metal foil layer that is laminated on one surface of the base material layer; an anti-corrosion-treated layer that is laminated on the metal foil layer; an inner adhesive layer that is laminated on the anti-corrosion-treated layer; and a sealant layer that is laminated on the inner adhesive layer.

U.S. Pat. No. 8,720,762 for load carrier systems and associated manufacturing methods by inventors Hilliard et al., filed Jun. 17, 2011 and issued May 13, 2014, is directed to load carrier systems and associated manufacturing methods. In one embodiment, a load carrier system can include a unitary piece of material. The unitary piece of material can include a body portion comprising a first face side, an opposing face side, a first peripheral edge and an opposing second peripheral edge; and one or more straps comprising a respective extended end, wherein the straps are an integral part of the body portion; wherein the one or more straps are folded over onto the first face side adjacent to the first peripheral edge; and wherein at least one respective end of the one or more straps is fastened to the opposing second peripheral edge.

U.S. Pat. No. 9,144,255 for system for attaching accessories to tactical gear by inventor Perciballi, filed Feb. 1, 2013 and issued Sep. 29, 2015, is directed to designs and methods for a reversible, textile-based tactical article. In one embodiment the tactical article comprises a textile based panel perforated with an array of slots arranged in vertical and horizontal, spaced apart rows. The panel may be adapted for attaching accessories to either side by lacing a strap through a row of the slots and through webbing loops on the accessory positioned between the slots. One side of the panel may have a first appearance, and the other side a second appearance that is different from the first appearance.

US Publication No. 20150295617 for waterproof case by inventors Lai et al., filed Apr. 13, 2015 and published Oct. 15, 2015, is directed to a protective case for an electronic device may include a housing, a case cover and a gasket positioned between the housing and the case cover. The housing may include a case member, having a plurality of housing snap attachment structures formed therein. The case cover may likewise include case cover snap attachment structures formed thereon that couple with the housing snap fit structures. The gasket is positioned between planar surfaces of the case member and case cover so that it is axially compressed between the case member and the case cover to provide a water and air tight seal, with the compression of the gasket being maintained by the connection of the housing snap attachment structures and the case cover snap attachment structures.

US Publication No. 20150366333 for backpack for convenient charging by inventor Zhijian, filed May 12, 2015 and published Dec. 24, 2015, is directed to a backpack for convenient charging, the backpack comprising: a backpack body with a battery storage space to accommodate a storage battery unit; at least one strap connected to the backpack body, where at least one strap has a fixture for fixing a product to be charged and a power cable output port proximal to the fixture; wherein the backpack body further includes at least one cable passage leading from the battery storage space to the power cable output port to accommodate at least one power cable each with a first end and a second end, wherein at least one of the first end and the second end of the at least one power cable is connected to the storage battery unit to be charged.

SUMMARY OF THE INVENTION

The present invention relates generally to portable equipment for military, law enforcement, aviation, personal survival, hiking, watersports, and camping applications and, more particularly, to a system for supplying power to a portable battery pack including one or more batteries enclosed by a wearable and replaceable pouch or skin using at least one solar panel.

In one embodiment, the present invention provides a system for supplying power to a portable battery pack using at least one solar panel including a portable battery pack including one or more batteries enclosed in a wearable pouch and at least one solar panel, wherein the one or more batteries include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch, and one or more openings through which the one or more flexible omnidirectional leads from the one or more batteries can be accessed, wherein the at least one solar panel includes one or more solar modules electrically connected to one another and to at least one output connector, and wherein the at least one solar panel is operable to supply power to the one or more batteries.

In another embodiment, the present invention provides a system for supplying power to a portable battery pack using at least one solar panel including a portable battery pack including one or more batteries enclosed in a wearable pouch and at least one solar panel, wherein the one or more batteries are rechargeable and include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch, and one or more openings through which the one or more flexible omnidirectional leads from the one or more batteries can be accessed, wherein the one or more flexible omnidirectional leads are operable to charge at least one of the one or more batteries, wherein the at least one solar panel includes one or more solar modules electrically connected to one another and to at least one output connector, wherein the at least one solar panel is operable to supply power to the one or more batteries, and wherein the one or more flexible omnidirectional leads are operable to supply power to a power consuming device.

In yet another embodiment, the present invention provides a system for supplying power to a portable battery pack using at least one solar panel including a portable battery pack including one or more batteries enclosed in a wearable pouch and at least one solar panel, wherein the one or more batteries include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch and one or more openings through which the one or more flexible omnidirectional leads from the one or more batteries can be accessed, wherein the wearable pouch and/or the at least one solar panel includes a pouch attachment ladder system (PALS) operable to attach the wearable pouch and/or the at least one solar panel to a load-bearing platform, wherein the at least one solar panel includes one or more solar modules electrically connected to one another and to at least one output connector, and wherein the at least one solar panel is operable to supply power to the one or more batteries.

These and other aspects of the present invention will become apparent to those skilled in the art after a reading of the following description of the preferred embodiment when considered with the drawings, as they support the claimed invention.

BRIEF DESCRIPTION OF THE DRAWINGS

FIG. 9A illustrates a front perspective view of the wearable pouch or skin of the portable battery pack.

FIG. 9B illustrates a side perspective view of the wearable pouch or skin of the portable battery pack.

FIG. 9C illustrates a back perspective view of the wearable pouch or skin of the portable battery pack.

FIG. 9D illustrates a perspective view of an end of the wearable pouch or skin of the portable battery pack.

FIG. 9E illustrates a perspective view of another end of the wearable pouch or skin of the portable battery pack.

DETAILED DESCRIPTION

Figure 1:
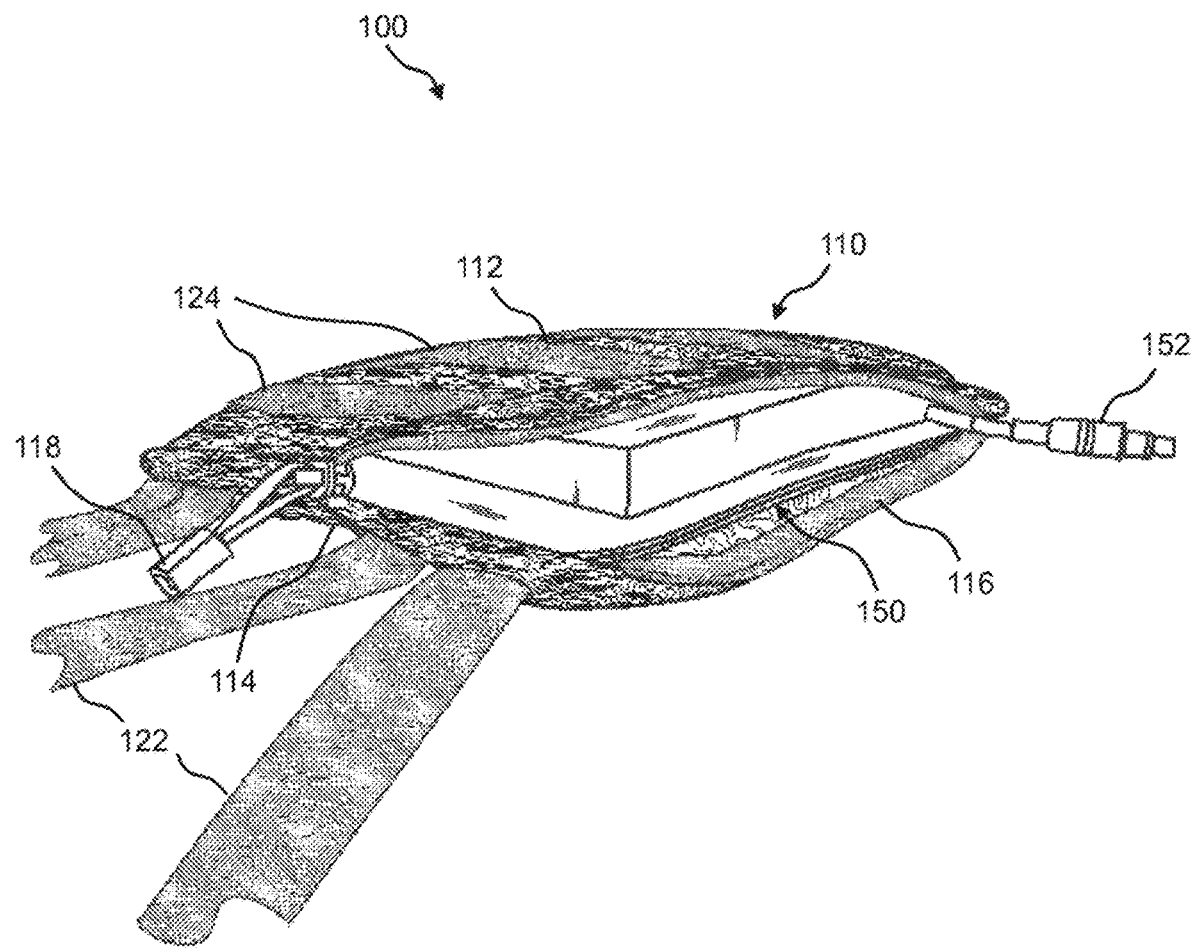
FIG. 1 illustrates a perspective view of an example of the portable battery pack that comprises a battery enclosed by a wearable pouch or skin.

The present invention is generally directed to a system for supplying power to a portable battery pack including a wearable and replaceable pouch or skin with one or more batteries enclosed in the pouch or skin using at least one solar panel for military, law enforcement, aviation, personal survival, hiking, sports, recreation, hunting, land surveying, expedition, watersports, and camping applications.

In one embodiment, the present invention provides a system for supplying power to a portable battery pack using at least one solar panel including a portable battery pack including one or more batteries enclosed in a wearable pouch and at least one solar panel, wherein the one or more batteries include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch, and one or more openings through which the one or more flexible omnidirectional leads from the one or more batteries can be accessed, wherein the at least one solar panel includes one or more solar modules electrically connected to one another and to at least one output connector, and wherein the at least one solar panel is operable to supply power to the one or more batteries.

In another embodiment, the present invention provides a system for supplying power to a portable battery pack using at least one solar panel including a portable battery pack including one or more batteries enclosed in a wearable pouch and at least one solar panel, wherein the one or more batteries are rechargeable and include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch, and one or more openings through which the one or more flexible omnidirectional leads from the one or more batteries can be accessed, wherein the one or more flexible omnidirectional leads are operable to charge at least one of the one or more batteries, wherein the at least one solar panel includes one or more solar modules electrically connected to one another and to at least one output connector, wherein the at least one solar panel is operable to supply power to the one or more batteries, and wherein the one or more flexible omnidirectional leads are operable to supply power to a power consuming device.

In yet another embodiment, the present invention provides a system for supplying power to a portable battery pack using at least one solar panel including a portable battery pack including one or more batteries enclosed in a wearable pouch and at least one solar panel, wherein the one or more batteries include at least one battery element, a battery cover including one or more channels to accommodate wires of one or more flexible omnidirectional leads and a compartment sized to receive the at least one battery element, a battery back plate attached to the battery cover, and the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover, wherein the wearable pouch includes a closeable opening through which the one or more batteries are operable to be removed from the wearable pouch and one or more openings through which the one or more flexible omnidirectional leads from the one or more batteries can be accessed, wherein the wearable pouch and/or the at least one solar panel includes a pouch attachment ladder system (PALS) operable to attach the wearable pouch and/or the at least one solar panel to a load-bearing platform, wherein the at least one solar panel includes one or more solar modules electrically connected to one another and to at least one output connector, and wherein the at least one solar panel is operable to supply power to the one or more batteries.

None of the prior art discloses a system for supplying power to a portable battery including one or more batteries enclosed in a wearable pouch using at least one solar panel, wherein the one or more batteries include at least one battery element, a battery cover, a battery back plate, and one or more flexible omnidirectional leads that include a connector portion and a wiring portion, wherein a flexible spring is provided around the wiring portion such that a portion of the flexible spring is positioned inside the battery cover and a portion of the flexible spring is positioned outside the battery cover.

Referring now to the drawings in general, the illustrations are for the purpose of describing one or more preferred embodiments of the invention and are not intended to limit the invention thereto.

Portable Battery Pack

In some embodiments, the present invention provides a portable battery pack including a battery enclosed by, e.g., inside of, a wearable and replaceable pouch or skin, wherein the pouch or skin can be provided in different colors and/or patterns. Namely, a set of multiple interchangeable pouches or skins can be provided with one battery unit. This feature is particularly beneficial when it is required that the portable battery pack blend into different environments, such as in military applications. In one example, if the portable battery pack is used in a jungle or wilderness environment, the battery can be placed inside a camouflage pouch or skin. In another example, if the portable battery pack is used in an arctic environment, the battery can be placed inside a white-colored pouch or skin. In yet another example, if the portable battery pack is used in a desert environment, the battery can be placed inside a sand-colored pouch or skin.

Representative camouflages include, but are not limited to, Universal Camouflage Pattern (UCP), also known as ACUPAT or ARPAT or Army Combat Uniform; MULTICAM®, also known as Operation Enduring Freedom Camouflage Pattern (OCP); Universal Camouflage Pattern-Delta (UCP-Delta); Airman Battle Uniform (ABU); Navy Working Uniform (NWU), including variants, such as, blue-grey, desert (Type II), and woodland (Type III); MARPAT, also known as Marine Corps Combat Utility Uniform, including woodland, desert, and winter/snow variants; Disruptive Overwhite Snow Digital Camouflage, Urban Digital Camouflage, and Tactical Assault Camouflage (TACAM).

Therefore, an aspect of the portable battery pack is that it provides a battery in combination with one or more wearable and replaceable pouches or skins, wherein the one or more pouches or skins can be different colors and/or patterns.

Another aspect of the portable battery pack is that the battery has one or more leads that can be flexed repeatedly in any direction without breaking or failing. This means the portable battery pack is operable to deliver energy from the battery to power consuming devices located in different areas of the load bearing equipment. Similarly, the portable battery pack is operable to receive energy from charging devices located in different areas of the load bearing equipment to the battery.

Yet another aspect of the portable battery pack is that the battery and pouch or skin are lightweight and contoured for comfortable wearing or ease of fastening to other equipment, such as a backpack or body armor, while still maintaining the lowest possible profile. Advantageously, this low profile prevents the portable battery pack from interfering with the wearer while in motion or seated.

Still another aspect of the portable battery pack is that the pouch or skin can be MOLLE-compatible. "MOLLE" means Modular Lightweight Load-carrying Equipment, which is the current generation of load-bearing equipment and backpacks utilized by a number of NATO armed forces. The portable battery pack can also be made to affix to other equipment (e.g., chair or seat, boat or kayak, helmet) or a user's body (e.g., back region, chest region, abdominal region, arm, leg) using straps, snaps, hook and loop tape, snaps, ties, buckles, and/or clips for other applications.

Figure 2:
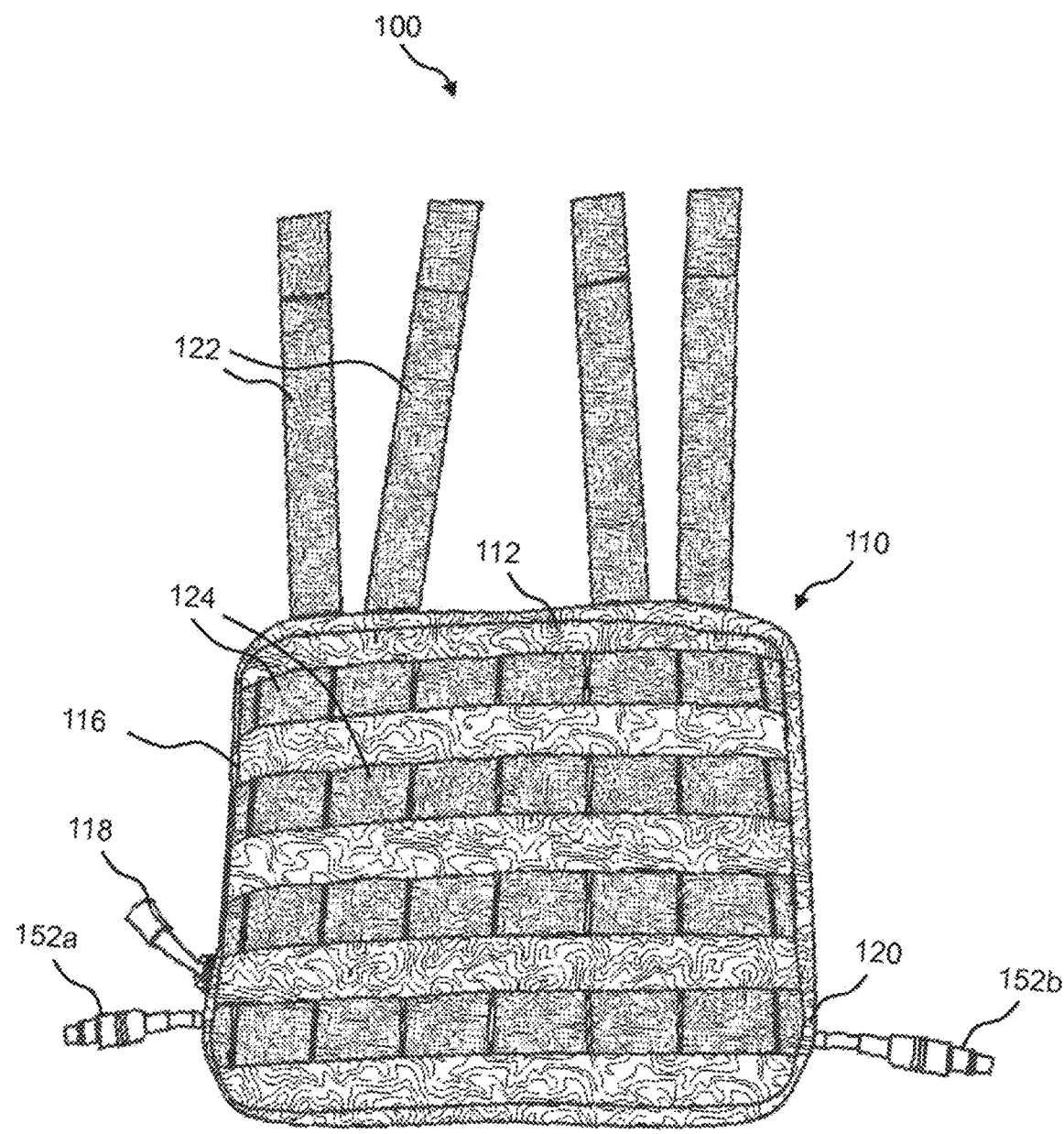
FIG. 2 illustrates a front perspective view of an example of the portable battery pack that comprises a battery enclosed by a wearable pouch or skin.
Figure 3:
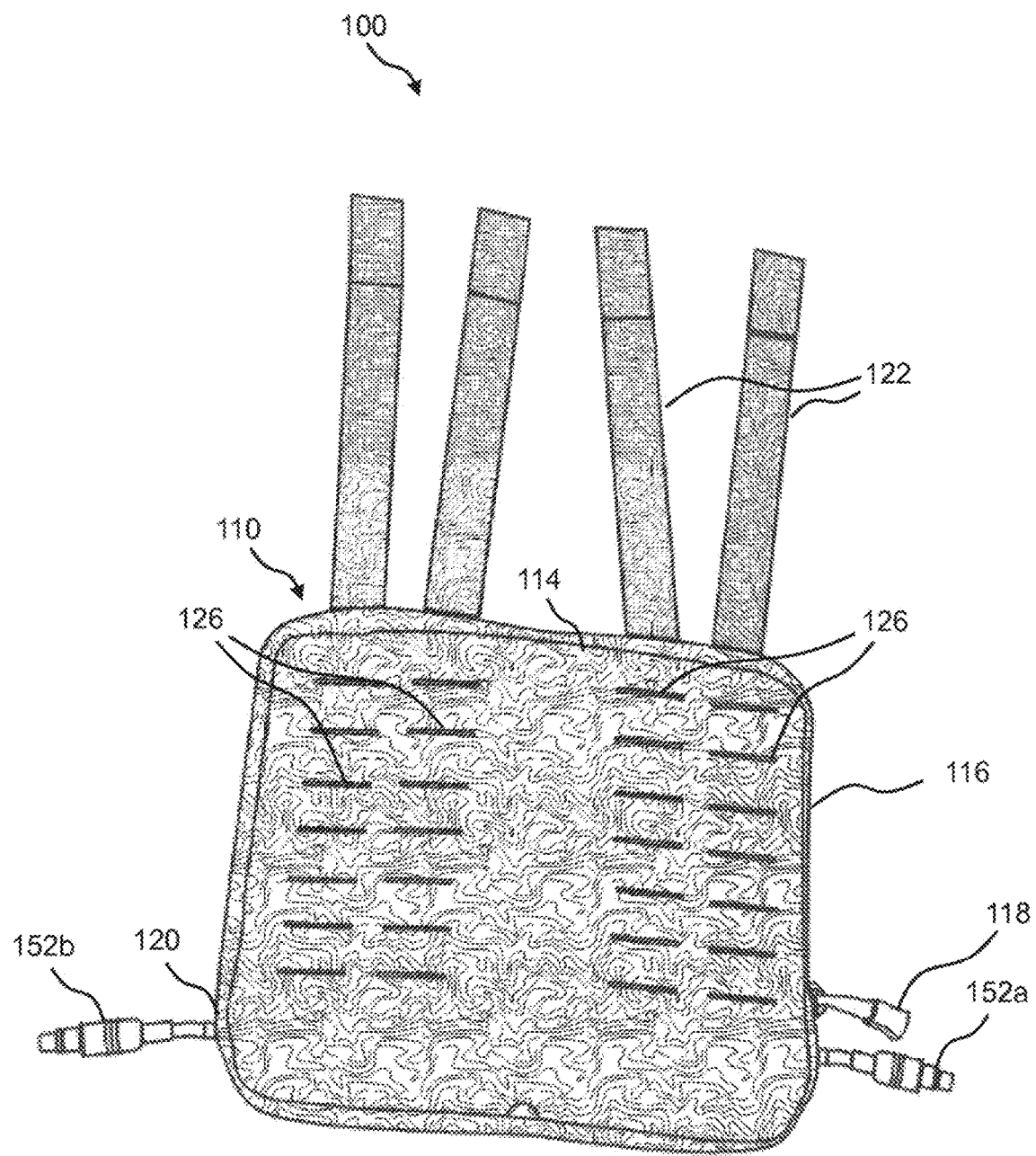
FIG. 3 illustrates a back perspective view of an example of the portable battery pack that comprises a battery enclosed by a wearable pouch or skin.

FIGS. 1-3 are perspective views of an example of the portable battery pack 100 that includes a battery enclosed by a wearable pouch or skin. For example, portable battery pack 100 includes a pouch 110 for holding a battery 150. The pouch 110 is a wearable pouch or skin that can be sized in any manner that substantially corresponds to a size of the battery 150. In one example, the pouch 110 is sized to hold a battery 150 that is about 9.75 inches long, about 8.6 inches wide, and about 1 inch thick.

In a preferred embodiment, the pouch 110 is formed of a flexible, durable, and waterproof or at least water-resistant material. For example, the pouch 110 is formed of polyester, polyvinyl chloride (PVC)-coated polyester, vinyl-coated polyester, nylon, canvas, PVC-coated canvas, or polycotton canvas. In one embodiment, the pouch 110 is formed of a material that is laminated to or treated with a waterproofing or water repellant material (e.g., rubber, PVC, polyurethane, silicone elastomer, fluoropolymers, wax, thermoplastic elastomer). Additionally or alternatively, the pouch 110 is treated with a UV coating to increase UV resistance. The exterior finish of the pouch 110 can be any color, such as white, brown, green, orange (e.g., international orange), yellow, black, or blue, or any pattern, such as camouflage, as provided herein, or any other camouflage in use by the military, law enforcement, or hunters. For example, in FIGS. 1-3, the pouch 110 is shown to have a camouflage pattern. In one embodiment, the exterior of the pouch 110 includes a reflective tape (e.g., infrared reflective tape), fabric, or material. Advantageously, the reflective tape, fabric, or material improves visibility of the user in low-light conditions.

The pouch 110 has a first side 112 and a second side 114. The pouch 110 also includes a pouch opening 116, which is the opening through which the battery 150 is fitted into the pouch 110. In the example shown in FIGS. 1-3, the pouch opening 116 is opened and closed using a zipper, as the pouch 110 includes a zipper tab 118. Other mechanisms, however, can be used for holding the pouch opening 116 of the pouch 110 open or closed, such as, a hook and loop system (e.g., VELCRO®), buttons, snaps, hooks, ties, clips, buckles, and the like. Further, a lead opening 120 (see FIG. 2, FIG. 3, FIG. 5) is provided on the end of the pouch 110 that is opposite the pouch opening 116. For example, the lead opening 120 can be a 0.5-inch long slit or a 0.75-inch long slit in the edge of the pouch 110. In one embodiment, the lead opening 120 is finished or reinforced with stitching. In another embodiment, the lead opening 120 is laser cut.

The battery 150 includes at least one lead. In one example, the battery 150 is a rechargeable battery with two leads 152 (e.g., a first lead 152a and a second lead 152b) as shown in FIGS. 2-3. Each lead 152 can be used for both the charging function and the power supply function. In other words, the leads 152a, 152b are not dedicated to the charging function only or the power supply function only, both leads 152a, 152b can be used for either function at any time or both at the same time. In one example, the first lead 152a can be used for charging the battery 150 while the second lead 152b can be used simultaneously for powering equipment, or both leads 152 can be used for powering equipment, or both leads 152 can be used for charging the battery 150.

Each lead is preferably operable to charge and discharge at the same time. In one example, a Y-splitter with a first connector and a second connector is attached to a lead. The Y-splitter allows the lead to supply power to equipment via the first connector and charge the battery via the second connector at the same time. Thus, the leads are operable to allow power to flow in and out of the battery simultaneously.

In another embodiment, each lead is operable to charge or discharge, but not operable to charge and discharge simultaneously. In one embodiment, the battery includes at least one sensor operable to determine if a lead is connected to a load or a power supply. If the at least one sensor determines that a lead is connected to a load, the discharging function is enabled and the charging function is disabled. If the at least one sensor determines that a lead is connected to a power supply, the charging function is enabled and the discharging function is disabled.

In a preferred embodiment, a dust cap is used to cover a corresponding lead. Advantageously, the dust cap protects the connector from dust and other environmental contaminants that may cause battery failure in the field. The dust cap is preferably permanently attached to the corresponding lead. Alternatively, the dust cap is removably attachable to the corresponding lead.

The battery is operable to be charged using at least one charging device. In a preferred embodiment, the at least one charging device is an alternating current (AC) adapter, a solar panel, a generator, a wind turbine, a portable power case, a fuel cell, a vehicle battery, a rechargeable battery, and/or a non-rechargeable battery. Examples of a portable power case are disclosed in U.S. Publication No. 20170229692 and U.S. application Ser. Nos. 15/664,776 and 15/836,299, each of which is incorporated herein by reference in its entirety. In one embodiment, the battery is connected to the at least one charging device through a direct current-direct current (DC-DC) converter cable.

In another embodiment, the battery is operable to be charged via inductive charging. In one embodiment, the battery is operable to be charged using an inductive charging mat. In an alternative embodiment, the battery is operable to be charged using an inductive puck worn in a pocket, on the back of a helmet, or in a rucksack. In one embodiment, the inductive puck is powered using a DC power source. Advantageously, this reduces the number of cables required for a user, which prevents users from accidentally disconnecting cables (e.g., when getting in and out of spaces like vehicles). Additionally, this allows a user to use proximity charging, which allows the user to focus on the task at hand instead of spending a few seconds connecting the battery to a charging device, which may be located behind the user in a rucksack. Further, this embodiment eliminates the possibility of reverse polarity and arcing between connectors caused by the electrical potential. The inductive puck is operable to charge additional power consuming devices carried by a user (e.g., a smartphone, a tablet).

In one embodiment, the battery is operable to be charged by harvesting ambient radiofrequency (RF) waves. Alternatively, the battery is operable to be charged by capturing exothermic body reactions (e.g., heat, sweat). In one embodiment, the battery is operable to be charged using thermoelectric generators, which use temperature differences between the body and the external environment to generate energy. In another embodiment, the battery is operable to be charged using sweat (e.g., using lactate). In an alternative embodiment, the battery is operable to be charged using friction (e.g., triboelectric effect) or kinetic energy. In yet another example, the battery is operable to be charged by a pedal power generator. In one embodiment, the battery is connected to the pedal power generator through a direct current-direct current (DC-DC) converter cable.

The battery is also operable to be charged using energy generated from running water and wind energy. In one embodiment, the wind energy is generated using an unmanned aerial system or drone on a tether. In an alternative embodiment, the wind energy is generated using a drive along turbine. In yet another embodiment, the wind energy is generated using a statically mounted turbine (e.g., ground mounted, tower mounted).

With respect to using the battery 150 with pouch 110, first the user unzips the pouch opening 116, then the user inserts one end of the battery 150 that has, for example, the second lead 152b through the pouch opening 116 and into the compartment inside the pouch 110. At the same time, the user guides the end of the second lead 152b through the lead opening 120, which allows the housing of the battery 150 to fit entirely inside of the pouch 110, as shown in FIG. 1. The first lead 152a is left protruding out of the unzipped portion of the pouch opening 116. Then the user zips the pouch opening 116 closed, leaving the zipper tab 118 snugged up against the first lead 152a, as shown in FIG. 2 and FIG. 3. FIG. 2 shows the portable battery pack 100 with the first side 112 of the pouch 110 up, whereas FIG. 3 shows the portable battery pack 100 with the second side 114 of the pouch 110 up.

As previously described, the battery has at least one lead. In one embodiment, the pouch has an opening for each corresponding lead. In one example, the battery has four leads and the pouch has four openings corresponding to the four leads. Alternatively, the pouch utilizes the zippered pouch opening to secure one lead and has an opening for each remaining lead. In one example, the battery has four leads and the pouch has three openings for three of the four leads. The remaining lead is secured by the zipper.

In another embodiment, the pouch has a seal around an opening for a corresponding lead. The seal is tight around the lead, which prevents water from entering the pouch through the opening. In one embodiment, the seal is formed of a rubber (e.g., neoprene).

In a preferred embodiment, the pouch of the portable battery pack is MOLLE-compatible. In one embodiment, the pouch incorporates a pouch attachment ladder system (PALS), which is a grid of webbing used to attach smaller equipment onto load-bearing platforms, such as vests and backpacks. For example, the PALS grid consists of horizontal rows of 1-inch (2.5 cm) webbing, spaced about one inch apart, and reattached to the backing at 1.5-inch (3.8 cm) intervals. In one embodiment, the webbing is formed of nylon (e.g., cordura nylon webbing, MIL-W-43668 Type III nylon webbing). Accordingly, a set of straps 122 (e.g., four straps 122) are provided on one edge of the pouch 110 as shown in FIGS. 2-3. Further, rows of webbing 124 (e.g., four rows 124) are provided on the first side 112 of the pouch 110, as shown in FIG. 2. Additionally, rows of slots or slits 126 (e.g., seven rows of slots or slits 126) are provided on the second side 114 of the pouch 110, as shown in FIG. 3. In a preferred embodiment, the set of straps 122, the rows of webbing 124, and the rows of slots or slits 126 replicate and duplicate the MOLLE underneath the portable battery pack on the load bearing equipment. Advantageously, this allows for minimal disruption to the user because the user can place additional gear pouches or gear (e.g., water bottle, antenna pouch) on the MOLLE of the portable battery pack in an equivalent location.

In other embodiments, the portable battery pack is made to affix to other equipment (e.g., chair or seat, boat or kayak, helmet) or a user's body (e.g., back region, chest region, abdominal region, arm, leg) using straps, snaps, hook and loop tape, snaps, buckles, ties, and/or clips. In one example, the portable battery pack is made to affix to a seat of a kayak using at least one strap and at least one side-release buckle. In another example, the portable battery pack is made to affix to a user's body using two shoulder straps. In yet another example, the portable battery pack includes two shoulder straps, a chest strap, and a side-release buckle for the chest strap.

Figure 4:
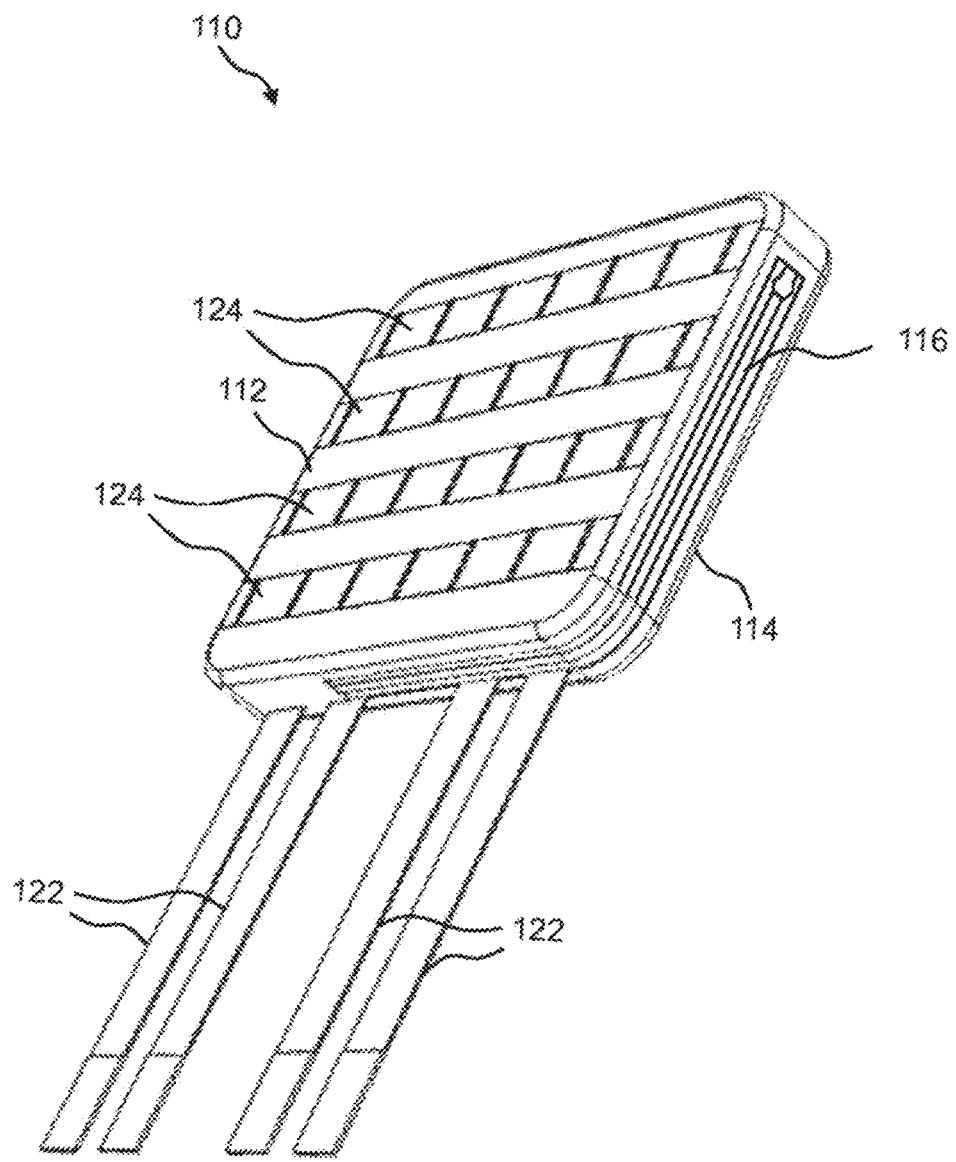
FIG. 4 illustrates an angled perspective view of the front of the wearable pouch or skin of the portable battery pack.
Figure 5:
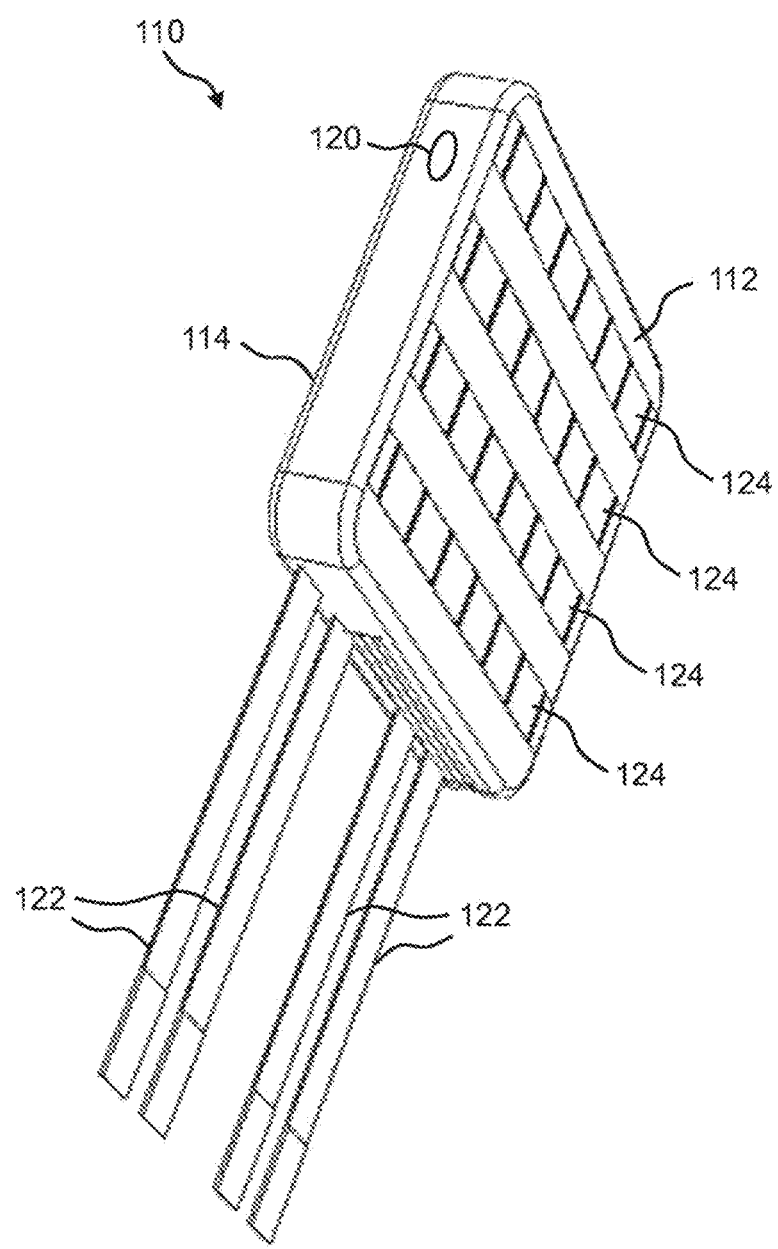
FIG. 5 illustrates another angled perspective view of one embodiment of the front of the wearable pouch or skin of the portable battery pack.
Figure 6:
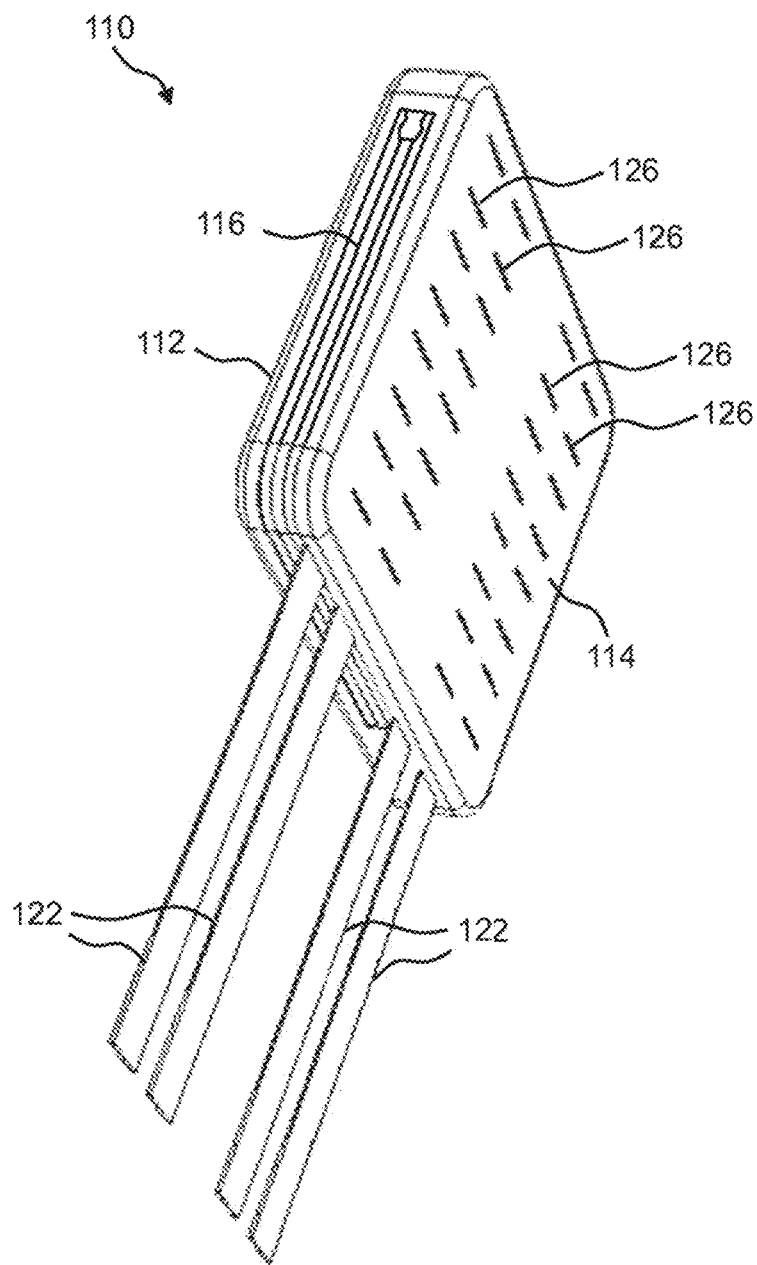
FIG. 6 illustrates an angled perspective view of one embodiment of the back of the wearable pouch or skin of the portable battery pack.

FIGS. 4-6 are perspective views of an example of the pouch 110 of the portable battery pack 100. FIG. 4 shows details of the first side 112 of the pouch 110 and of the edge of the pouch 110 that includes the pouch opening 116. FIG. 4 shows the pouch opening 116 in the zipper closed state. Again, four rows of webbing 124 are provided on the first side 112 of the pouch 110. FIG. 5 also shows details of the first side 112 of the pouch 110 and shows the edge of the pouch 110 that includes the lead opening 120. FIG. 6 shows details of the second side 114 of the pouch 110 and shows the edge of the pouch 110 that includes the pouch opening 116. FIG. 6 shows the pouch opening 116 in the zipped closed state. Again, seven rows of slots or slits 126 are provided on the second side 114 of the pouch 110.

Figure 7A:
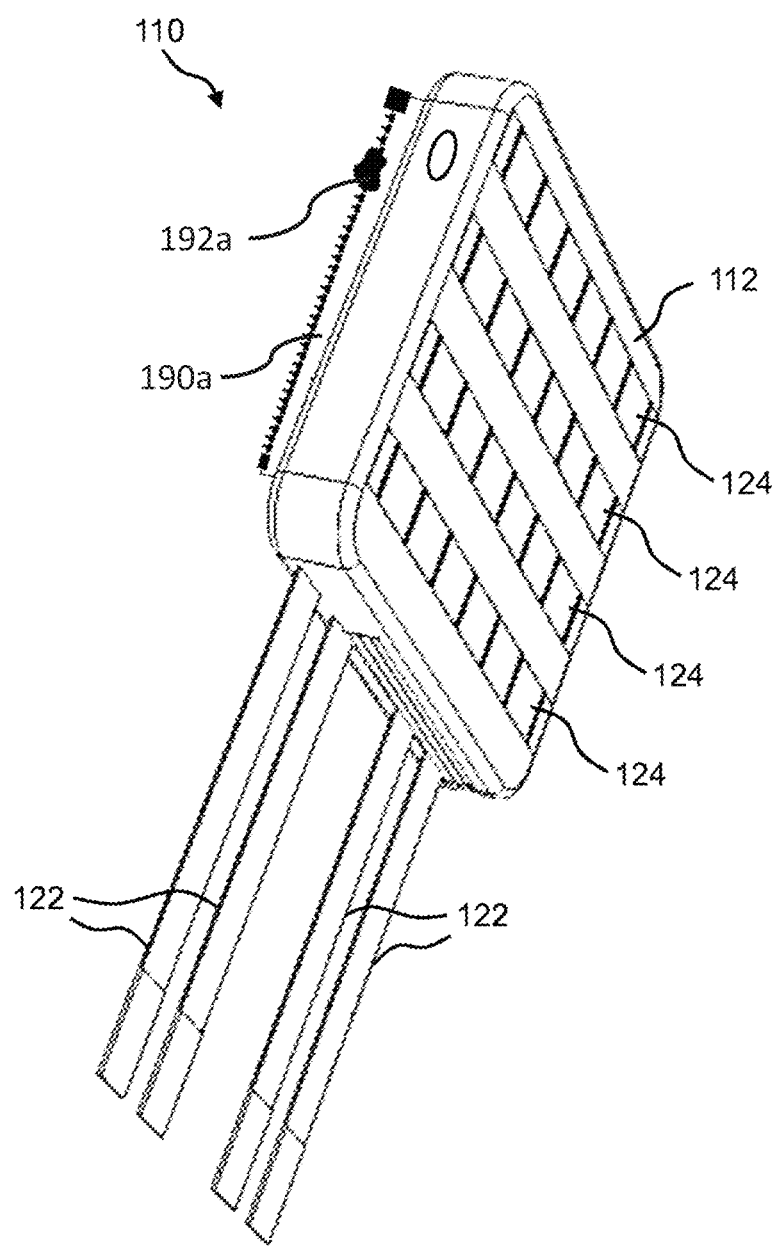
FIG. 7A illustrates another angled perspective view of another embodiment of the front of the wearable pouch or skin of the portable battery pack.
Figure 7B:
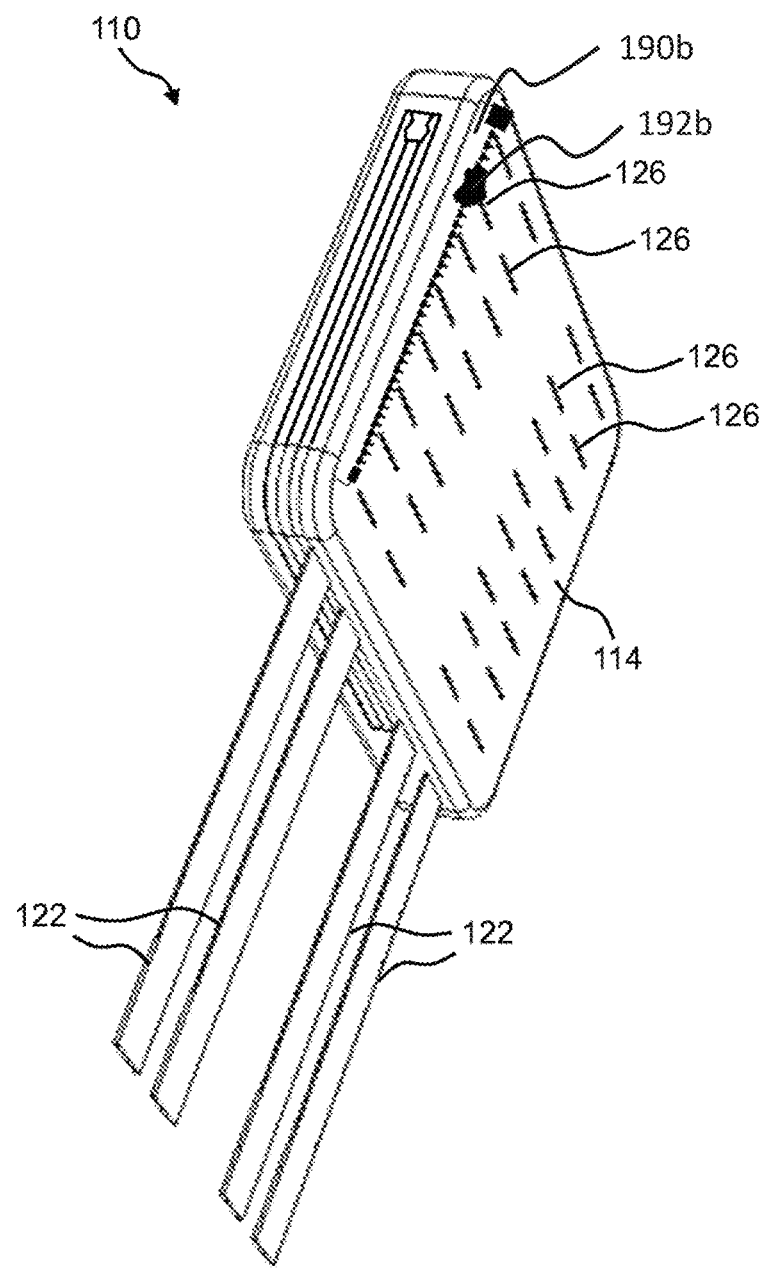
FIG. 7B illustrates an angled perspective view of another embodiment of the back of the wearable pouch or skin of the portable battery pack.

In another embodiment, the portable battery pack is made to affix to a plate carrier, body armor, or a vest with at least one single width of zipper tape sewn on the front panel or the back panel (e.g., JPC 2.0™ by Crye Precision) as shown in FIGS. 7A-7B. FIG. 7A shows details of the first side 112 of the pouch 110 including a single width of zipper tape 190a and a zipper slider 192a. The single width of zipper tape 190a mates with a corresponding single width of zipper tape on the plate carrier, the body armor, or the vest. FIG. 7B shows details of the second side 114 of the pouch 110 including a single width of zipper tape 190b and a zipper slider 192b. The single width of zipper tape 190b mates with a corresponding single width of zipper tape on the plate carrier, the body armor, or the vest.

Figure 8:
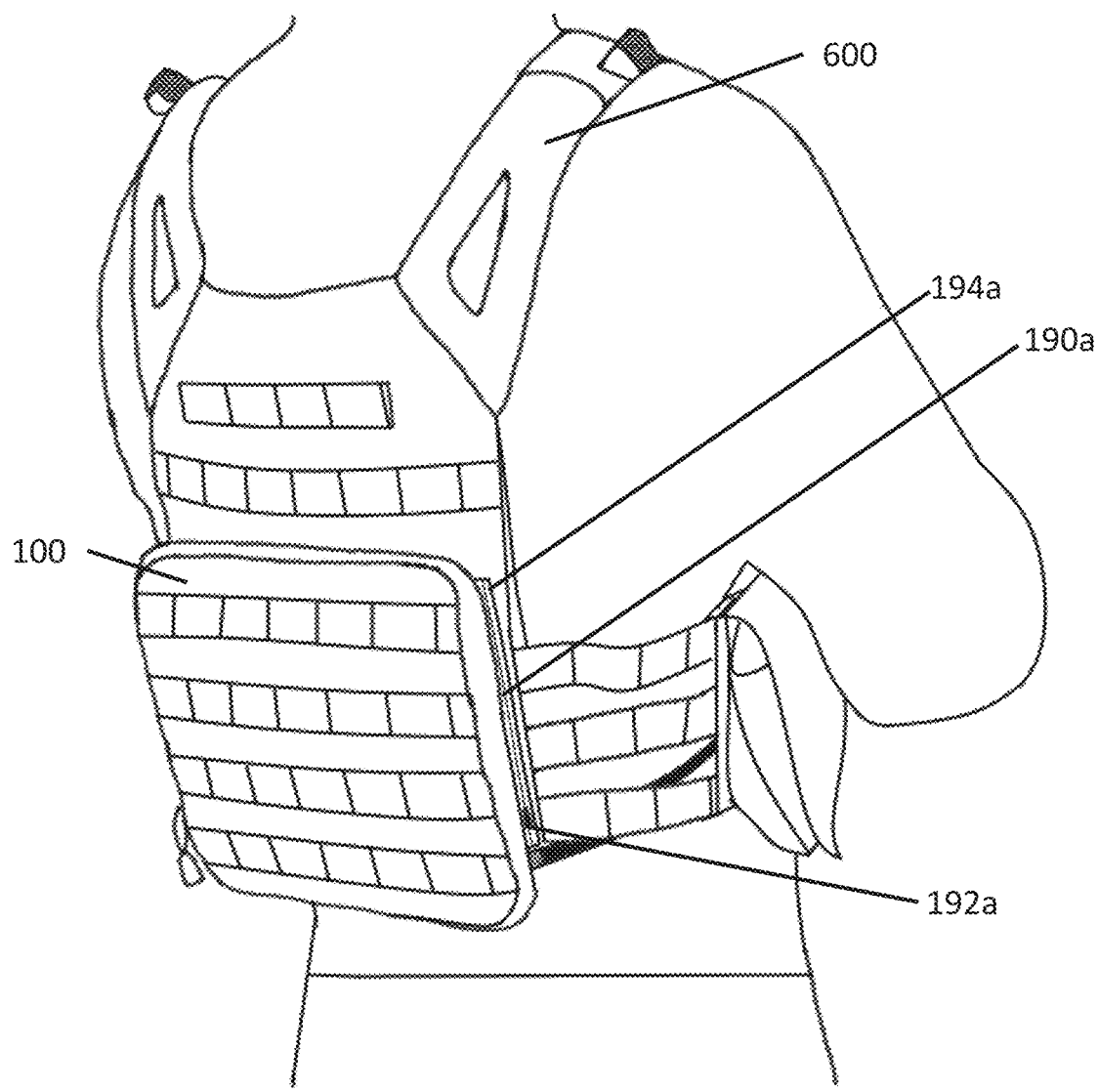
FIG. 8 shows a side perspective view of the portable battery pack affixed to a vest using zippers.

FIG. 8 shows a side perspective view of the portable battery pack 100 affixed to a vest 600 using zippers. A first single width of zipper tape 190a is shown mated with a corresponding first single width of zipper tape 194a on a right side of the vest 600 using a first zipper slider 192a, thereby attaching the portable battery pack 100 to the vest 600. Similarly, a second single width of zipper tape (not shown) is mated with a second corresponding single width of zipper tape (not shown) on a left side of the vest 600 using a second zipper slider (not shown). Advantageously, this allows cables to extend out of the pouch through an opening in the second side of the pouch because the rows of slots or slits are not required to the secure the pouch to the vest.

Figure 10:
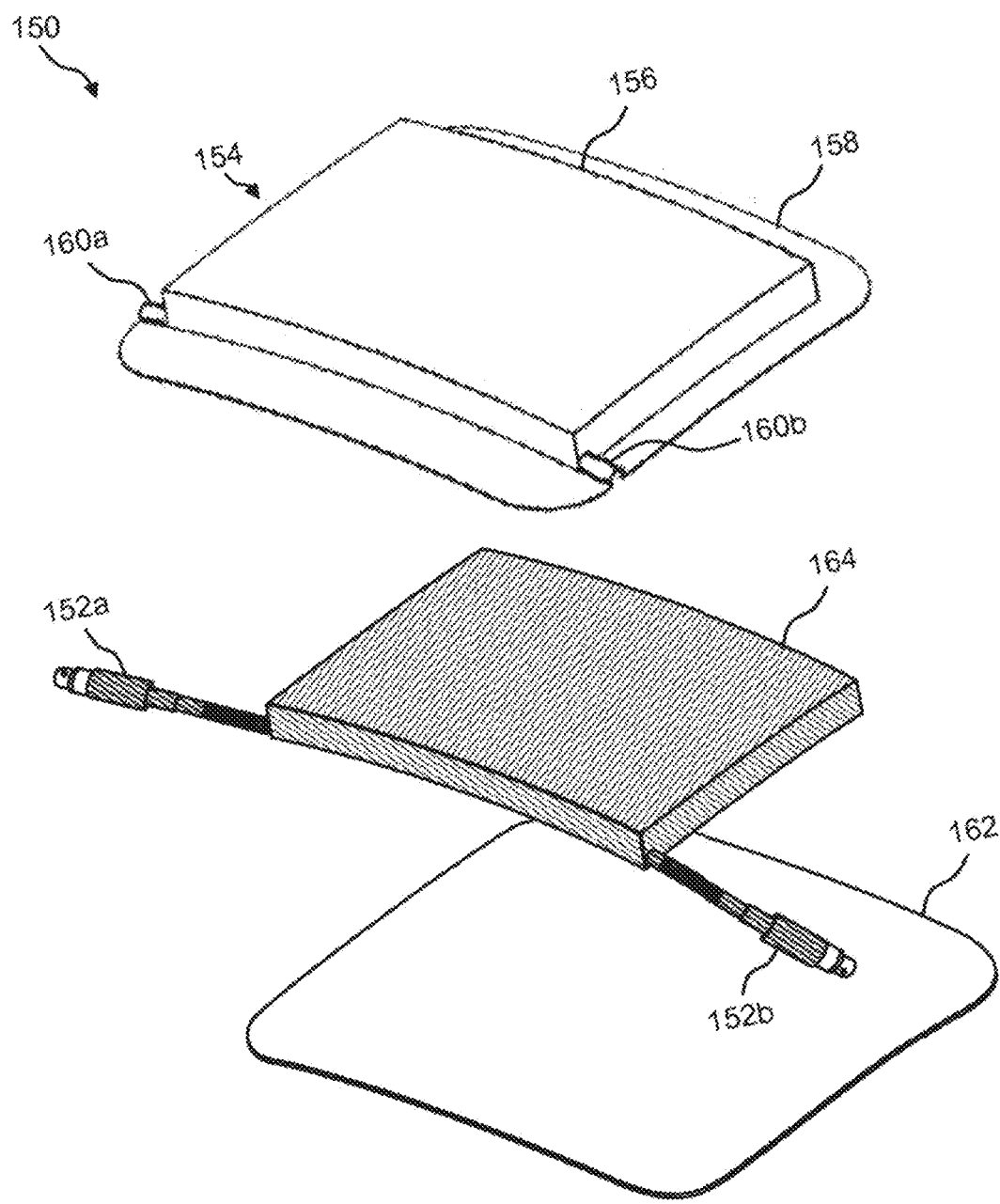
FIG. 10 illustrates an exploded view of an example of the battery of the portable battery pack.

FIGS. 9A-9E illustrate various other views of the pouch 110 of the portable battery pack 100. FIG. 9A shows a view (i.e., "PLAN-A") of the first side 112 of the pouch 110. FIG. 9B shows a side view of the pouch 110. FIG. 9C shows a view (i.e., "PLAN-B") of the second side 114 of the pouch 110. FIG. 9D shows an end view (i.e., "END-A") of the non-strap end of the pouch 110. FIG. 9E shows an end view (i.e., "END-B") of the strap 122-end of the pouch 110. FIG. 10 is an exploded view of an example of the battery 150 of the portable battery pack 100. The battery 150 includes a battery element 164 that is housed between a battery cover 154 and a back plate 162. The battery element 164 supplies the first lead 152a and the second lead 152b. The battery element 164 is formed of a plurality of sealed battery cells or individually contained battery cells, i.e. batteries with their own cases, removably disposed therein. In a preferred embodiment, the battery cells are electrochemical battery cells, and more preferably, include lithium ion rechargeable batteries. In one embodiment, the battery cells are lithium metal or lithium ferrous phosphate cells. In an alternative embodiment, the battery cells are all-solid-state cells (e.g., using glass electrolytes and alkaline metal anodes), such as those disclosed in U.S. Publication Nos. 20160368777 and 20160365602, each of which is incorporated by reference in its entirety. In another embodiment, the battery is formed using at least one metal-organic framework. In one embodiment, the battery cells are 18350, 14430, 14500, 18500, 16650, 18650, 21700, or 26650 cylindrical cells. The plurality of battery cells may be constructed and configured in parallel, series, or a combination. The plurality of battery cells may be in one group or more than one group. Advantageously, subdividing the plurality of battery cells into more than one group allows a larger quantity of lithium ion batteries to arrive by air that otherwise could not be transported due to regulations. In one example, the output of the battery element 164 can be from about 5 volts DC to about 90 volts DC at from about 0.25 amps to about 10 amps.

The plurality of battery cells is preferably connected to the leads via a battery management system. The battery management system protects the battery from operating outside of a safe operating area by including at least one safety cutoff. The at least one safety cutoff relates to voltage, temperature, state of charge, state of health, and/or current. In another embodiment, the battery management system calculates a charge current limit, a discharge current limit, an energy delivered since last charge, a charge delivered, a charge stored, a total energy delivered since first use, a total operating time since first use, and/or a total number of cycles.

In one embodiment, the plurality of battery cells is removably disposed within the battery cover and the back plate. For example, the plurality of battery cells can be replaced if they no longer hold a sufficient charge. In one embodiment, the plurality of battery cells is removably disposed within the battery cover and the back plate as a battery cartridge. In a preferred embodiment, the battery cartridge slides into an opening in the battery cover or the back plate through a battery access panel. In one embodiment, the battery cartridge is a spring-loaded cartridge. Additionally or alternatively, the battery cartridge has flat contacts and pins. The battery cartridge preferably has features that allow the battery cartridge to matingly fit with features in the opening. In another embodiment, the plurality of battery cells is removably disposed within the battery cover and the back plate using a battery holder or a snap connector. In one embodiment, the battery holder or the snap connector is electrically connected to the battery management system via a mating connector (e.g., a rectangular connector), such as those available from MOLEX® or POWERPOLE® by Anderson Power.

The battery access panel is preferably accessed within the battery cover or the back plate via a door on hinges, which allows the door to stay anchored to the device. Alternatively, the door is secured to the battery cover or the back plate by screws. The battery access panel preferably contains a gasket that provides a water tight seal when the door is secured to the battery cover or the back plate.

Alternatively, the plurality of battery cells is sealed within the battery cover and the back plate. In one embodiment, the plurality of battery cells is sealed using an adhesive and/or at least one mechanical fastener (e.g., screws, rivets, pins). In another embodiment, the plurality of battery cells is sealed within the battery cover and the back plate via bonding (e.g., solvent bonding, fusion bonding) and/or welding (e.g., vibration welding, ultrasonic welding).

The battery cover 154 includes a compartment 156 that is sized to receive at least one battery element 164. In a preferred embodiment, the compartment 156 is substantially rectangular in shape with a top hat style rim 158 provided around the perimeter of the compartment 156. The battery cover 154 includes at least one channel formed in the battery cover 154 to accommodate a wire of a corresponding lead. The example in FIG. 10 shows two channels 160 (e.g., channels 160a, 160b) formed in the battery cover 154 (one on each side) to accommodate the wires of the first lead 152a and the second lead 152b passing therethrough. More details of the leads 152 and the battery cover 154 are shown and described herein below with reference to FIG. 16.

The battery cover 154 and the back plate 162 is formed of plastic using, for example, a thermoform process or an injection molding. The back plate 162 can be mechanically attached to the rim 158 of the battery cover 154 via, for example, an ultrasonic spot welding process or an adhesive. Advantageously, the top hat style rim 158 provides a footprint for the ultrasonic spot welding process and provides structural integrity for the battery. In one embodiment, a water barrier material (e.g., silicone) is applied to the mating surfaces of the rim 158 and the back plate 162. In another embodiment, the battery cover 154, the back plate 162, and/or the battery element 164 has a slight curvature or contour for conforming to, for example, the user's vest, backpack, or body armor. In one example, the curvature of the portable battery pack is engineered to match the outward curve of body armor. Advantageously, this means that the portable battery pack does not jostle as the operator moves, which results in less caloric energy expenditure when the operator moves. Alternatively, the battery cover 154, the back plate 162, and/or the battery element 164 can have a slight outward curvature or contour for conforming to a user's body (e.g., back region, chest region, abdominal region, arm, leg). In yet another embodiment, the battery cover 154, the back plate 162, and/or the battery element 164 can have a slight outward curvature or contour for conforming to a user's helmet or hat. More details of the battery cover 154 are shown and described herein below with reference to FIG. 13 and FIGS. 14A-14D. More details of the back plate 162 are shown and described herein below with reference to FIGS. 15A-15C.

As previously described, the housing of the at least one battery includes a battery cover and a back plate. In one embodiment, the battery includes more than one battery element encased in the housing. The output voltages of the more than one battery element may be the same or different. In one example, a first battery element has an output voltage of 16.8V and a second battery element has an output voltage of 16.8V. In another example, a first battery element has an output voltage of 16.8V and a second battery element has an output voltage of 5V. Advantageously, including more than one battery element encased in the housing allows a larger quantity of lithium ion batteries to arrive by air that otherwise could not be transported due to regulations.

Figure 11:
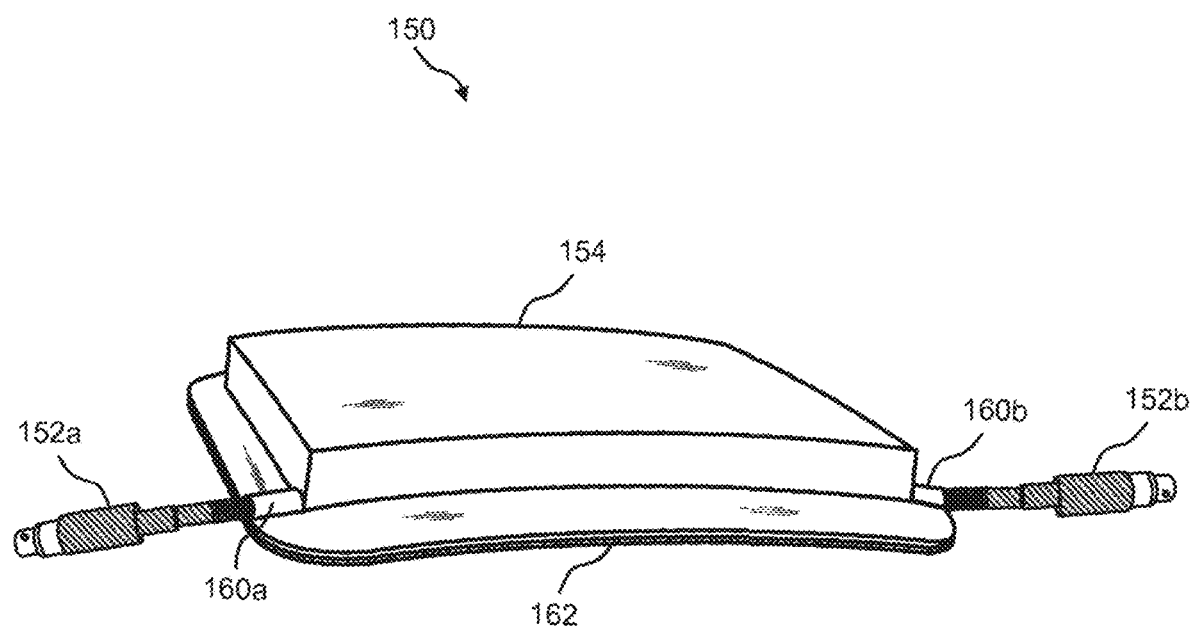
FIG. 11 illustrates a top perspective view of the battery of the portable battery pack when assembled.
Figure 12:
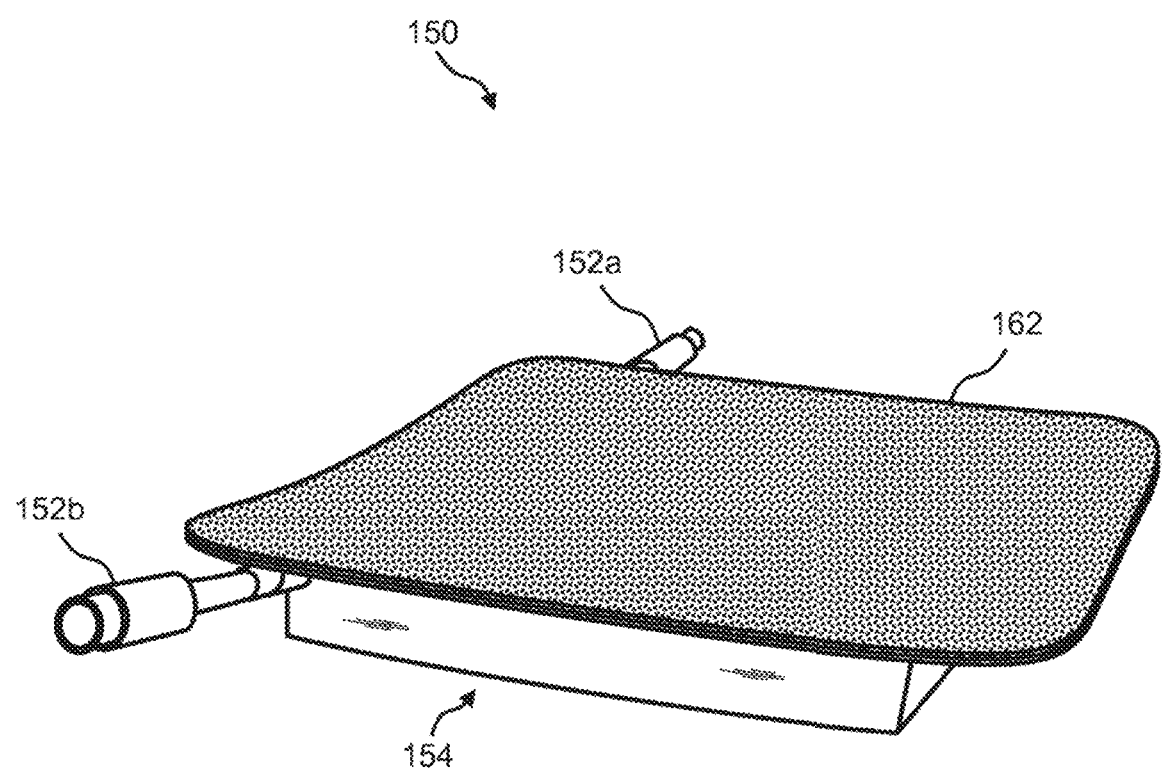
FIG. 12 illustrates a bottom perspective view of the battery of the portable battery pack when assembled.

FIGS. 11-12 are perspective views of the battery 150 of the portable battery pack 100 when fully assembled. FIG. 11 shows a view of the battery cover 154-side of the battery 150, while FIG. 12 shows a view of the back plate 162-side of the battery 150.

Figure 13:
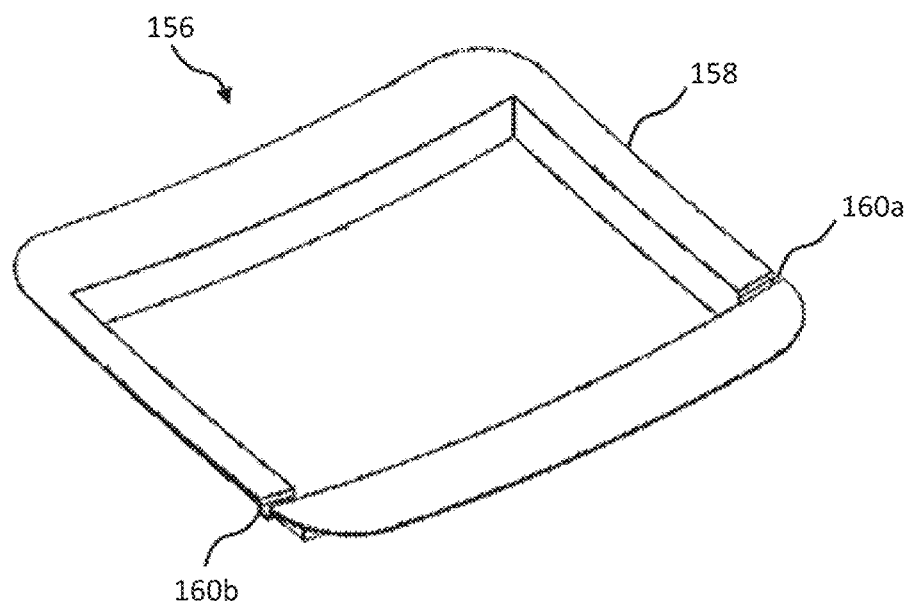
FIG. 13 illustrates a perspective view of the battery cover of the portable battery pack.
Figure 14A:
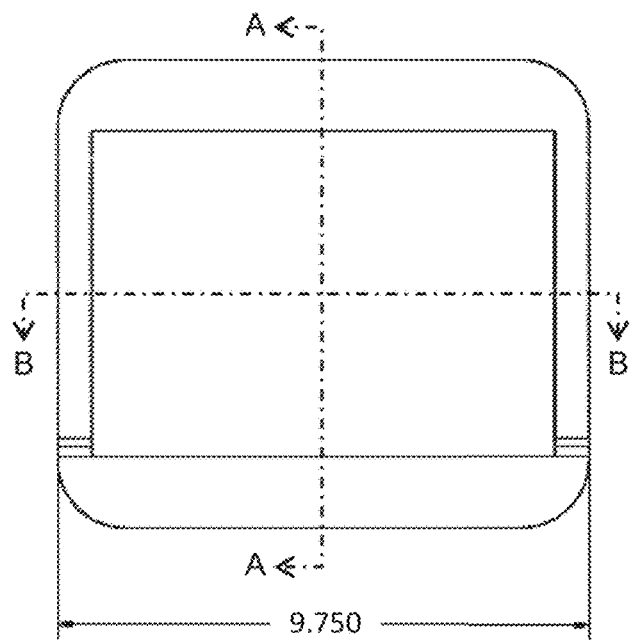
FIG. 14A illustrates a top perspective view of the battery cover of the portable battery pack.
Figure 14B:
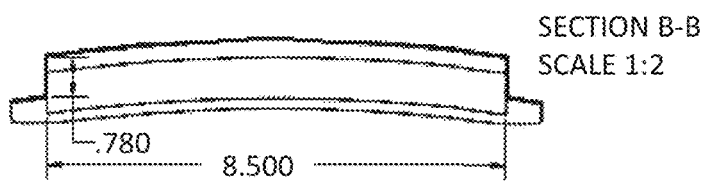
FIG. 14B illustrates a cross-section view of the battery cover of the portable battery pack.
Figure 14C:
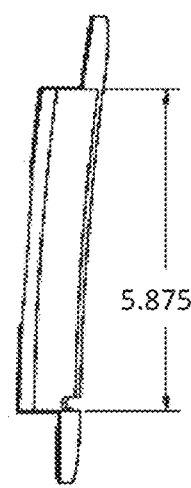
FIG. 14C illustrates another cross-section view of the battery cover of the portable battery pack.
Figure 14D:
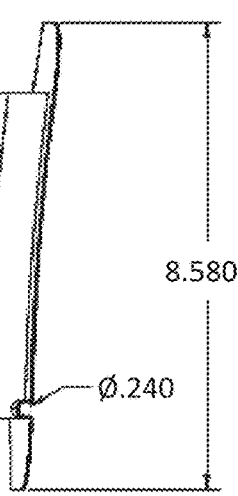
FIG. 14D illustrates yet another cross-section view of the battery cover of the portable battery pack.

FIG. 13 is a perspective view of the side of the battery cover 154 that faces the battery element 164. FIGS. 14A-14D shows various other views of the battery cover 154 of the battery 150 of the portable battery pack 100, including example dimensions of the battery cover 154. FIG. 14A illustrates a top perspective view of the battery cover of the portable battery pack. FIG. 14B illustrates a cross-section view of the battery cover of the portable battery pack. FIG. 14C illustrates another cross-section view of the battery cover of the portable battery pack. FIG. 14D illustrates yet another cross-section view of the battery cover of the portable battery pack.

Figure 15A:
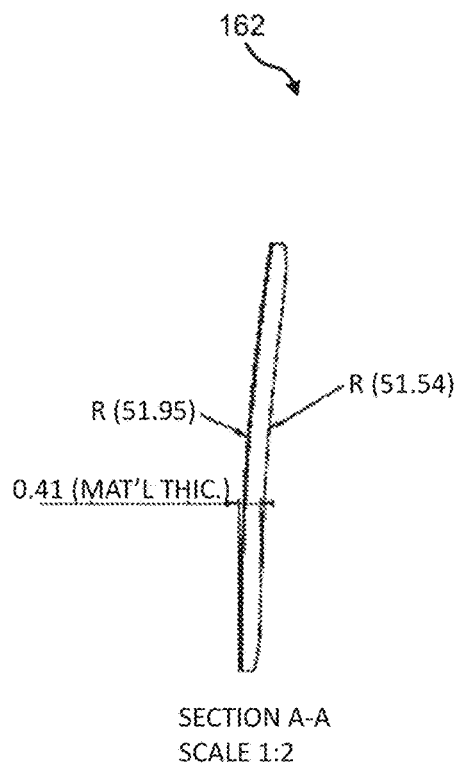
FIG. 15A illustrates a cross-section view of the back plate of the battery of the portable battery pack.
Figure 15B:
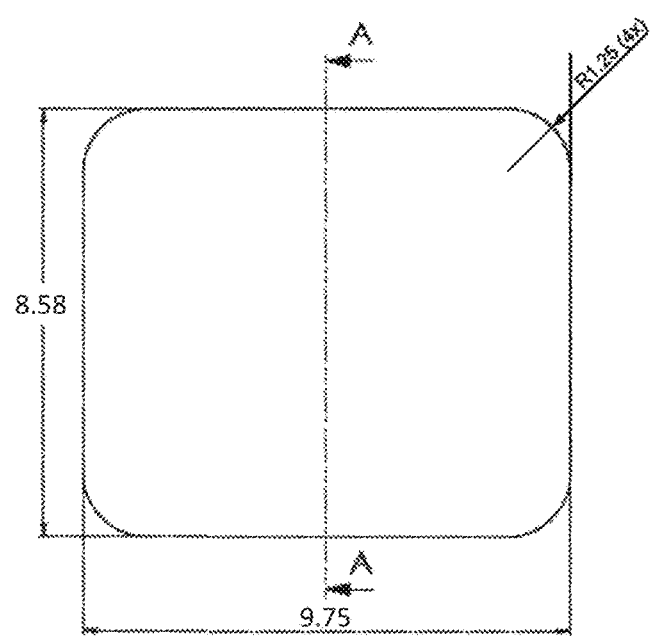
FIG. 15B illustrates a view of the back plate of the battery of the portable battery pack.
Figure 15C:
FIG. 15C illustrates another view of the back plate of the battery of the portable battery pack.

FIGS. 15A-15C illustrate various views of the back plate 162 of the battery 150 and show the contour and example dimensions of the back plate 162. FIG. 15A illustrates a cross-section view of the back plate of the battery of the portable battery pack. FIG. 15B illustrates a view of the back plate of the battery of the portable battery pack. FIG. 15C illustrates another view of the back plate of the battery of the portable battery pack. In one example, the back plate 162 is about 9.75 inches long, about 8.6 inches wide, and about 0.4 inches thick.

Figure 16:
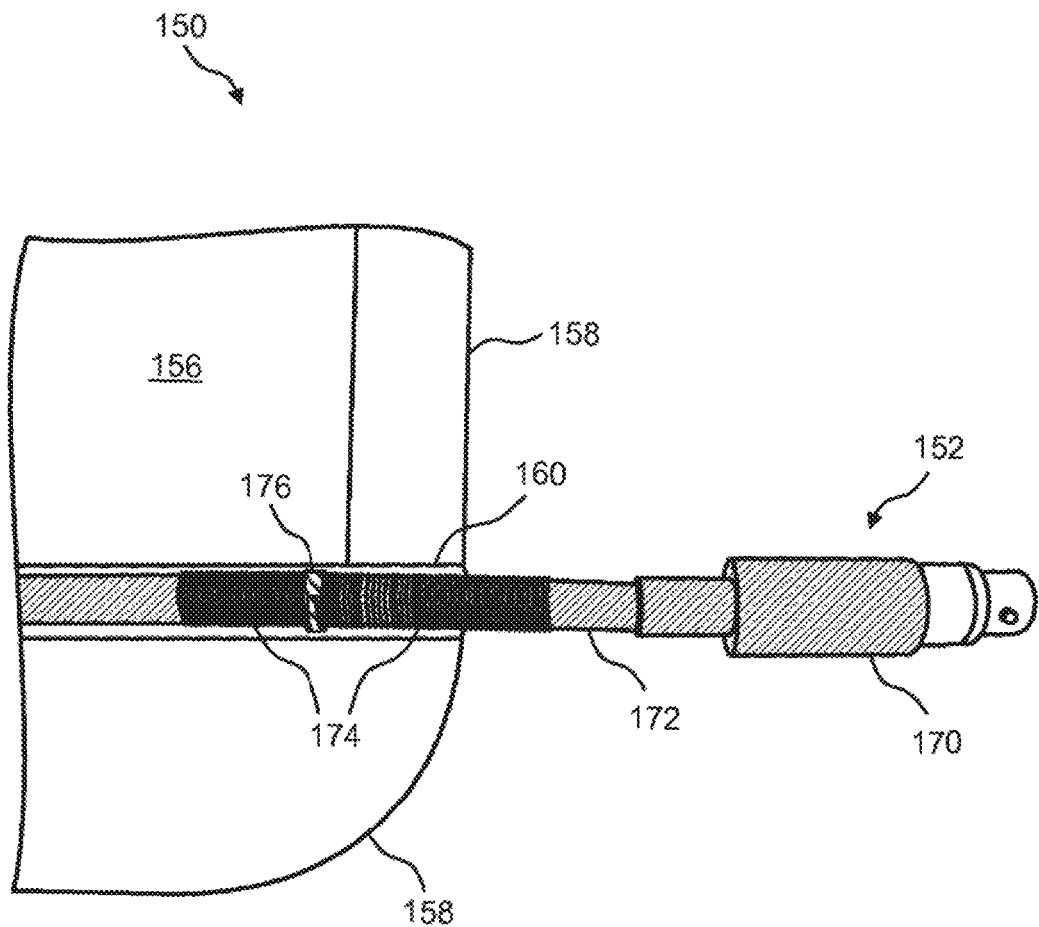
FIG. 16 illustrates a cutaway view of a portion of the battery, which shows more details of the flexible omnidirectional battery leads.

FIG. 16 is a cutaway view of a portion of the battery 150, which shows more details of the flexible omnidirectional battery leads 152. Each lead 152 has a connector portion 170 and a wiring portion 172. The wiring portion 172 is electrically connected to the battery element 164. In one embodiment, the wiring portion 172 is formed of a saltwater resistant cable. The connector portion 170 can be any type or style of connector needed to mate to the equipment to be used with the battery 150 of the portable battery pack 100. In a preferred embodiment, the connector portion 170 is a female circular type of connector (e.g., TAJIMI™ part number R04-P5f). In an alternative embodiment, at least one connector portion 170 is a male universal serial bus (USB), micro USB, lightning, and/or Firewire connector. In another embodiment, the at least one connector portion 170 is a 360° mating connector (e.g., LP360 by FISCHER®). In yet another embodiment, the connector portion 170 has an Ingress Protection (IP) rating of IP2X, IP3X, IP4X, IP5X, IP6X, IPX1, IPX2, IPX3, IPX4, IPX5, IPX6, IPX7, or IPX8. More preferably, the connector portion 170 has an IP rating of IPX6, IPX7, or IPX8. IP ratings are described in IEC standard 60529, ed. 2.2 (May 2015), published by the International Electrotechnical Commission, which is incorporated herein by reference in its entirety. In one embodiment, the connector portion meets standards described in Department of Defense documents MIL-STD-202E, MIL-STD-202F published February 1998, MIL-STD-202G published 18 Jul. 2003, and/or MIL-STD-202H published 18 Apr. 2015, each of which is incorporated herein by reference in its entirety.

The wiring portion 172 is fitted into a channel 160 formed in the battery cover 154 such that the connector portion 170 extends away from the battery cover 154. A spring 174 is provided around the wiring portion 172, such that a portion of the spring 174 is inside the battery cover 154 and a portion of the spring 174 is outside the battery cover 154. In one example, the spring 174 is a steel spring that is from about 0.25 inches to about 1.5 inches long. The wiring portion 172 of the lead 152 and the spring 174 are held securely in the channel 160 of the battery cover 154 via a clamping mechanism 176. Alternatively, the wiring portion of the lead and the spring are held securely in the channel of the battery cover using an adhesive, a retention pin, a hex nut, a hook anchor, and/or a zip tie.

The presence of the spring 174 around the wiring portion 172 of the lead 152 allows the lead 152 to be flexed in any direction for convenient connection to equipment from any angle. The presence of the spring 174 around the wiring portion 172 of the lead 152 also allows the lead 152 to be flexed repeatedly without breaking or failing. The design of the leads 152 provides benefit over conventional leads and/or connectors of portable battery packs that are rigid, wherein conventional rigid leads allow connection from one angle only and are prone to breakage if bumped.

In one embodiment, a layer of heat shrink tubing is placed around the wiring portion before the spring is placed around the wiring portion. The heat shrink tubing is preferably flexible. Advantageously, the heat shrink tubing provides additional waterproofing for the battery.

In one embodiment, the battery includes at least one step up voltage converter and/or at least one step down voltage converter. In one example, the battery includes a step up voltage converter from 16.8V to 29.4V. In another example, the battery includes a step down voltage converter from 16.8V to 5V. Advantageously, this allows the portable battery pack to power devices (e.g., smartphones) with a charging voltage of 5V. This also reduces the bulk outside the portable battery pack because the step down voltage converter is housed within the battery element and a separate external voltage converter is not required.

In one embodiment, the wearable pouch includes a material for dissipating heat. Additionally or alternatively, the battery of the wearable battery pack includes at least one layer of a material for dissipating heat. Examples of a material for dissipating heat are disclosed in U.S. Publication Nos. 20170229692 and 20160112004 and U.S. application Ser. No. 15/664,776, each of which is incorporated herein by reference in its entirety.

Figure 17A:
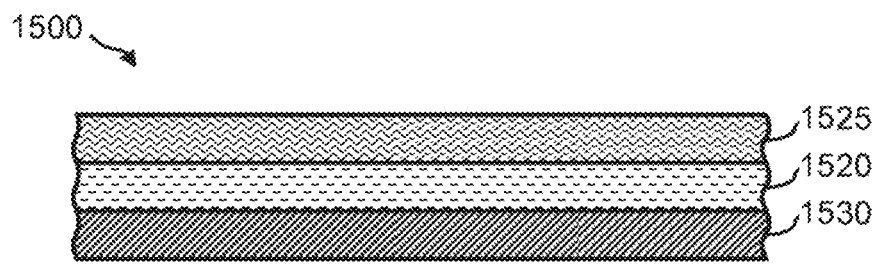
FIG. 17A illustrates a cross-sectional view of one embodiment of a structure that includes a material for dissipating heat.
Figure 17B:
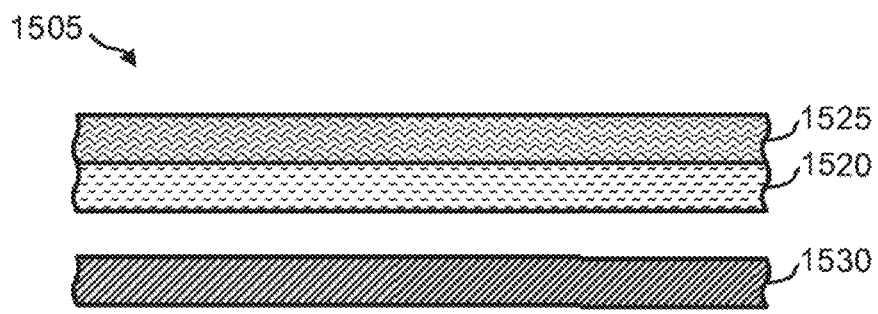
FIG. 17B illustrates a cross-sectional view of one embodiment of another structure that includes a material for dissipating heat.
Figure 17C:
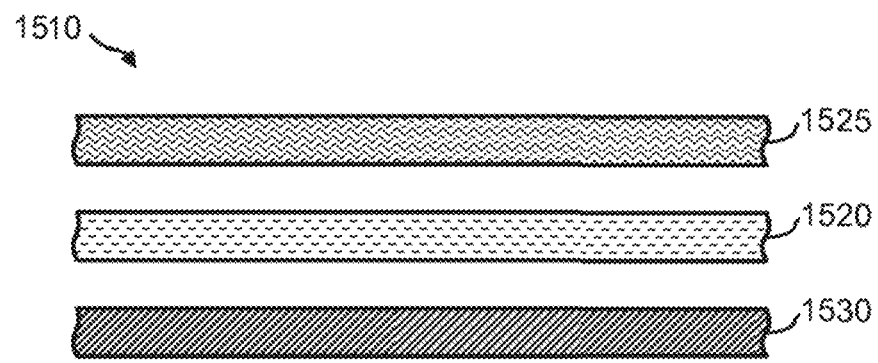
FIG. 17C illustrates a cross-sectional view of one embodiment of yet another structure that includes a material for dissipating heat.

FIGS. 17A-17D are cross-sectional views of examples of structures that include a material for dissipating heat from electronic devices and/or clothing. The heat-dissipating material can be used in combination with, for example, one or two substrates. For example, FIG. 17A shows a structure 1500 that includes a heat-dissipating layer 1520. The heat-dissipating layer 1520 can be sandwiched between a first substrate 1525 and a second substrate 1530.

The heat-dissipating layer 1520 can be any material that is suitable for dissipating heat from electronic devices and/or clothing. The heat-dissipating layer 1520 can be from about m thick to about 350 m thick in one example. In particular embodiments, the heat-dissipating layer 1520 can have a thickness ranging from about 1 mil to about 6 mil, including, but not limited to, 1, 2, 3, 4, 5, and 6 mil, or about 25 m to about 150 m, including, but not limited to, 25, 50, 75, 100, 125, and 150 m. Examples of the heat-dissipating layer 1520 include anti-static, anti-radio frequency (RF), and/or anti-electromagnetic interference (EMI) materials, such as copper shielding plastic or copper particles bonded in a polymer matrix, as well as anti-tarnish and anti-corrosion materials. A specific example of the heat-dissipating layer 1520 is the anti-corrosive material used in Corrosion Intercept Pouches, catalog number 034-2024-10, available from University Products Inc. (Holyoke, Mass.). The anti-corrosive material is described in U.S. Pat. No. 4,944,916 to Franey, which is incorporated by reference herein in its entirety. Such materials can be formed of copper shielded or copper impregnated polymers including, but not limited to, polyethylene, low-density polyethylene, high-density polyethylene, polypropylene, and polystyrene. In another embodiment, the heat shielding or blocking and/or heat-dissipating layer is a polymer with aluminum and/or copper particles incorporated therein. In particular, the surface area of the polymer with aluminum and/or copper particles incorporated therein preferably includes a large percent by area of copper and/or aluminum. By way of example and not limitation, the surface area of the heat-dissipating layer includes about 25% by area copper and/or aluminum, 50% by area copper and/or aluminum, 75% by area copper and/or aluminum, or 90% by area copper and/or aluminum. In one embodiment, the heat shielding or blocking and/or heat-dissipating layer is substantially smooth and not bumpy. In another embodiment, the heat shielding or blocking and/or heat-dissipating layer is not flat but includes folds and/or bumps to increase the surface area of the layer. Alternatively, the heat-shielding or blocking and/or heat-dissipating layer 1520 includes a fabric having at least one metal incorporated therein or thereon. The fabric further includes a synthetic component, such as by way of example and not limitation, a nylon, a polyester, or an acetate component. Preferably, the at least one metal is selected from the group consisting of copper, nickel, aluminum, gold, silver, tin, zinc, and tungsten.

The first substrate 1525 and the second substrate 1530 can be any flexible or rigid substrate material. An example of a flexible substrate is any type of fabric. Examples of rigid substrates include, but are not limited to, glass, plastic, and metal. A rigid substrate may be, for example, the housing of any device. In one example, both the first substrate 1525 and the second substrate 1530 are flexible substrates. In another example, both the first substrate 1525 and the second substrate 1530 are rigid substrates. In yet another example, the first substrate 1525 is a flexible substrate and the second substrate 1530 is a rigid substrate. In still another example, the first substrate 1525 is a rigid substrate and the second substrate 1530 is a flexible substrate. Further, the first substrate 1525 and the second substrate 1530 can be single-layer or multi-layer structures.

Figure 17D:
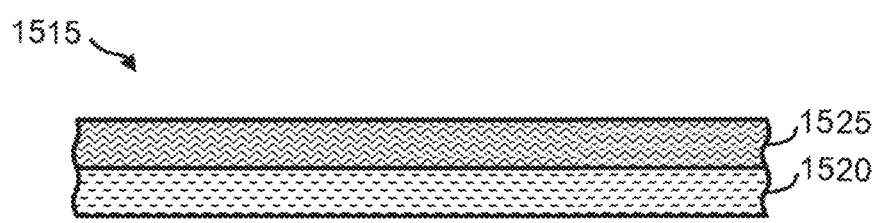
FIG. 17D illustrates a cross-sectional view of one embodiment of yet another structure that includes a material for dissipating heat.

In structure 1500 of FIG. 17A, the heat-shielding or blocking and/or heat-dissipating layer 1520, the first substrate 1525, and the second substrate 1530 are bonded or otherwise attached together, by way of example and not limitation, by adhesive, laminating, stitching, or hook-and-loop fastener system. In another example and referring now to FIG. 17B, in a structure 1505, the first substrate 1525 is bonded to one side of the heat shielding or blocking and/or heat-dissipating layer 1520, whereas the second substrate 1530 is not bonded or otherwise attached to the other side of the heat shielding or blocking and/or heat-dissipating layer 1520. In yet another example and referring now to FIG. 17C, in a structure 1510, the first substrate 1525 is provided loosely against one side of the heat shielding or blocking and/or heat-dissipating layer 1520 and the second substrate 1530 is provided loosely against the other side of the heat-dissipating layer 1520. The first substrate 1525 and the second substrate 1530 are not bonded or otherwise attached to the heat shielding or blocking and/or heat-dissipating layer 1520. In still another example and referring now to FIG. 17D, in a structure 1515, the heat shielding or blocking and/or heat-dissipating layer 1520 is provided in combination with the first substrate 1525 only, either bonded or loosely arranged. In FIG. 17D, if the two layers are loosely arranged, the heat-dissipating layer 1520 is not bonded or otherwise attached to the first substrate 1525. The material for dissipating heat is not limited to the structures 1500, 1505, 1510, 1515. These structures are exemplary only.

In one embodiment, the pouch includes at least one layer of a material to dissipate heat on the first side and/or the second side. In one embodiment, the first substrate is an interior layer of the pouch and the second substrate is an exterior layer of the pouch. In an alternative embodiment, a structure (e.g., the structure 1515 of FIG. 17D) is formed separately and then inserted into the pouch. Advantageously, this provides for retrofitting the pouch with heat protection from the heat-shielding or blocking and/or heat-dissipating material layer or coating.

Figure 18:
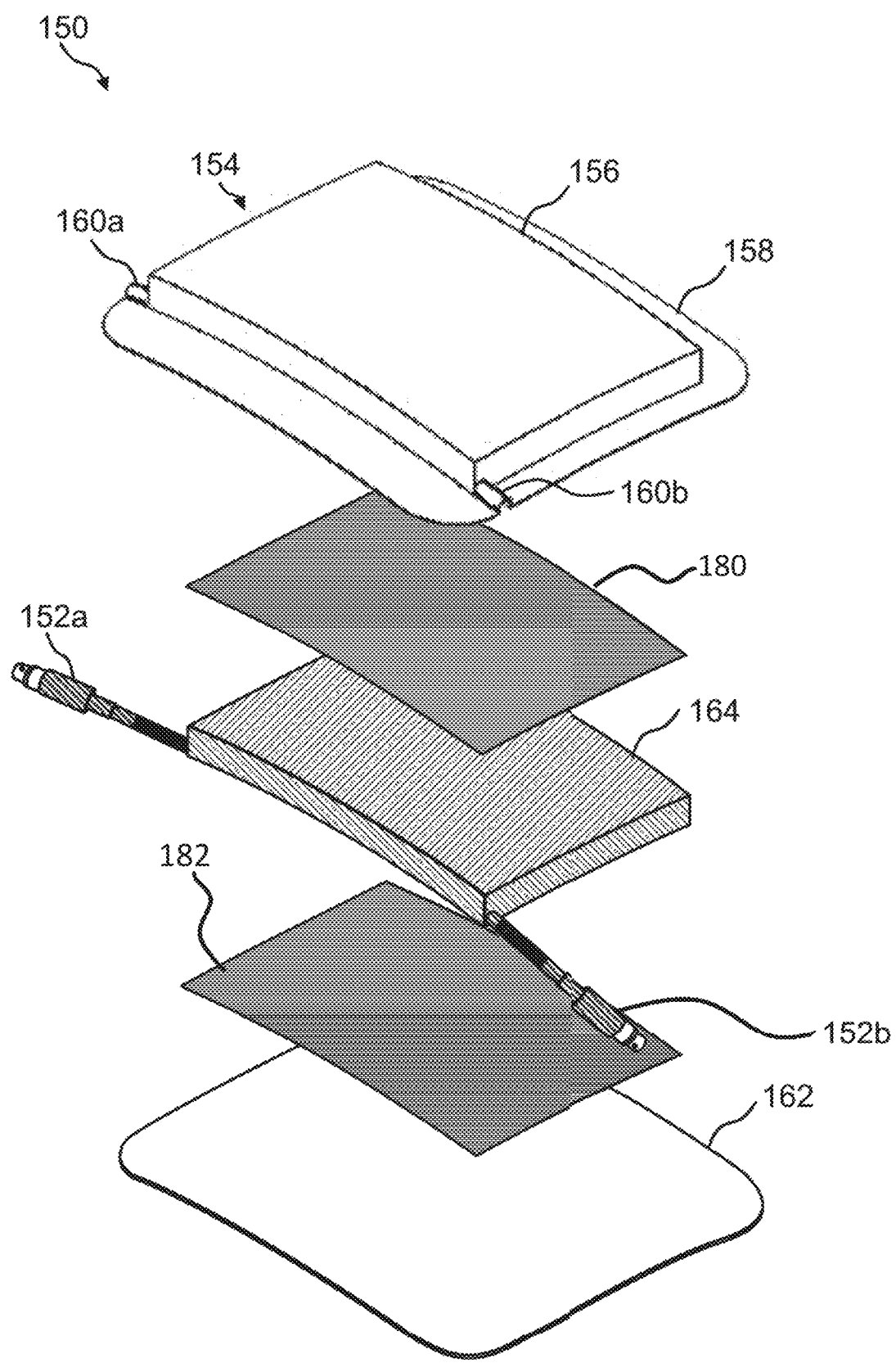
FIG. 18 illustrates an exploded view of an example of a battery of a portable battery pack into which a heat dissipating material is installed.

In a preferred embodiment, the battery includes at least one layer of a material to dissipate heat. FIG. 18 illustrates an exploded view of an example of a battery 150 of the portable battery pack 100 into which the heat dissipating material is installed. The battery 150 includes a battery element 164 that is housed between a battery cover 154 and a back plate 162. A first heat-dissipating layer 180 is between the battery cover 154 and the battery element 164. The first heat-dissipating layer 180 protects the battery from external heat sources (e.g., a hot vehicle). A second heat-dissipating layer 182 is between the battery element 164 and the back plate 162. The second heat-dissipating layer 182 protects the user from heat given off by the battery element 164. In another embodiment, the battery 150 includes only the first heat-dissipating layer 180. In yet another embodiment, the battery 150 includes only the second heat-dissipating layer 182.

In another embodiment, the pouch includes at least one layer of a material to provide resistance to bullets, knives, shrapnel, and/or other projectiles. In one embodiment, the at least one layer of a material to provide resistance to bullets, knives, shrapnel, and/or other projectiles is formed from an aramid (e.g., KEVLAR®, TWARON®), an ultra-high-molecular-weight polyethylene fiber (UHMWPE) (e.g., SPECTRA®, DYNEEMA®), a polycarbonate (e.g., LEXAN®), a carbon fiber composite material, ceramic, steel, boron nitride, a boron nitride composite material, and/or a metal (e.g., titanium). In one embodiment, the pouch is sized to fit the battery and the at least one layer of a material to provide resistance to bullets, knives, shrapnel, and/or other projectiles. In another embodiment, the at least one layer of a material to provide resistance to bullets, knives, shrapnel, and/or other projectiles is incorporated into the pouch itself. In yet another embodiment, the at least one layer of a material to provide resistance to bullets, knives, shrapnel, and/or other projectiles is housed in a built-in pocket inside of the pouch or permanently affixed (e.g., laminated, stitched, adhered) to the pouch.

In a preferred embodiment, the at least one layer of a material to provide resistance to bullets, knives, shrapnel, and/or other projectiles is on the first side (i.e., the exterior facing side) of the pouch. Advantageously, this layer protects the battery as well as the user. In one embodiment, the at least one layer of a material to provide resistance to bullets, knives, shrapnel, and/or other projectiles has a slight curvature or contour for conforming to the battery cover. Additionally or alternatively, the at least one layer of a material to provide resistance to bullets, knives, shrapnel, and/or other projectiles is on the second side (i.e., the user facing side) of the pouch. In one embodiment, the at least one layer of a material to provide resistance to bullets, knives, shrapnel, and/or other projectiles has a slight curvature or contour for conforming to the back plate. Advantageously, this layer provides additional protection to the user.

In another embodiment, the battery includes a material to provide resistance to bullets, knives, shrapnel, and/or other projectiles. In one embodiment, the material to provide resistance to bullets, knives, shrapnel, and/or other projectiles is incorporated into the battery cover and/or back plate. In an alternative embodiment, the material to provide resistance to bullets, knives, shrapnel, and/or other projectiles is between the battery cover and the battery element. Advantageously, this layer protects the plurality of battery cells housed in the battery as well as the user. Additionally or alternatively, the material to provide resistance to bullets, knives, shrapnel, and/or other projectiles is between the battery element and the back plate. Advantageously, this layer provides additional protection to the user.

As previously described, the pouch is preferably formed of a flexible, durable, and waterproof and/or water-resistant material. In one embodiment, seams of the pouch are sewn with an anti-wick or non-wicking thread. In one example, the anti-wick or non-wicking polyester thread is a bonded polyester thread with wax coating (e.g., DABOND®). The wax coating on the thread plugs stitch holes to waterproof seams. Alternatively, seams are joined together using ultrasonic welding.

In one embodiment, the pouch includes drainage holes to remove water from the pouch. The drainage holes are formed of a mesh fabric. Alternatively, the drainage holes are formed using holes with grommets in the waterproof and/or water-resistant material.

In another embodiment, the pouch includes at least one desiccant to remove moisture from the pouch. In one embodiment, the at least one desiccant includes silica. Alternatively, the at least one desiccant includes activated charcoal, calcium sulfate, calcium chloride, and/or molecular sieves (e.g., zeolites).

The portable battery pack includes leads having a connector portion. As previously described, the connector portion can be any type or style of connector needed to mate to equipment to be used with the battery of the portable battery pack. In one embodiment, a cord connector is used to protect a mated connection between the connector portion and the equipment. Examples of a cord connector include U.S. Pat. Nos. 5,336,106, 5,505,634, and 5,772,462, each of which is incorporated herein by reference in its entirety. Alternatively, a piece of heat shrink tubing is positioned to cover a mated connection between the connector portion and the equipment. In a preferred embodiment, the heat shrink tubing is sized to cover at least 0.25 inch of cabling on either side of the mated connection. Heat is then applied using a heat gun or hair dryer to shrink the tubing and seal the mated connection.

In one embodiment, the portable battery pack includes at least one processor. The at least one processor is preferably housed in the battery. In another embodiment, the at least one processor is incorporated into control electronics used to determine the state of charge (SOC) of the portable battery pack. Examples of state of charge indicators are disclosed in U.S. Publication Nos. 20170269162 and 20150198670, each of which is incorporated herein by reference in its entirety.

Figure 19:
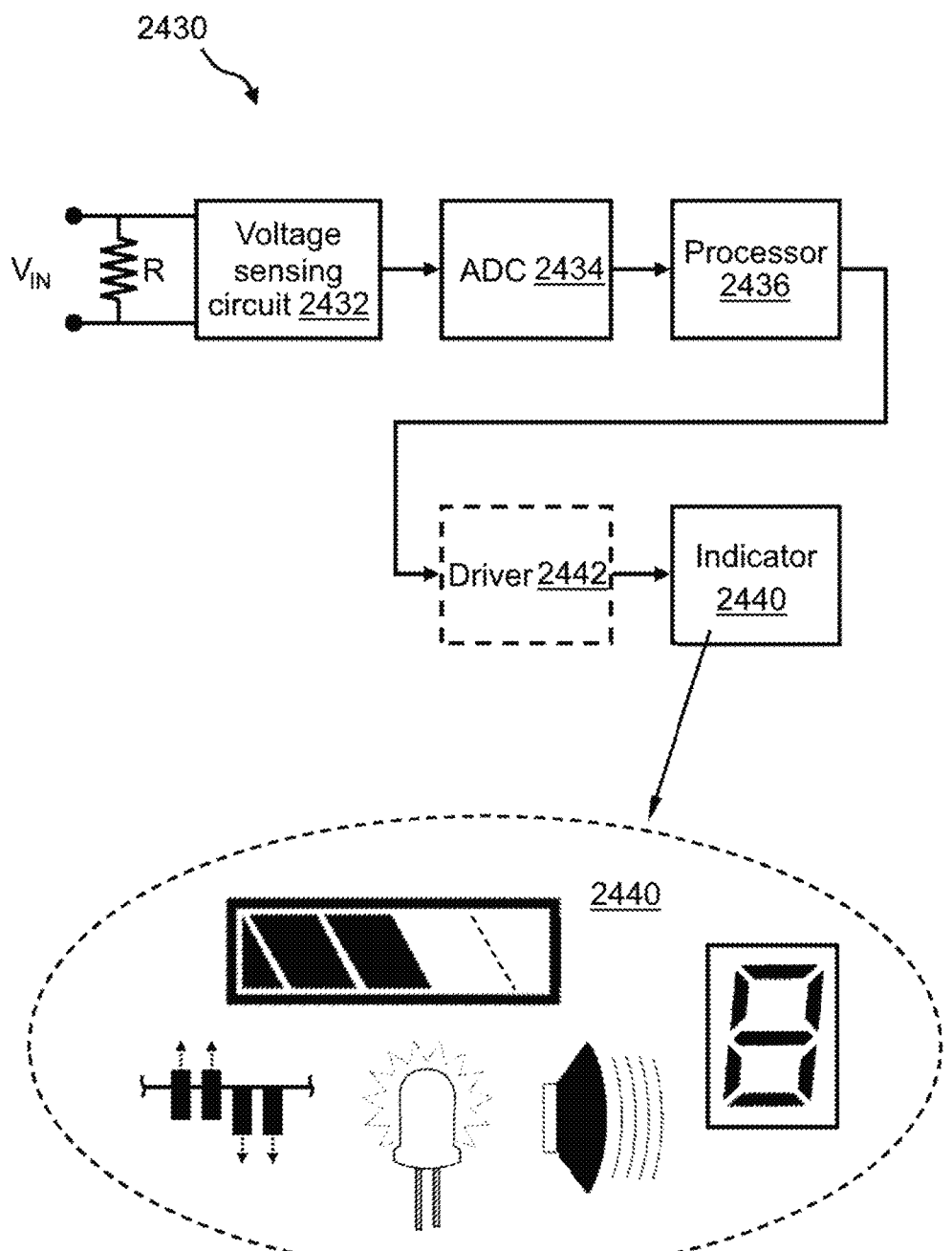
FIG. 19 illustrates a block diagram of one embodiment of the control electronics for a state of charge indicator incorporated into the portable battery pack.

FIG. 19 illustrates a block diagram of one embodiment of the control electronics for a state of charge indicator incorporated into the portable battery pack. In this example, the control electronics 2430 includes a voltage sensing circuit 2432, an analog-to-digital converter (ADC) 2434, a processor 2436, the indicator 2440, and optionally a driver 2442.

The voltage sensing circuit 2432 can be any standard voltage sensing circuit, such as those found in volt meters. An input voltage VIN is supplied via the power BUS. In one embodiment, the voltage sensing circuit 2432 is designed to sense any direct current (DC) voltage in the range of from about 0 volts DC to about 50 volts DC. In one embodiment, the voltage sensing circuit 2432 includes standard amplification or de-amplification functions for generating an analog voltage that correlates to the amplitude of the input voltage VIN that is present. The ADC 2434 receives the analog voltage from the voltage sensing circuit 2432 and performs a standard analog-to-digital conversion.

The processor 2436 manages the overall operations of the SOC indicator. The processor 2436 is any controller, microcontroller, or microprocessor that is capable of processing program instructions.

The indicator 2440 is any visual, audible, or tactile mechanism for indicating the state of charge of the portable battery pack. A preferred embodiment of a visual indicator is at least one 5-bar liquid crystal display (LCD), wherein five bars flashing or five bars indicates greatest charge and one bar or one bar flashing indicates least charge. Another example of a visual indicator is at least one seven-segment numeric LCD, wherein the number 5 flashing or the number 5 indicates greatest charge and the number 1 or the number 1 flashing indicates least charge. Alternatively, the at least one LCD displays the voltage of the portable battery pack as measured by the control electronics.

The at least one LCD is preferably covered with a transparent material. In a preferred embodiment, the cover is formed of a clear plastic (e.g., poly(methyl methacrylate)). This provides an extra layer of protection for the at least one LCD, much like a screen protector provides an extra layer of protection for a smartphone. This increases the durability of the at least one LCD. In one embodiment, the at least one LCD is on the housing of the battery. In a preferred embodiment, the housing of the battery includes a waterproof sealant (e.g., silicone) around the cover.

Alternatively, a visual indicator is at least one LED. One preferred embodiment of a visual indicator is a set of light-emitting diodes (LEDs) (e.g., 5 LEDs), wherein five lit LEDs flashing or five lit LEDs indicates greatest charge and one lit LED or one lit LED flashing indicates least charge. In one embodiment, the LEDs are red, yellow, and/or green. In one example, two of the LEDs are green to indicate a mostly full charge on the portable battery pack, two of the LEDs are yellow to indicate that charging will soon be required for the portable battery pack, and one LED is red to indicate that the portable battery pack is almost drained. In a preferred embodiment, at least three bars, lights, or numbers are used to indicate the state of charge.

In one embodiment, the at least one LED is preferably covered with a transparent material. In a preferred embodiment, the cover is formed of a clear plastic (e.g., poly(methyl methacrylate)). This provides an extra layer of protection for the at least one LED. This increases the durability of the at least one LED. In one embodiment, the at least one LED is on the housing of the battery. In a preferred embodiment, the housing of the battery includes a waterproof sealant (e.g., silicone) around the cover.

One example of an audible indicator is any sounds via an audio speaker or a headset, such as beeping sounds, wherein five beeps indicates greatest charge and one beep indicates least charge. Another example of an audible indicator is vibration sounds via any vibration mechanism (e.g., vibration motor used in mobile phones), wherein five vibration sounds indicates greatest charge and one vibration sound indicates least charge.

One example of a tactile indicator is any vibration mechanism (e.g., vibration motor used in mobile phones), wherein five vibrations indicate greatest charge and one vibration indicate least charge. Another example of a tactile indicator is a set of pins that rise up and down to be felt in Braille-like fashion, wherein five raised pins indicates greatest charge and one raised pin indicates least charge.

In one example, the processor 2436 is able to drive indicator 2440 directly. In one embodiment, the processor 2436 is able to drive directly a 5-bar LCD or a seven-segment numeric LCD. In another example, however, the processor 2436 is not able to drive indicator 2440 directly. In this case, the driver 2442 is provided, wherein the driver 2442 is specific to the type of indicator 2440 used in the control electronics 2430.

Additionally, the processor 2436 includes internal programmable functions for programming the expected range of the input voltage VIN and the correlation of the value the input voltage VIN to what is indicated at the indicator 2440. In other words, the discharge curve of the portable battery pack can be correlated to what is indicated at indicator 2440. In one embodiment, the processor 2436 is programmed based on a percent discharged or on an absolute value present at the input voltage VIN. In one embodiment, the processor is programmed with the purpose of intentionally giving a lower state of charge than actually available. In this embodiment, the battery will last longer because it will not reach a completely discharged state as frequently. Advantageously, this embodiment encourages the user to recharge the battery before it runs down. Further, this embodiment extends the overall life of the battery and increases performance of the battery.

In another embodiment, the processor is programmed to not take a voltage reading when the load is a maximum load. In one example, the battery is powering a radio, and the processor is programmed to not take a voltage reading when the radio is transmitting or receiving. Alternatively, the processor is programmed to take a voltage reading when the load is minimized.

In one embodiment, the control electronics includes at least one antenna, which allows the portable battery pack to send information (e.g., state of charge information) to at least one remote device (e.g., smartphone, tablet, laptop computer, satellite phone) and/or receive information (e.g., software updates, activation of kill switch) from at least one remote device. The at least one antenna provides wireless communication, standards-based or non-standards-based, by way of example and not limitation, radiofrequency, BLUETOOTH®, ZIGBEE®, Near Field Communication, or similar commercially used standards.

Figure 20A:
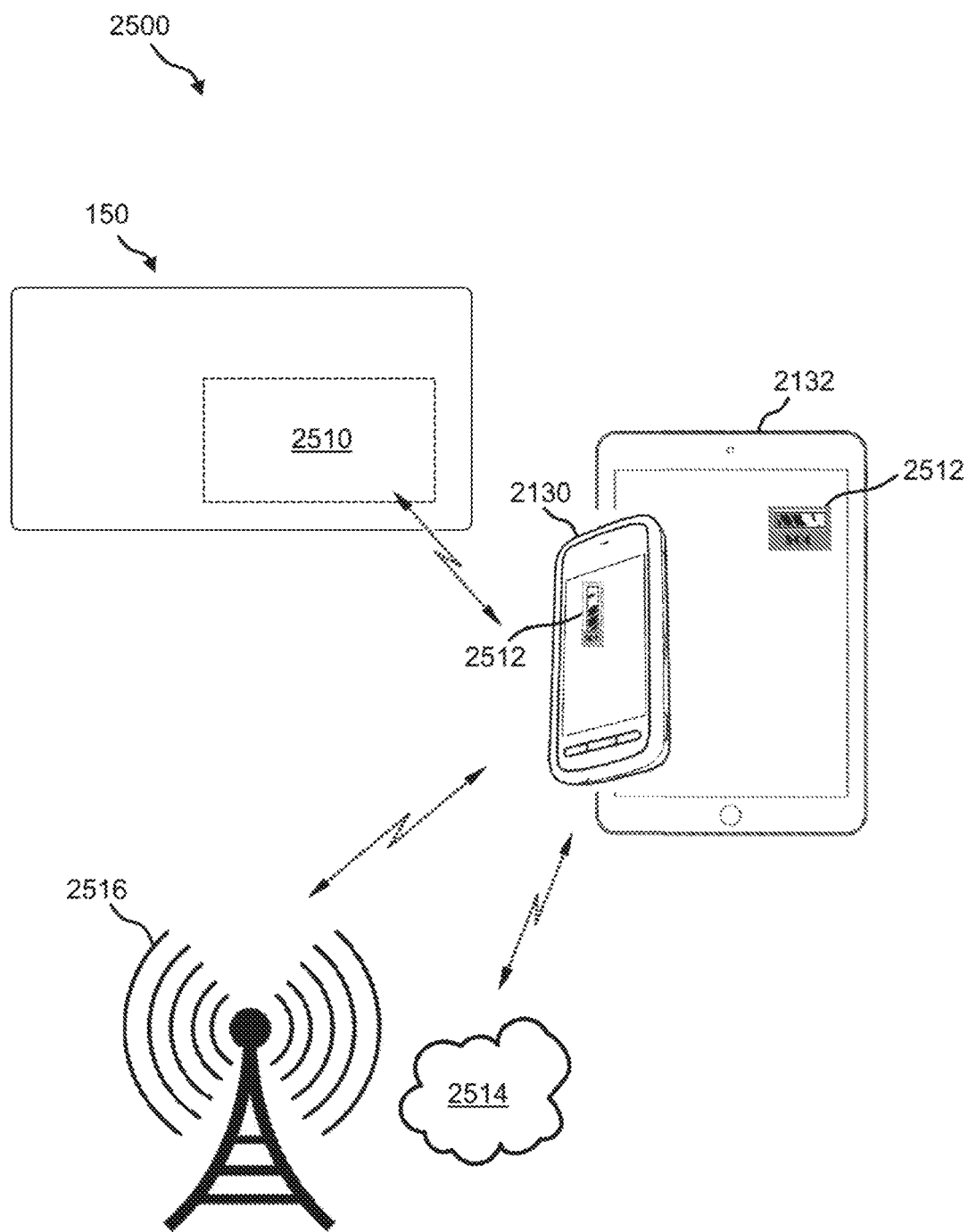
FIG. 20A illustrates a block diagram of an example of an SOC system that includes a mobile application for use with a portable battery pack.

FIG. 20A illustrates a block diagram of an example of an SOC system 2500 that includes a mobile application for use with a portable battery pack. The SOC system 2500 includes a battery 150 having a communications interface 2510.

The communications interface 2510 is any wired and/or wireless communication interface for connecting to a network and by which information may be exchanged with other devices connected to the network. Examples of wired communication interfaces include, but are not limited to, System Management Bus (SMBus), USB ports, RS232 connectors, RJ45 connectors, Ethernet, and any combinations thereof. Examples of wireless communication interfaces include, but are not limited to, an Intranet connection, Internet, ISM, BLUETOOTH® technology, WI-FI®, WIMAX®, IEEE 802.11 technology, radio frequency (RF), Near Field Communication (NFC), ZIGBEE®, Infrared Data Association (IrDA) compatible protocols, Local Area Networks (LAN), Wide Area Networks (WAN), Shared Wireless Access Protocol (SWAP), any combinations thereof, and other types of wireless networking protocols.

The communications interface 2510 is used to communicate, preferably wirelessly, with at least one remote device, such as but not limited to, a mobile phone 2130 or a tablet 2132. The mobile phone 2130 can be any mobile phone that (1) is capable of running mobile applications and (2) is capable of communicating with the portable battery pack. The mobile phone 2130 can be, for example, an ANDROID™ phone, an APPLE® IPHONE®, or a SAMSUNG® GALAXY® phone. Likewise, the tablet 2132 can Be any tablet that (1) is capable of running mobile applications and (2) is capable of communicating with the portable battery pack. The tablet 2132 can be, for example, the 3G or 4G version of the APPLE® IPAD®.

Further, in the SOC system 2500, the mobile phone 2130 and/or the tablet 2132 is in communication with a cellular network 2516 and/or a network 2514. The network 2514 can be any network for providing wired or wireless connection to the Internet, such as a local area network (LAN) or a wide area network (WAN).

An SOC mobile application 2512 is installed and running at the mobile phone 2130 and/or the tablet 2132. The SOC mobile application 2512 is implemented according to the type (i.e., the operating system) of mobile phone 2130 and/or tablet 2132 on which it is running. The SOC mobile application 2512 is designed to receive SOC information from the portable battery pack. The SOC mobile application 2512 indicates graphically, audibly, and/or tactilely, the state of charge to the user (not shown).

Figure 20B:
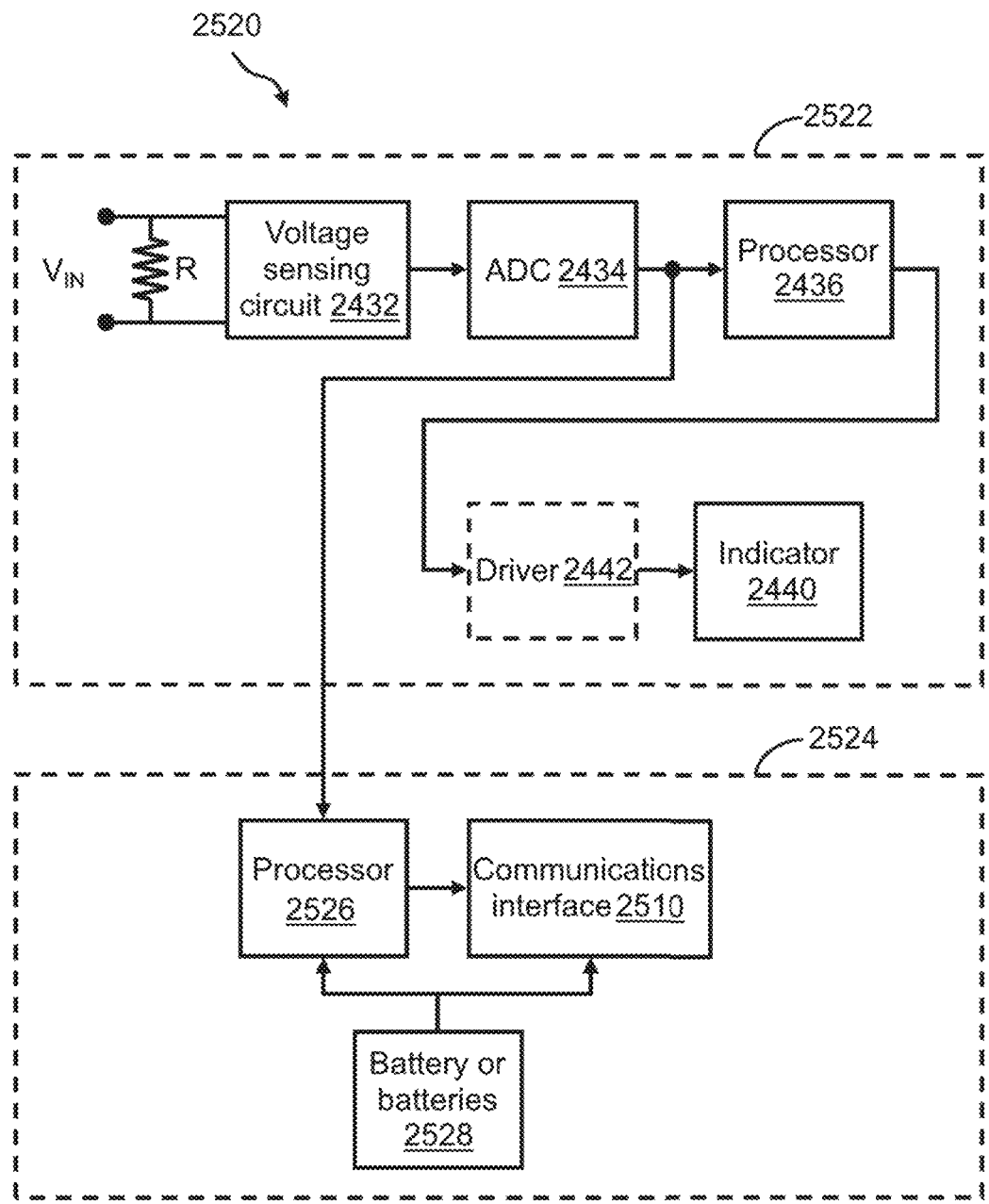
FIG. 20B illustrates a block diagram of an example of control electronics of the portable battery pack that is capable of communicating with the SOC mobile application.

FIG. 20B illustrates a block diagram of an example of an SOC system 2520 of the portable battery pack that is capable of communicating with the SOC mobile application 2512. In this example, the SOC system 2520 includes an SOC portion 2522 and a communications portion 2524. The SOC portion 2522 is substantially the same as the control electronics 2430 shown in FIG. 19. The communications portion 2524 handles the communication of the SOC information to the SOC mobile application 2512 at, for example, the mobile phone 2130 and/or the tablet 2132.

The communications portion 2524 includes a processor 2526 that is communicatively connected to the communications interface 2510. The digital output of the ADC 2434 of the SOC portion 2522, which is the SOC information, feeds an input to the processor 2526. The processor 2526 can be any controller, microcontroller, or microprocessor that is capable of processing program instructions. One or more batteries 2528 provide power to the processor 2526 and the communications interface 2510. The one or more batteries 2528 can be any standard cylindrical battery, such as quadruple-A, triple-A, or double-A, or a battery from the family of button cell and coin cell batteries. A specific example of a battery 2528 is the CR2032 coin cell 3-volt battery.

In SOC system 2520, the SOC portion 2522 and the communications portion 2524 operate substantially independent of one another. Namely, the communications portion 2524 is powered separately from the SOC portion 2522 so that the communications portion 2524 is not dependent on the presence of the input voltage VIN at the SOC portion 2522 for power. Therefore, in this example, the communications portion 2524 is operable to transmit information to the SOC mobile application 2512 at any time. However, in order to conserve battery life, in one embodiment the processor 2526 is programmed to be in sleep mode when no voltage is detected at the input voltage VIN at the SOC portion 2522 and to wake up when an input voltage VIN is detected. Alternatively, the processor 2526 is programmed to periodically measure the SOC and send SOC information to the SOC mobile application 2512 on the at least one remote device periodically, such as every hour, regardless of the state of input voltage VIN.

Figure 20C:
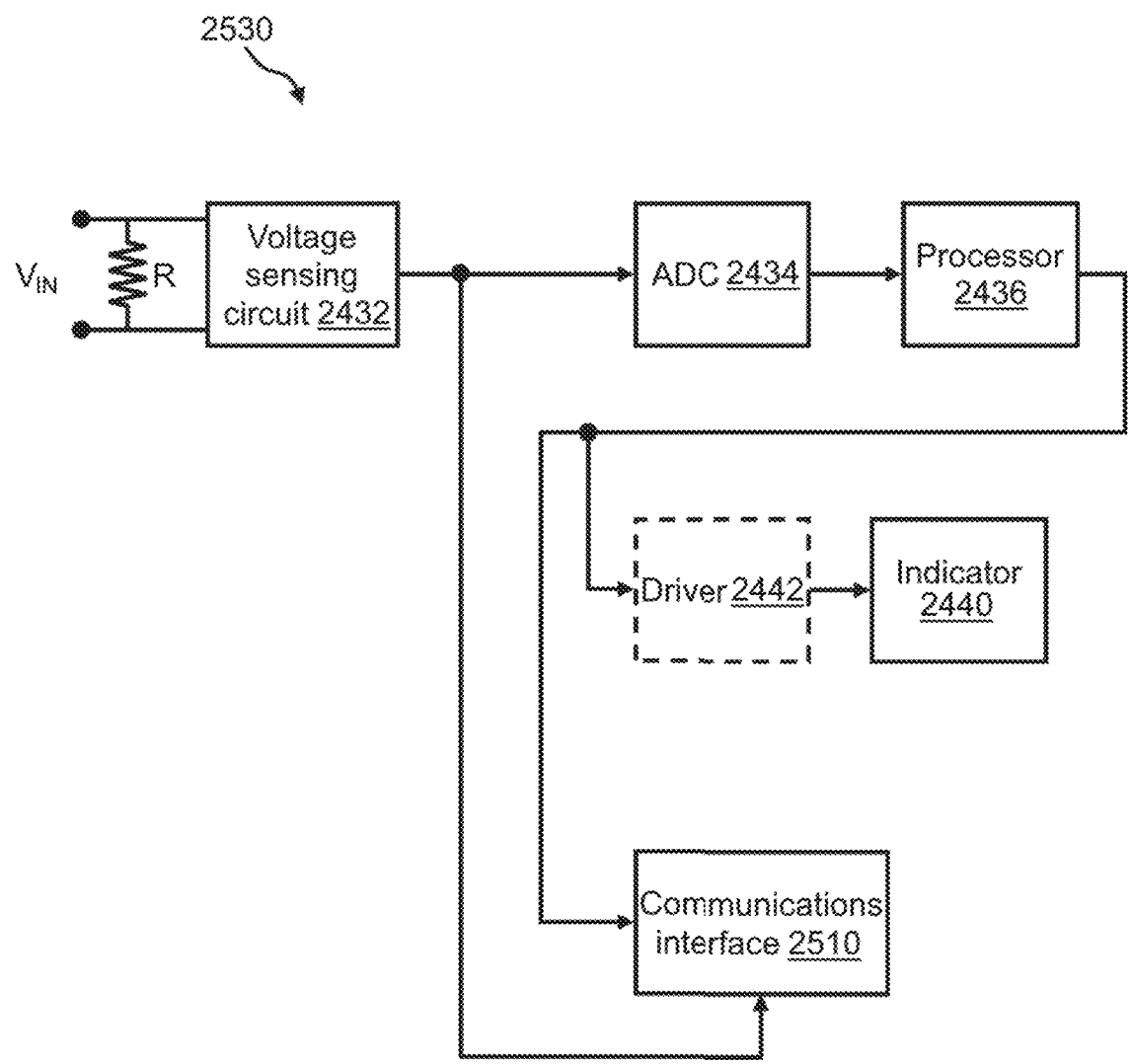
FIG. 20C illustrates a block diagram of another example of control electronics of the portable battery pack that is capable of communicating with the SOC mobile application.

FIG. 20C illustrates a block diagram of another example of control electronics 2530 of the portable battery pack that is capable of communicating with the SOC mobile application 2512. In this example, the operation of the communications interface 2510 is dependent on the presence of a voltage at input voltage VIN. This is because, in control electronics 2530, the communications interface 2510 is powered from the output of voltage sensing circuit 2432. Further, the processor 2436 provides the input (i.e., the SOC information) to the communications interface 2510. A drawback of the control electronics 2530 of FIG. 20C as compared with the SOC system 2520 of FIG. 20B, is that it is operable to transmit SOC information to the SOC mobile application 2512 only when the portable battery pack has a charge.

Alternatively, the SOC of the battery of the portable battery pack is determined by a pluggable state of charge indicator. An example of a pluggable state of charge indicator is disclosed in U.S. Publication Nos. 20170269162 and 20150198670, each of which is incorporated herein by reference in its entirety. Advantageously, intermittently measuring the SOC of the battery extends the run time of the battery.

Figure 21:
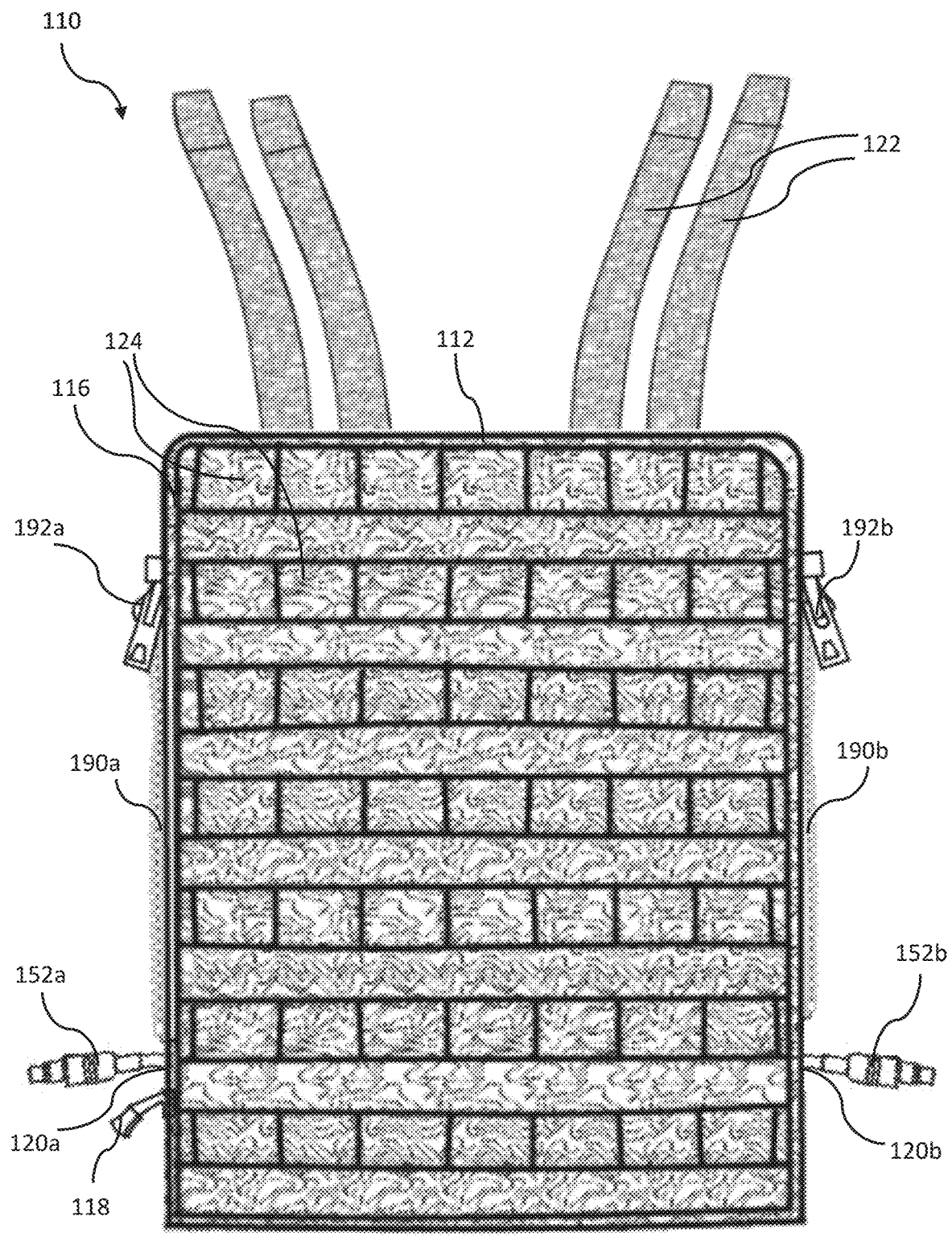
FIG. 21 illustrates a front perspective view of an example of the portable battery pack that comprises a battery enclosed by a wearable pouch or skin sized to hold the battery and additional devices or components.
Figure 22:
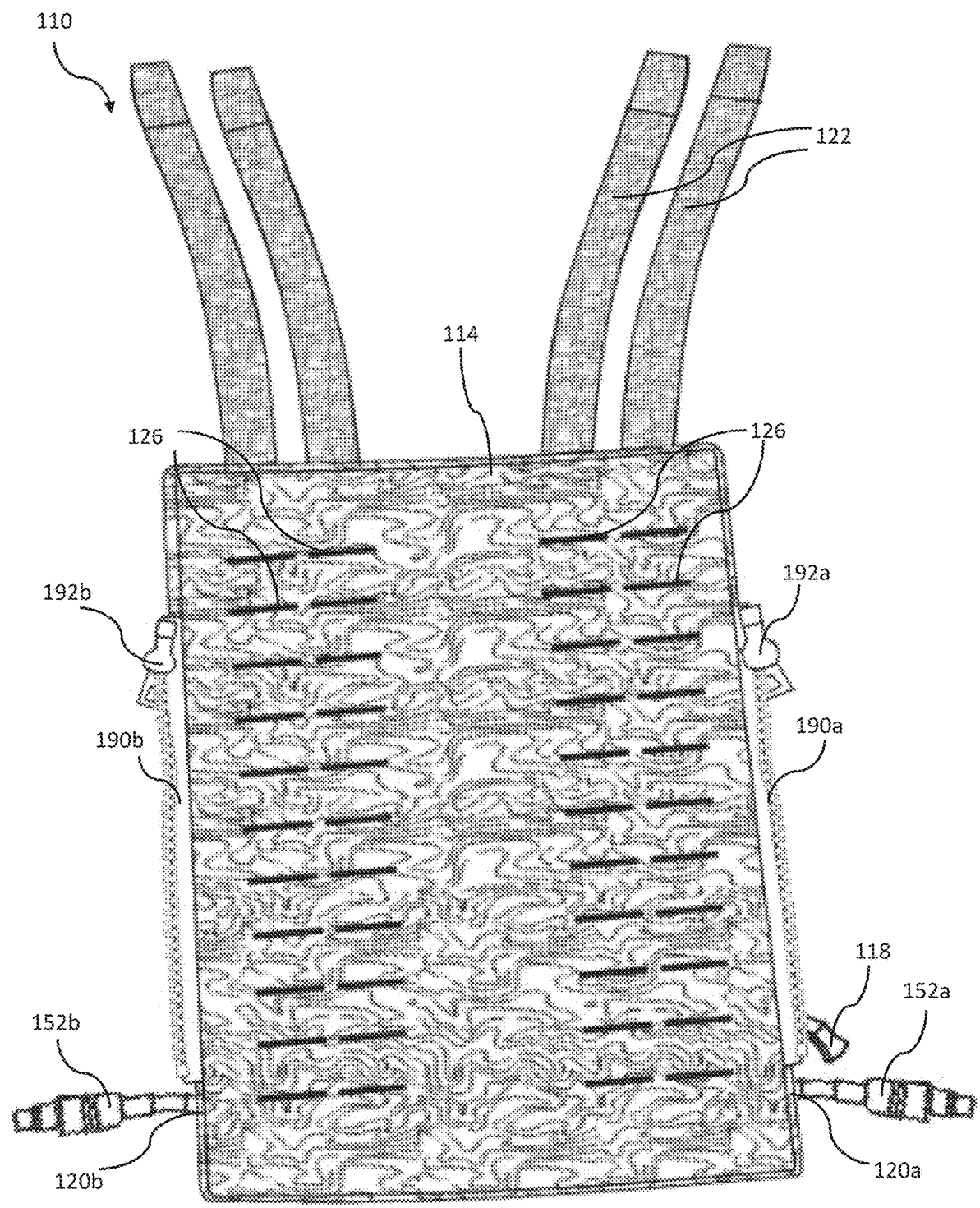
FIG. 22 illustrates a rear perspective view of an example of the portable battery pack that comprises a battery enclosed by a wearable pouch or skin sized to hold the battery and additional devices or components.

In another preferred embodiment, the portable battery pack includes a battery enclosed by a wearable pouch or skin sized to hold the battery and additional devices or components as shown in FIGS. 21-22. In this example, the pouch 110 is a wearable pouch or skin that can be sized in any manner that substantially corresponds to a size of at least one battery, at least one radio, at least one power and/or data hub, at least one GPS system, and/or other gear.

In a preferred embodiment, the pouch 110 is formed of a flexible, durable, and waterproof or at least water-resistant material. For example, the pouch 110 is formed of polyester, polyvinyl chloride (PVC)-coated polyester, vinyl-coated polyester, nylon, canvas, PVC-coated canvas, or polycotton canvas. In one embodiment, the pouch 110 is formed of a material that is laminated to or treated with a waterproofing or water repellant material (e.g., rubber, PVC, polyurethane, silicone elastomer, fluoropolymers, wax, thermoplastic elastomer). Additionally or alternatively, the pouch 110 is treated with a UV coating to increase UV resistance. The exterior finish of the pouch 110 can be any color, such as white, brown, green, orange (e.g., international orange), yellow, black, or blue, or any pattern, such as camouflage, as provided herein, or any other camouflage in use by the military, law enforcement, or hunters. For example, in FIGS. 21-22, the pouch 110 is shown to have a camouflage pattern. In one embodiment, the exterior of the pouch 110 includes a reflective tape (e.g., infrared reflective tape), fabric, or material. Advantageously, the reflective tape, fabric, or material improves visibility of the user in low-light conditions.

The pouch 110 has a first side 112 and a second side 114. The pouch 110 also includes a pouch opening 116, which is the opening through which a battery is fitted into the pouch 110. In the example shown in FIGS. 21-22, the pouch opening 116 is opened and closed using a zipper, as the pouch 110 includes a zipper tab 118. Other mechanisms, however, can be used for holding the pouch opening 116 of the pouch 110 open or closed, such as, a hook and loop system (e.g., VELCRO®), buttons, snaps, hooks, ties, clips, buckles, and the like. In a preferred embodiment, the pouch 110 has at least one opening for a corresponding lead. In the example shown in FIGS. 21-22, the pouch 110 has a first lead opening 120a for a first lead 152a and a second lead opening 120b for a second lead 152b. For example, the first lead opening 120a and/or the second lead opening 120b can be a 0.5-inch long slit or a 0.75-inch long slit in the edge of the pouch 110. In one embodiment, the first lead opening 120a and/or the second lead opening 120b is finished or reinforced with stitching. In another embodiment, the first lead opening 120a and/or the second lead opening 120b is laser cut.

In a preferred embodiment, the pouch 110 of the portable battery pack 100 is MOLLE-compatible. In one embodiment, the pouch 110 incorporates a pouch attachment ladder system (PALS), which is a grid of webbing used to attach smaller equipment onto load-bearing platforms, such as vests and backpacks. For example, the PALS grid consists of horizontal rows of 1-inch (2.5 cm) webbing, spaced about one inch apart, and reattached to the backing at 1.5-inch (3.8 cm) intervals. In one embodiment, the webbing is formed of nylon (e.g., cordura nylon webbing, MIL-W-43668 Type III nylon webbing). Accordingly, a set of straps 122 (e.g., four straps 122) are provided on one edge of the pouch 110 as shown. Further, rows of webbing 124 (e.g., seven rows 124) are provided on the first side 112 of the pouch 110, as shown in FIG. 21. Additionally, rows of slots or slits 126 (e.g., eleven rows of slots or slits 126) are provided on the second side 114 of the pouch 110, as shown in FIG. 22. In a preferred embodiment, the set of straps 122, the rows of webbing 124, and the rows of slots or slits 126 replicate and duplicate the MOLLE underneath the portable battery pack on the load bearing equipment. Advantageously, this allows for minimal disruption to the user because the user can place additional gear pouches or gear (e.g., water bottle, antenna pouch) on the MOLLE of the portable battery pack in an equivalent location.

In the embodiment shown in FIGS. 21-22, the portable battery pack is made to affix to a plate carrier, body armor, or a vest with at least one single width of zipper tape sewn on the front panel or the back panel (e.g., JPC 2.0™ by Crye Precision). FIGS. 21-22 show details of the first side 112 of the pouch 110 including a first single width of zipper tape 190a and a first zipper slider 192a and a second single width of zipper tape 190b and a second zipper slider 192b. The first single width of zipper tape 190a mates with a corresponding single width of zipper tape on the plate carrier, the body armor, or the vest. The second single width of zipper tape 190b also mates with a corresponding single width of zipper tape on the plate carrier, the body armor, or the vest.

Figure 23:
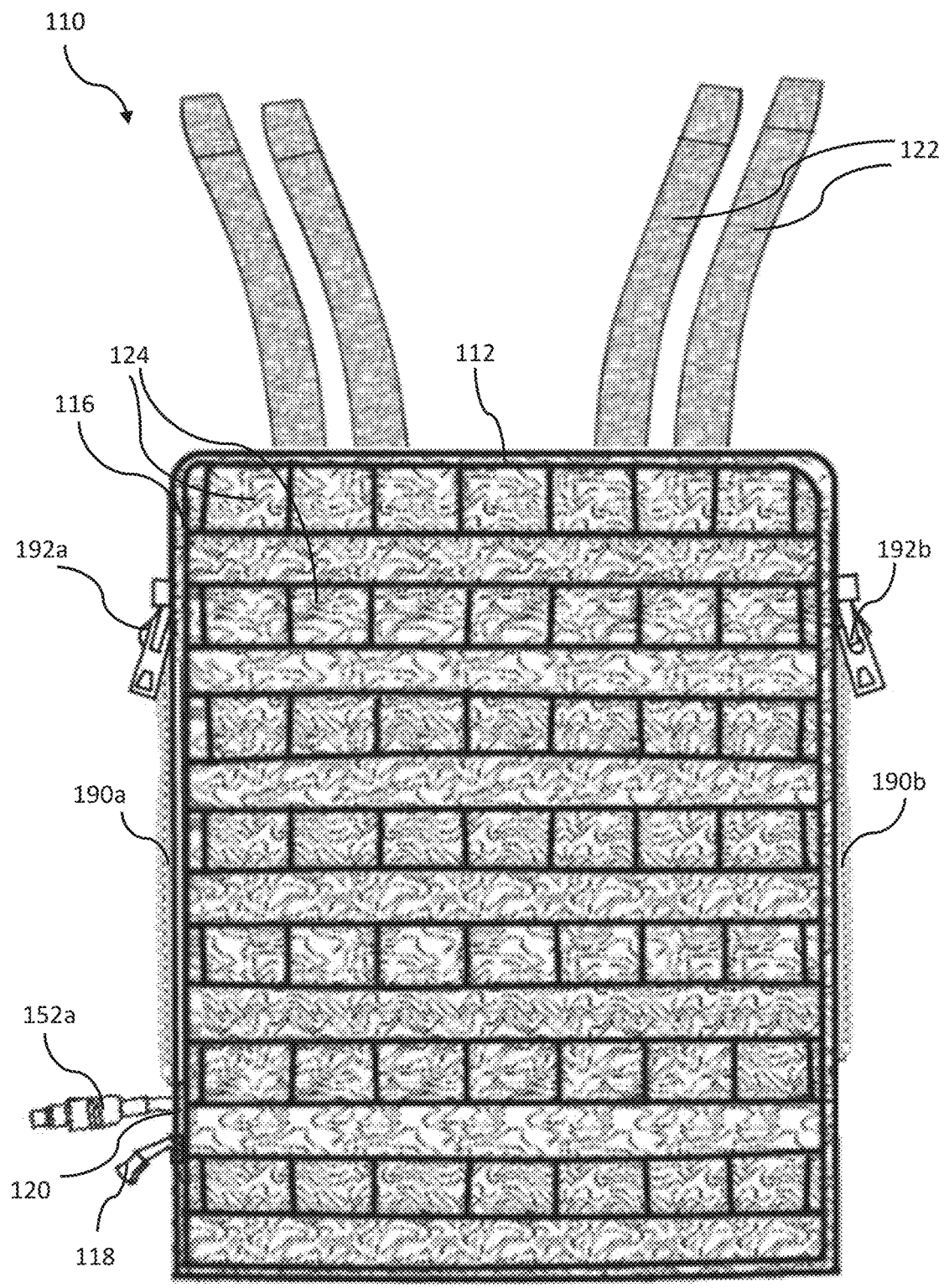
FIG. 23 illustrates a front perspective view of another example of the portable battery pack that comprises a battery enclosed by a wearable pouch or skin sized to hold the battery and additional devices or components.
Figure 24:
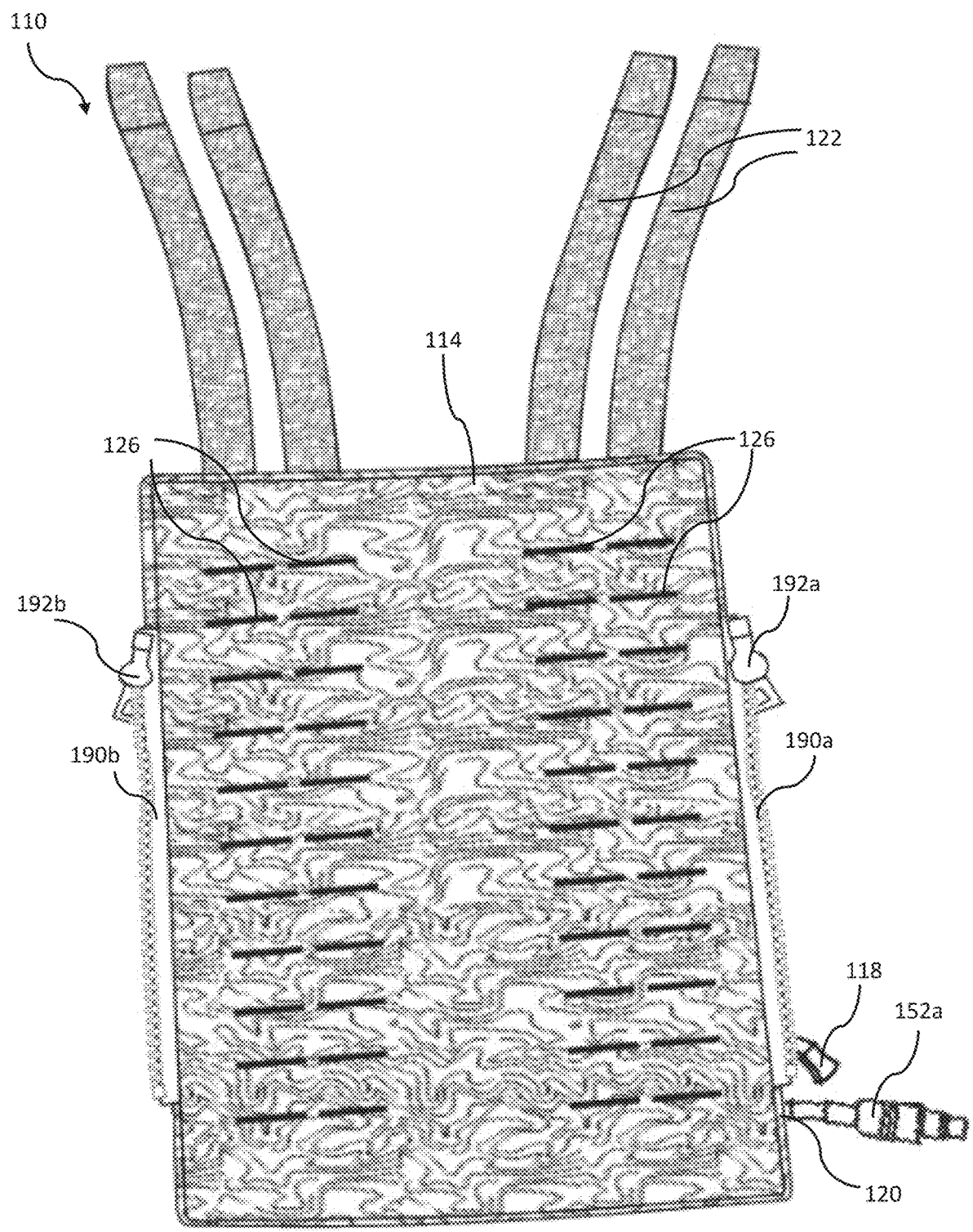
FIG. 24 illustrates a rear perspective view of another example of the portable battery pack that comprises a battery enclosed by a wearable pouch or skin sized to hold the battery and additional devices or components.

In one embodiment, at least one lead of the battery of the portable battery pack is used to power at least one device enclosed in the pouch of the portable battery pack. In the example shown in FIGS. 23-24, the battery of the portable battery pack has a first lead 152a and a second lead (not shown). The first lead 152a exits the pouch 110 through a lead opening 120. The second lead is used to power at least one device enclosed in the pouch 110 of the portable battery pack.

The portable battery pack is operable to supply power to a power distribution and data hub. The power distribution and data hub is operable to supply power to at least one peripheral device (e.g., tablet, smartphone, computer, radio, rangefinder, GPS system). The power distribution and data hub is also operable to transfer data between at least two of the peripheral devices. Additionally, the power distribution and data hub is operable to transfer data between the battery and the at least one peripheral device when the battery includes at least one processor. In a preferred embodiment, the power distribution and data hub is enclosed in the pouch of the portable battery pack. Alternatively, the power distribution and data hub is not enclosed in the pouch of the portable battery pack.

Figure 25:
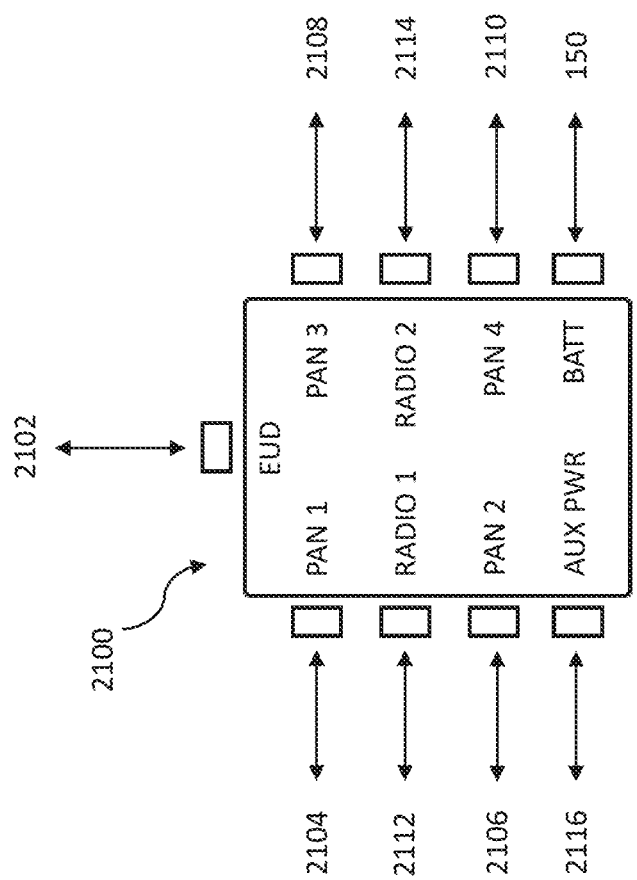
FIG. 25 illustrates a block diagram of one example of a power distribution and data hub.

FIG. 25 illustrates a block diagram of one example of a power distribution and data hub (e.g., STAR-PAN™ by Glenair). The power distribution and data hub 2100 is connected to the battery 150 of the portable battery pack. The battery 150 supplies power to the power distribution and data hub 2100. In the example shown in FIG. 25, the power distribution and data hub 2100 provides power to an end user device (EUD) 2102. The end user device 2102 is a tablet, a smartphone, or a computer (e.g., laptop computer). The power distribution and data hub 2100 is operable to provide power to a first peripheral device 2104, a second peripheral device 2106, a third peripheral device 2108, and a fourth peripheral device 2110 through a personal area network (PAN). In one embodiment, the first peripheral device 2104, the second peripheral device 2106, the third peripheral device 2108, and/or the fourth peripheral device 2110 is a radio, a rangefinder (e.g., Pocket Laser Range Finder (PLRF)), a laser designator (e.g., Special Operations Forces Laser Acquisition Marker (SOFLAM), Type 163 Laser Target Designator), a targeting system (e.g., FIRESTORM™), a GPS device (e.g., Defense Advanced GPS Receiver (DAGR)), night vision goggles, an electronic jamming system (e.g., AN/PLT-4, AN/PLT-5 (Thor II) by Sierra Nevada Corporation, Thor III), a mine detector, a metal detector, a camera (e.g., body camera), a thermal imaging device (e.g., camera, binoculars), a short wave infrared (SWIR) device, a satellite phone, an antenna, a lighting system (e.g., portable runway lights, infrared strobe lights), an environmental sensor (e.g., radiation, airborne chemicals, pressure, temperature, humidity), an amplifier, and/or a receiver (e.g., Tactical Net ROVER™ Intelligence, Surveillance, and Reconnaissance (ISR), Multi-Band Digital Video Receiver Enhanced (MVR VIE), Multi-Band Video Receiver (MVR IV), Soldier Intelligence Receiver (SIR), STRIKEHAWK™ Video Downlink Receiver). The power distribution and data hub 2100 is operable to supply power to peripheral devices that require 5V charging via a USB adapter.

The power distribution and data hub 2100 is operable to supply power to a first radio 2112 and a second radio 2114. In a preferred embodiment, the first radio 2112 and/or the second radio 2114 is a PRC-152, a PRC-154, a PRC-117G, a PRC-161, a persistent wave relay, a PRC-148 MBITR, a PRC-148 JEM, a PRC-6809 MBITR Clear, a RT-1922 SADL, a RF-7850M-HH, a ROVER® (e.g., ROVER® 6x Transceiver by L3 Communication Systems), a push-to-talk radio, and/or a PNR-1000. Alternative radios are compatible with the present invention.

In another embodiment, the first peripheral device 2104, the second peripheral device 2106, the third peripheral device 2108, and/or the fourth peripheral device 2110 is a fish finder and/or a chartplotter, an aerator or a live bait well, a camera (e.g., an underwater camera), a temperature and/or a depth sensor, a stereo, a drone, and/or a lighting system. In one embodiment, the lighting system includes at least one LED.

The power distribution and data hub is operable to recharge at least one battery. For example, the power distribution and data hub is operable to recharge a battery for a drone and/or a robot. The power distribution and data hub is also operable to recharge CR123 batteries, which are often used in devices, such as camera and lighting systems. Advantageously, this allows the power distribution and data hub to recharge batteries in remote locations without access to a power grid, a generator, and/or a vehicle battery.

The power distribution and data hub 2100 is operable to transfer data between the end user device 2102, the first peripheral device 2104, the second peripheral device 2106, the third peripheral device 2108, the fourth peripheral device 2110, the first radio 2112, the second radio 2114, and/or the battery 150 when the battery 150 includes at least one processor.

The power distribution and data hub 2100 has a port to obtain power from an auxiliary power source 2116. In one embodiment, the auxiliary power source 2116 is an alternating current (AC) adapter, a solar panel, a generator, a portable power case, a fuel cell, a vehicle battery, a rechargeable battery, and/or a non-rechargeable battery. Alternatively, the auxiliary power source 2116 is an inductive charger. In another embodiment, the auxiliary power source 2116 is operable to supply power to the power distribution and data hub 2100 by harvesting ambient radiofrequency (RF) waves, capturing exothermic body reactions (e.g., heat, sweat), using friction (e.g., triboelectric effect) or kinetic energy, or harvesting energy from running water or wind energy. In yet another embodiment, the auxiliary power source 2116 is a pedal power generator. The auxiliary power source 2116 is preferably operable to recharge the battery 150.

Figure 26:
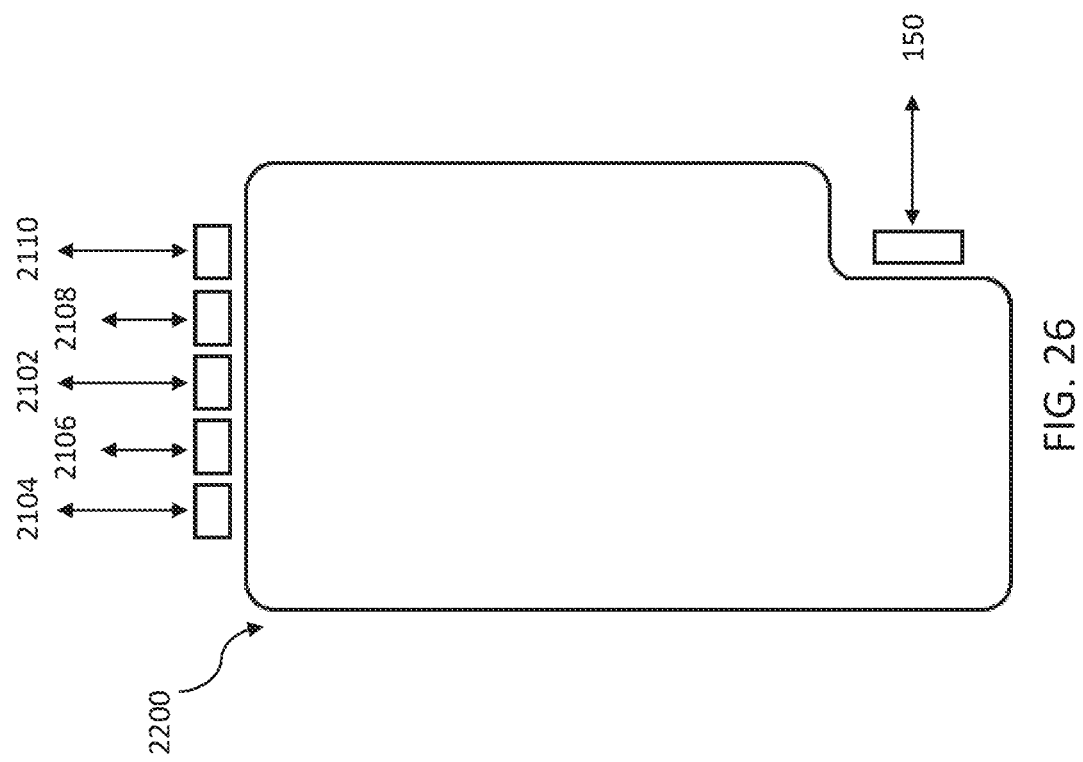
FIG. 26 illustrates a block diagram of another example of a power distribution and data hub.

FIG. 26 illustrates a block diagram of another example of a power distribution and data hub (e.g., APEX™ by Black Diamond Advanced Technology). The power distribution and data hub 2200 is connected to the battery 150 of the portable battery pack. The battery 150 supplies power to the power distribution and data hub 2200. In the example shown in FIG. 26, the power distribution and data hub 2200 provides power to an end user device 2102. The end user device 2102 is a tablet, a smartphone, or a computer (e.g., laptop computer). The power distribution and data hub 2200 is operable to provide power to a first peripheral device 2104, a second peripheral device 2106, a third peripheral device 2108, and a fourth peripheral device 2110. In one embodiment, the first peripheral device 2104, the second peripheral device 2106, the third peripheral device 2108, and/or the fourth peripheral device 2110 is a radio, a rangefinder (e.g., Pocket Laser Range Finder (PLRF)), a laser designator (e.g., Special Operations Forces Laser Acquisition Marker (SOFLAM), Type 163 Laser Target Designator), a targeting system (e.g., FIRESTORM™), a GPS device (e.g., Defense Advanced GPS Receiver (DAGR)), night vision goggles, an electronic jamming system (e.g., AN/PLT-4, AN/PLT-5 (Thor II) by Sierra Nevada Corporation, Thor III), a mine detector, a metal detector, a camera (e.g., body camera), a thermal imaging device (e.g., camera, binoculars), a short wave infrared (SWIR) device, a satellite phone, an antenna, a lighting system (e.g., portable runway lights, infrared strobe lights), an environmental sensor (e.g., radiation, airborne chemicals, pressure, temperature, humidity), an amplifier, and/or a receiver (e.g., Tactical Net ROVER™ Intelligence, Surveillance, and Reconnaissance (ISR), Multi-Band Digital Video Receiver Enhanced (MVR VIE), Multi-Band Video Receiver (MVR IV), Soldier Intelligence Receiver (SIR), STRIKEHAWK™ Video Downlink Receiver). In a preferred embodiment, the radio is a PRC-152, a PRC-154, a PRC-117G, a PRC-161, a persistent wave relay, a PRC-148 MBITR, a PRC-148 JEM, a PRC-6809 MBITR Clear, a RT-1922 SADL, a RF-7850M-HH, a ROVER® (e.g., ROVER® 6x Transceiver by L3 Communication Systems), a push-to-talk radio, and/or a PNR-1000. Alternative radios are compatible with the present invention.

The power distribution and data hub 2200 is operable to transfer data between the end user device 2102, the first peripheral device 2104, the second peripheral device 2106, the third peripheral device 2108, the fourth peripheral device 2110, and/or the battery 150 when the battery 150 includes at least one processor.

In one embodiment, the power distribution and data hub includes at least one step up voltage converter and/or at least one step down voltage converter. In one example, the power distribution and data hub is powered by a 16.8V battery and includes a step up voltage converter to 29.4V. In another example, the power distribution and data hub is powered by a 16.8V battery and includes a step down voltage converter to 5V. Advantageously, this allows the portable battery pack to power devices (e.g., smartphones) with a charging voltage of 5V. This also reduces the bulk outside the power distribution and data hub because the step down voltage converter is housed within the power distribution and data hub and a separate external voltage converter is not required.

In another embodiment, the power distribution and data hub is operable to prioritize a supply of power to the at least one peripheral device. In one example, the power distribution and data hub is connected to a first peripheral device and a second peripheral device. The power distribution and data hub will stop supplying power to the second peripheral device when the available power in the battery and/or auxiliary power source is lower than a designated threshold. In another example, the power distribution and data hub is connected to a first peripheral device, a second peripheral device, a third peripheral device, and a fourth peripheral device. The power distribution and data hub will stop supplying power to the fourth peripheral device when the available power in the battery and/or auxiliary power source is lower than a first designated threshold, the power distribution and data hub will stop supplying power to the third peripheral device when the available power in the battery and/or auxiliary power source is lower than a second designated threshold, and the power distribution and data hub will stop supplying power to the second peripheral device when the available power in the battery and/or auxiliary power source is lower than a third designated threshold.

In one embodiment, the power distribution and data hub provides power in an order of priority of the attached peripheral device and automatically cuts out devices of lower mission priority in order to preserve remaining power for higher priority devices. In one example, a radio has a first (i.e., top) priority, a tablet has a second priority, a mobile phone has a third priority, and a laser designator (e.g., Special Operations Forces Laser Acquisition Marker (SOFLAM)) has a fourth priority.

In one embodiment, the power distribution and data hub prioritizes at least one peripheral device by using at least one smart cable. The at least one smart cable stores information including, but not limited to, a unique identifier (e.g., MAC address) for the at least one peripheral device, power requirements of the at least one peripheral device, a type of device for the at least one peripheral device, and/or a priority ranking for the at least one peripheral device.

Figure 27:
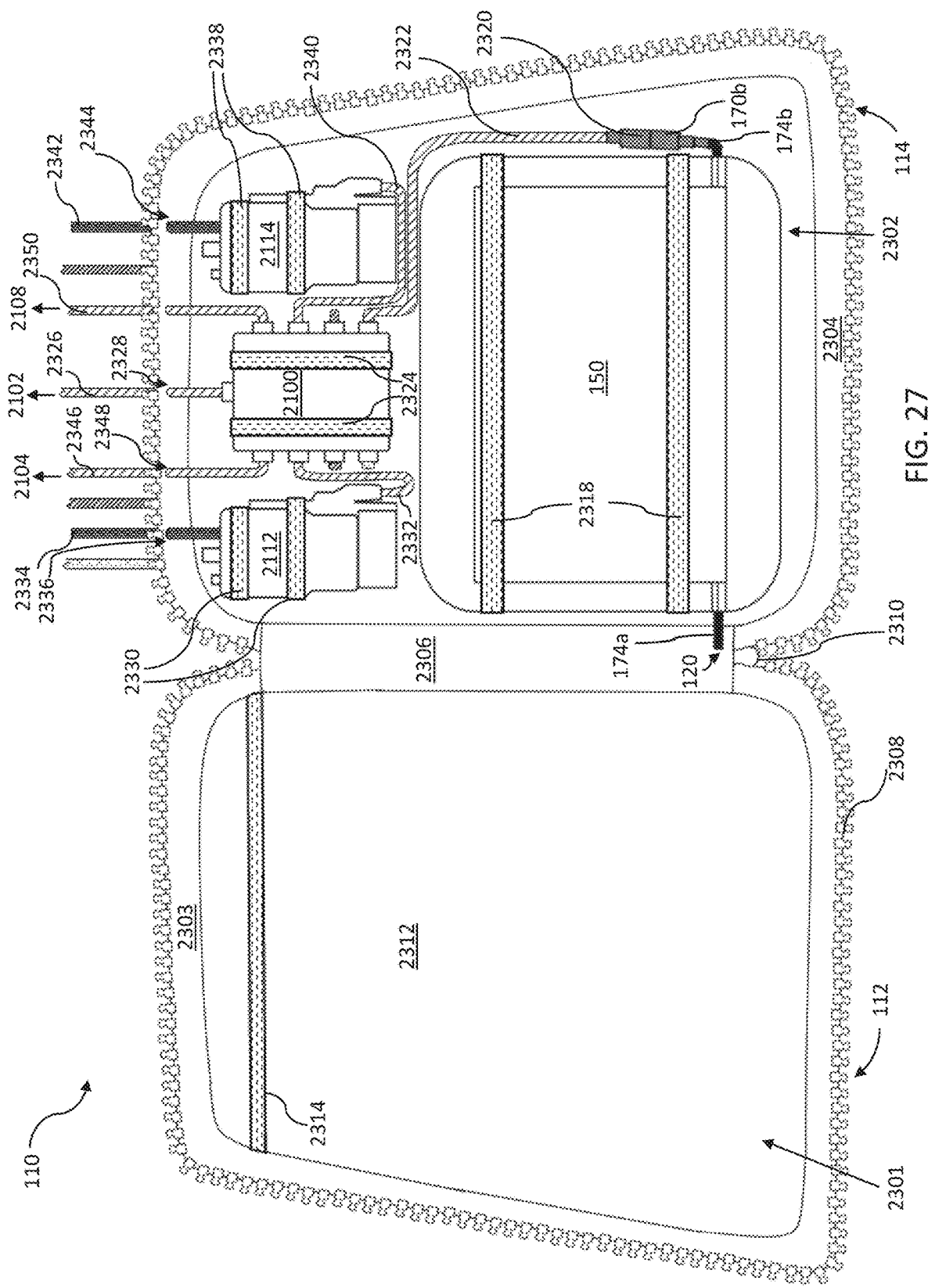
FIG. 27 illustrates an interior perspective view of an example of the portable battery pack that includes a battery and a power distribution and data hub enclosed by a wearable pouch or skin.

FIG. 27 illustrates an interior perspective view of an example of the portable battery pack that includes a battery 150 and a power distribution and data hub 2100 enclosed by a wearable pouch or skin. The first side 112 of the pouch 110 has an interior of the first side 2301. The second side 114 of the pouch 110 has an interior of the second side 2302. The first side 112 has a first side gusset 2303 and the second side 114 has a second side gusset 2304. The first side gusset 2303 and the second side gusset 2304 are attached at a top position of a fabric stop 2306 and a bottom position of the fabric stop 2306. A zipper 2308 with a zipper pull 2310 is attached to the first side gusset 2303 and the second side gusset 2304. Advantageously, this configuration allows the pouch 110 to lie flat when opened.

In a preferred embodiment, an interior of the pouch includes at least one integrated pocket. In the example shown in FIG. 27, the interior of the first side 2301 has an integrated pocket 2312. The integrated pocket 2312 is formed of polyester, polyvinyl chloride (PVC)-coated polyester, vinyl-coated polyester, nylon, canvas, PVC-coated canvas, polycotton canvas, and/or a mesh fabric. In a preferred embodiment, the integrated pocket 2312 is formed of a clear vinyl fabric. Advantageously, this allows a user to see the contents of the integrated pocket 2312. In one example, the user stores a map or instructions in the integrated pocket 2312. The integrated pocket 2312 closes using a piece of elastic 2314. Alternatively, the integrated pocket 2312 closes using a zipper, a hook and loop system, one or more buttons, one or more snaps, one or more ties, one or more buckles, one or more clips, and/or one or more hooks.

The interior of the second side 2302 holds a battery 150, a power distribution and data hub 2100, a first radio 2112, and a second radio 2114. In a preferred embodiment, the battery 150 is held in place by at least one strap 2318. The at least one strap 2318 is preferably made of an elastic material. Alternatively, the at least one strap 2318 is made of a non-elastic material. In other embodiments, the at least one strap 2318 includes hook-and-loop tape. A first spring 174a of a first lead (not shown) extends out of the pouch 110 through a lead opening 120. A second spring 174b surrounds wiring that is electrically connected to a connector portion 170b. The connector 170b is electrically connected to a mating connector 2320 that is attached to a battery cable 2322, which connects to the power distribution and data hub 2100.

In a preferred embodiment, the power distribution and data hub 2100 is held in place by at least one strap 2324. The at least one strap 2324 is preferably made of an elastic material. Alternatively, the at least one strap 2324 is made of a non-elastic material. In other embodiments, the at least one strap 2324 includes hook-and-loop tape.

The power distribution and data hub 2100 is connected to an end user device 2102 (e.g., tablet, smartphone, computer) via an end user device cable 2326. The end user device cable 2326 extends out of the pouch 110 through an end user device cable opening 2328.

The power distribution and data hub 2100 is connected to the first radio 2112 via a first radio cable 2332. The first radio 2112 is held in place by at least one strap 2330. The at least one strap 2330 is preferably made of an elastic material. Alternatively, the at least one strap 2330 is made of a non-elastic material. In other embodiments, the at least one strap 2330 includes hook-and-loop tape. In one embodiment, the first radio 2112 has an antenna 2334 that extends out of the pouch 110 through a first radio antenna opening 2336 in the second side gusset 2304. The power distribution and data hub 2100 is connected to the second radio 2114 via a second radio cable 2340. The second radio 2114 is held in place by at least one strap 2338. The at least one strap 2338 is preferably made of an elastic material. Alternatively, the at least one strap 2338 is made of a non-elastic material. In other embodiments, the at least one strap 2338 includes hook-and-loop tape. The second radio 2114 has an antenna 2342 that extends out of the pouch 110 through a second radio antenna opening 2344 in the second side gusset 2304.

Although FIG. 27 illustrates the power distribution and data hub 2100 in an orientation above the battery 150, it is equally possible for the battery 150 to be in an orientation above the power distribution and data hub 2100. In one embodiment, the orientation of the power distribution and data hub 2100 relative to the battery 150 is selected by the user based on multiple factors, including accessibility to equipment and weight distribution.

Figure 28:
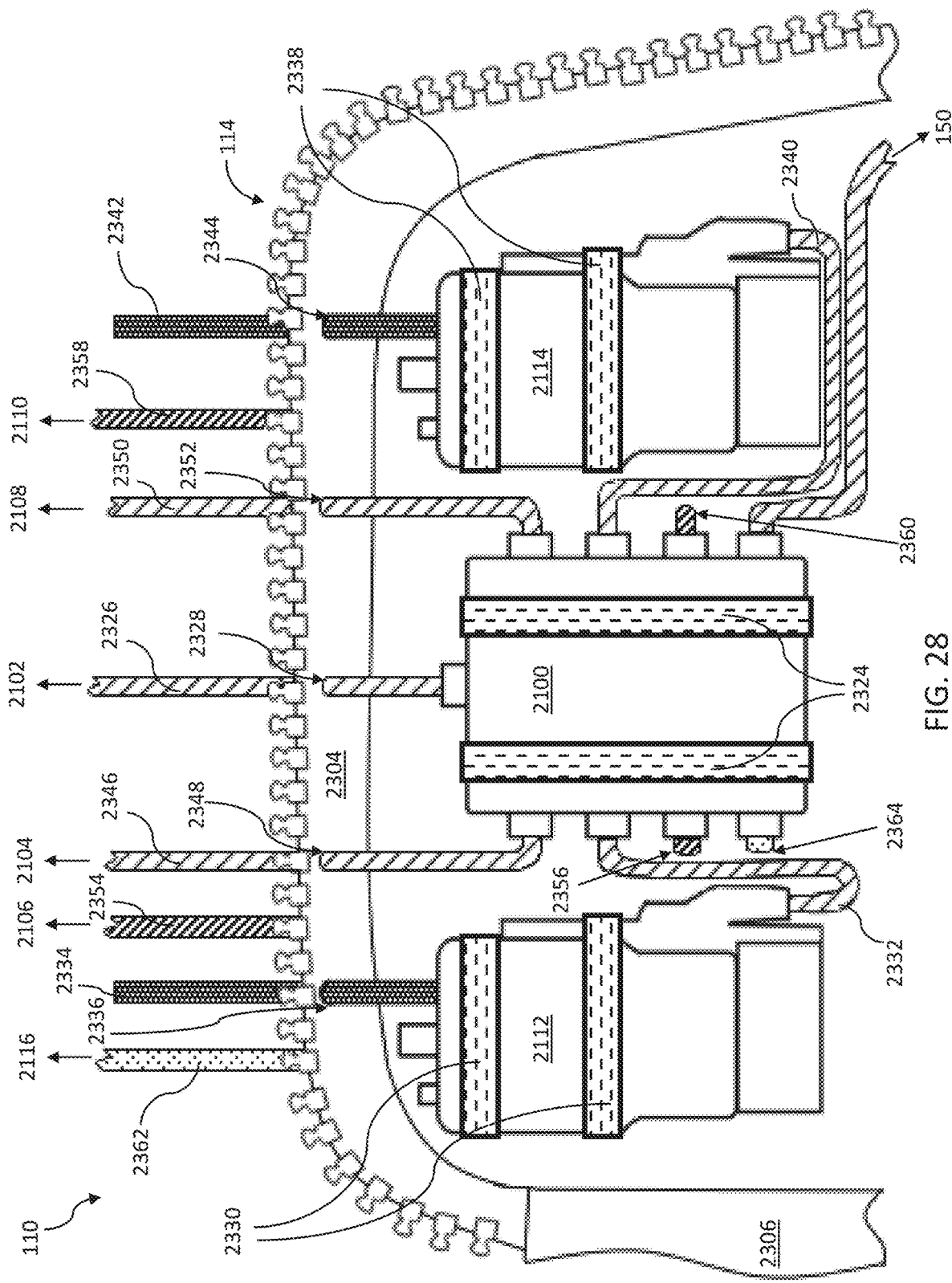
FIG. 28 is a detail view of the interior perspective view of the example of the portable battery pack shown in FIG. 27.

FIG. 28 is a detail view of the interior perspective view of the example of the portable battery pack shown in FIG. 27. The power distribution and data hub 2100 is operable to provide power to a first peripheral device 2104, a second peripheral device 2106, a third peripheral device 2108, and a fourth peripheral device 2110 through a personal area network (PAN). The power distribution and data hub 2100 is connected to the first peripheral device 2104 via a first peripheral device cable 2346. The first peripheral device cable 2346 extends out of the pouch 110 through a first peripheral device cable opening 2348 in the second side gusset 2304. Alternatively, the first peripheral device cable 2346 extends out of the pouch 110 through an opening in the second side 114 of the pouch 110. The power distribution and data hub 2100 is connected to the second peripheral device 2106 via a second peripheral device cable 2354. The second peripheral device cable 2354 extends out of the pouch 110 through a second peripheral device cable opening 2356 in the second side 114 of the pouch 110. Alternatively, the second peripheral device cable 2354 extends out of the pouch 110 through an opening in the second side gusset 2304. The power distribution and data hub 2100 is connected to the third peripheral device 2108 via a third peripheral device cable 2350. The third peripheral device cable 2350 extends out of the pouch 110 through a third peripheral device cable opening 2352 in the second side gusset 2304. Alternatively, the third peripheral device cable 2350 extends out of the pouch 110 through an opening in the second side 114 of the pouch 110. The power distribution and data hub 2100 is connected to the fourth peripheral device 2110 via a fourth peripheral device cable 2358. The fourth peripheral device cable 2358 extends out of the pouch 110 through a fourth peripheral device cable opening 2360 in the second side 114 of the pouch 110. Alternatively, the fourth peripheral device cable 2358 extends out of the pouch 110 through an opening in the second side gusset 2304. In other embodiments, at least one of the first peripheral device 2104, the second peripheral device 2106, the third peripheral device 2108, and/or the fourth peripheral device 2110 is stored in the pouch 110.

The power distribution and data hub 2100 is operable to obtain power from an auxiliary power source 2116. The power distribution and data hub 2100 is connected to the auxiliary power source 2116 via an auxiliary power source cable 2364. The auxiliary power source cable 2364 extends out of the pouch 110 through an auxiliary power source cable opening 2364 in the second side gusset 2304. Alternatively, the auxiliary power source cable 2364 extends out of the pouch 110 through an opening in the second side 114 of the pouch 110. In another embodiment, the auxiliary power source 2116 (e.g., a non-rechargeable battery) is stored in the pouch 110.

In one embodiment, the auxiliary power source 2116 is an alternating current (AC) adapter, a solar panel, a generator, a portable power case, a fuel cell, a vehicle battery, a rechargeable battery, and/or a non-rechargeable battery. Alternatively, the auxiliary power source 2116 is an inductive charger. In another embodiment, the auxiliary power source 2116 is operable to supply power to the power distribution and data hub 2100 by harvesting ambient radiofrequency (RF) waves, capturing exothermic body reactions (e.g., heat, sweat), using friction (e.g., triboelectric effect) or kinetic energy, or harvesting energy from running water or wind energy. In yet another embodiment, the auxiliary power source 2116 is a pedal power generator. The auxiliary power source 2116 is preferably operable to recharge the battery 150.

Figure 29A:
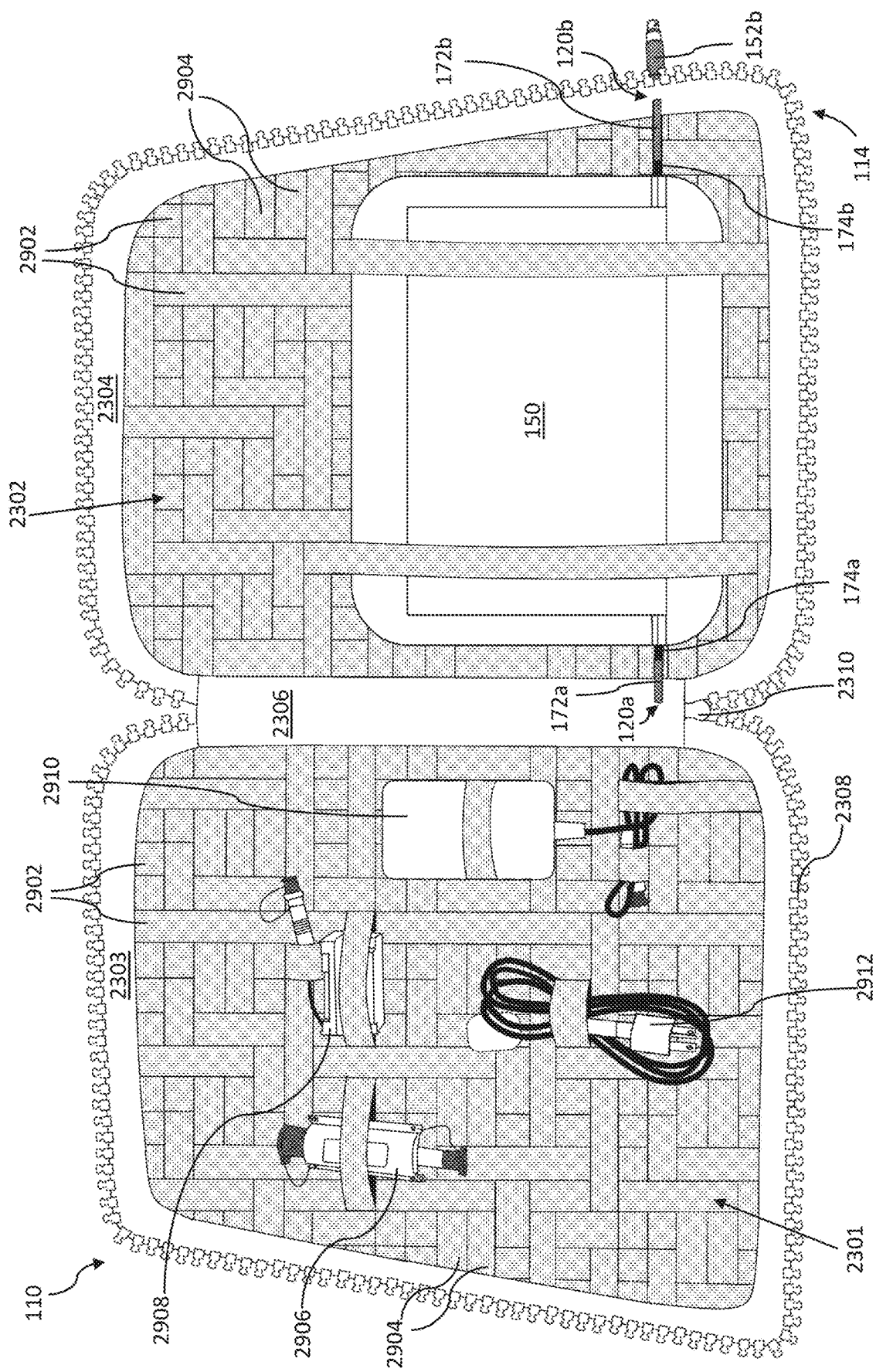
FIG. 29A illustrates an interior perspective view of an example of the portable battery pack that includes an object retention system in the wearable pouch or skin.

FIG. 29A illustrates an interior perspective view of an example of the portable battery pack that includes an object retention system in the wearable pouch or skin. The pouch 110 has an interior of a first side 2301 and an interior of a second side 2302. In a preferred embodiment, the interior of the first side 2301 and/or the interior of the second side 2302 contains an object retention system (e.g., GRID-IT® by Cocoon Innovations) as described in U.S. Publication Nos. 20090039122, 20130214119, and 20130256498, each of which is incorporated herein by reference in its entirety.

The object retention system is formed of a weave of a plurality of rubberized elastic bands. The plurality of rubberized elastic bands is preferably formed of a first set of straps 2902 and a second set of straps 2904. The first set of straps 2902 is preferably oriented substantially perpendicular to the second set of straps 2904. Additionally, each strap in the first set of straps 2902 is preferably oriented substantially parallel to other straps in the first set of straps 2902. Further, each strap in the second set of straps 2904 is preferably oriented substantially parallel to other straps in the second set of straps 2904. In the example shown in FIG. 29A, the first set of straps 2902 is shown in a substantially vertical direction and the second set of straps 2904 is shown in a substantially horizontal direction.

In the example shown in FIG. 29A, the interior of the first side 2301 has an object retention system. The object retention system is shown holding a state of charge indicator 2906. An example of a state of charge indicator 2906 is disclosed in U.S. Publication Nos. 20170269162 and 20150198670, each of which is incorporated herein by reference in its entirety. The object retention system is also shown holding a universal DC power adaptor 2908. An example of a universal DC power adaptor 2908 is disclosed in U.S. Pat. No. 9,240,651, which is incorporated herein by reference in its entirety. The object retention system is shown holding a first half of an AC adapter 2910 and a second half of an AC adapter 2912.

The interior of the second side 2302 holds a battery 150. A first wiring portion 172a of a first lead (not shown) extends out of the pouch 110 through a first lead opening 120a. A second wiring portion 172b of a second lead 152b extends out of the pouch 110 through a second lead opening 120b. A first spring 174a is provided around the first wiring portion 172a, such that a portion of the first spring 174a is inside the battery cover and a portion of the first spring 174a is outside the battery cover. The presence of the first spring 174a around the first wiring portion 172a of the first lead (not shown) allows the first lead to be flexed in any direction for convenient connection to equipment from any angle. The presence of the first spring 174a around the first wiring portion 172a of the first lead also allows the first lead to be flexed repeatedly without breaking or failing. A second spring 174b is provided around the second wiring portion 172b, such that a portion of the second spring 174b is inside the battery cover and a portion of the second spring 174b is outside the battery cover. The presence of the second spring 174b around the second wiring portion 172b of the second lead 152b allows the second lead 152b to be flexed in any direction for convenient connection to equipment from any angle. The presence of the second spring 174b around the second wiring portion 172b of the second lead 152b also allows the second lead 152b to be flexed repeatedly without breaking or failing. In one example, the first spring 174a and/or the second spring 174b is a steel spring that is from about 0.25 inches to about 1.5 inches long.

Figure 29B:
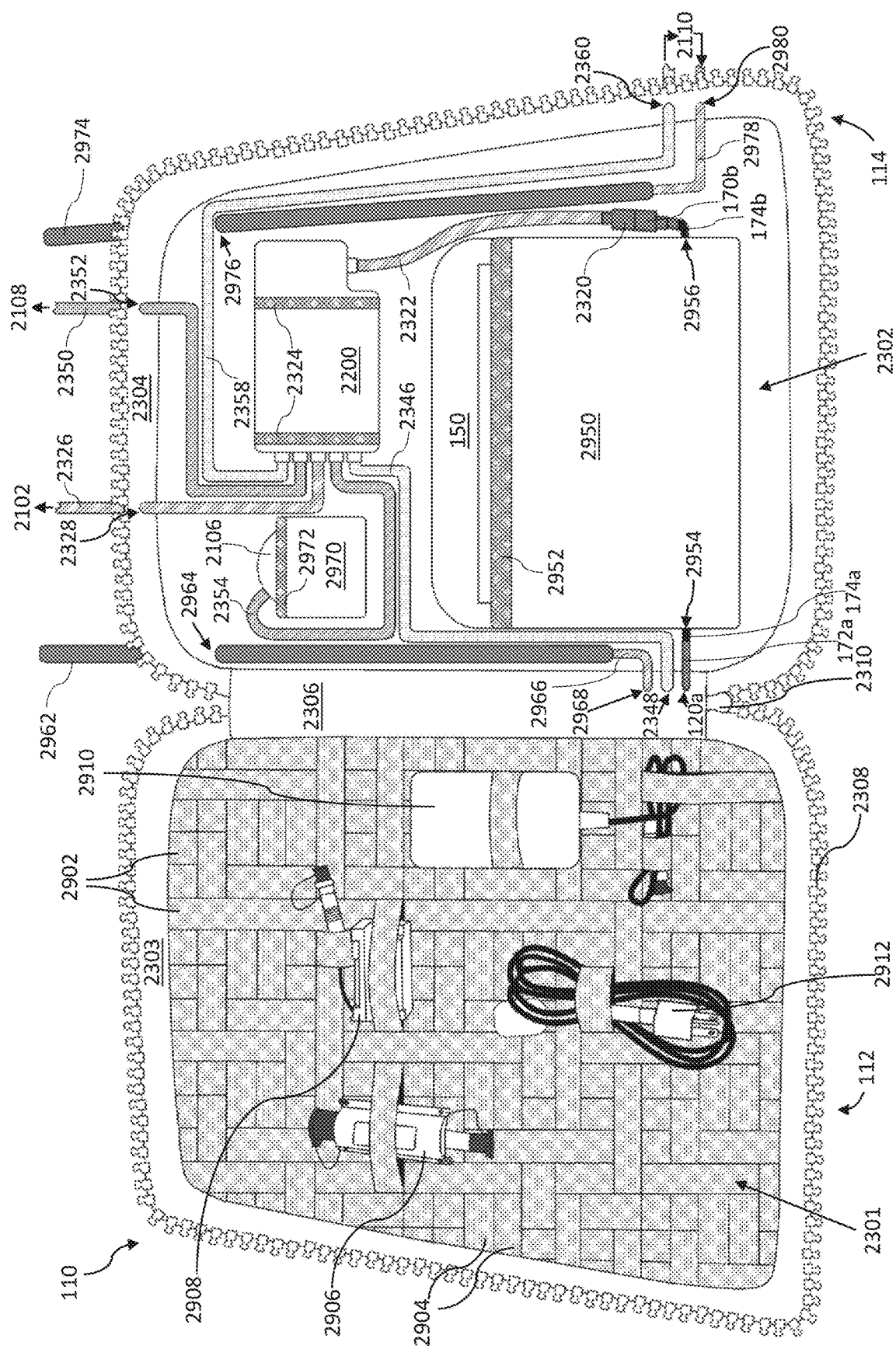
FIG. 29B illustrates an interior perspective view of another example of the portable battery pack that includes an object retention system in the wearable pouch or skin.

FIG. 29B illustrates an interior perspective view of another example of the portable battery pack that includes an object retention system in the wearable pouch or skin. In the example shown in FIG. 29B, the interior of the second side 2302 holds a battery 150 and a power distribution and data hub 2200. In a preferred embodiment, the battery 150 is held in place by a battery pocket 2950. The battery pocket 2950 is formed of polyester, polyvinyl chloride (PVC)-coated polyester, vinyl-coated polyester, nylon, canvas, PVC-coated canvas, polycotton canvas, and/or a mesh fabric. In one embodiment, the battery pocket 2950 closes using a piece of elastic 2952. In another embodiment, the battery pocket 2950 includes at least one layer of a material for dissipating heat. Alternatively, the battery pocket 2950 closes using a zipper, a hook and loop system, one or more buttons, one or more snaps, one or more ties, one or more buckles, one or more clips, and/or one or more hooks. A first spring 174a of a first lead (not shown) extends out of the battery pocket 2950 through a first battery pocket opening 2954. A first wiring portion 172a of the first lead extends out of the pouch 110 through a first lead opening 120a. A second spring 174b of a second lead extends out of the battery pocket 2950 through a second battery pocket opening 2956. The second spring 174b surrounds wiring that is electrically connected to a connector portion 170b. The connector 170b is electrically connected to a mating connector 2320 that is attached to a battery cable 2322, which connects to the power distribution and data hub 2200.

In a preferred embodiment, the power distribution and data hub 2200 is held in place by at least one strap 2324. The at least one strap 2324 is preferably made of an elastic material. Alternatively, the at least one strap 2324 is made of a non-elastic material. In other embodiments, the at least one strap 2324 includes hook-and-loop tape. In another embodiment, the power distribution and data hub 2200 is held in place by a hub pocket. The hub pocket is formed of polyester, polyvinyl chloride (PVC)-coated polyester, vinyl-coated polyester, nylon, canvas, PVC-coated canvas, polycotton canvas, and/or a mesh fabric. In one embodiment, the hub pocket closes using a piece of elastic. In another embodiment, the hub pocket includes at least one layer of a material for dissipating heat.

The power distribution and data hub 2200 is connected to an end user device 2102 (e.g., tablet, smartphone, computer) via an end user device cable 2326. The end user device cable 2326 extends out of the pouch 110 through an end user device cable opening 2328.

The power distribution and data hub 2200 is connected to a first peripheral device via a first peripheral device cable 2346. The first peripheral device cable 2346 extends out of the pouch 110 through a first peripheral device cable opening 2348. Alternatively, the first peripheral device cable 2346 extends out of the pouch 110 through an opening in the second side 114 of the pouch 110. In the example shown in FIG. 29B, the first peripheral device is a first radio (not shown). The first radio is connected to a first antenna relocator 2962. The first antenna relocator 2962 extends out of the pouch 110 through a first antenna relocator opening 2964 in the second side 114 of the pouch 110. The first antenna relocator 2962 is connected to the first radio via a first antenna relocator cable 2966 that extends out of the pouch 110 through a first antenna relocator cable opening 2968.

The power distribution and data hub 2200 is connected to the second peripheral device 2106 via a second peripheral device cable 2354. In the example shown in FIG. 29B, the second peripheral device 2106 is a GPS device (e.g., GPS puck). The second peripheral device 2106 is held in place by a GPS device pocket 2970. The GPS device pocket 2970 is formed of polyester, polyvinyl chloride (PVC)-coated polyester, vinyl-coated polyester, nylon, canvas, PVC-coated canvas, polycotton canvas, and/or a mesh fabric. In one embodiment, the GPS device pocket 2970 closes using a piece of elastic 2972. Alternatively, the GPS device pocket 2970 closes using a zipper, a hook and loop system, one or more buttons, one or more snaps, one or more ties, one or more buckles, one or more clips, and/or one or more hooks. In another embodiment, the GPS device pocket 2970 includes at least one layer of a material for dissipating heat.

The power distribution and data hub 2200 is connected to the third peripheral device 2108 via a third peripheral device cable 2350. The third peripheral device cable 2350 extends out of the pouch 110 through a third peripheral device cable opening 2352 in the second side gusset 2304. Alternatively, the third peripheral device cable 2350 extends out of the pouch 110 through an opening in the second side 114 of the pouch 110.

The power distribution and data hub 2200 is connected to the fourth peripheral device 2110 via a fourth peripheral device cable 2358. The fourth peripheral device cable 2358 extends out of the pouch 110 through a fourth peripheral device cable opening 2360. Alternatively, the fourth peripheral device cable 2358 extends out of the pouch 110 through an opening in the second side 114 of the pouch 110. In the example shown in FIG. 29B, the fourth peripheral device 2110 is a second radio. The second radio is connected to a second antenna relocator 2974. The second antenna relocator 2974 extends out of the pouch 110 through a second antenna relocator opening 2976 in the second side 114 of the pouch 110. The second antenna relocator 2974 is connected to the second radio via a second antenna relocator cable 2978 that extends out of the pouch 110 through a second antenna relocator cable opening 2980.

Figure 30:
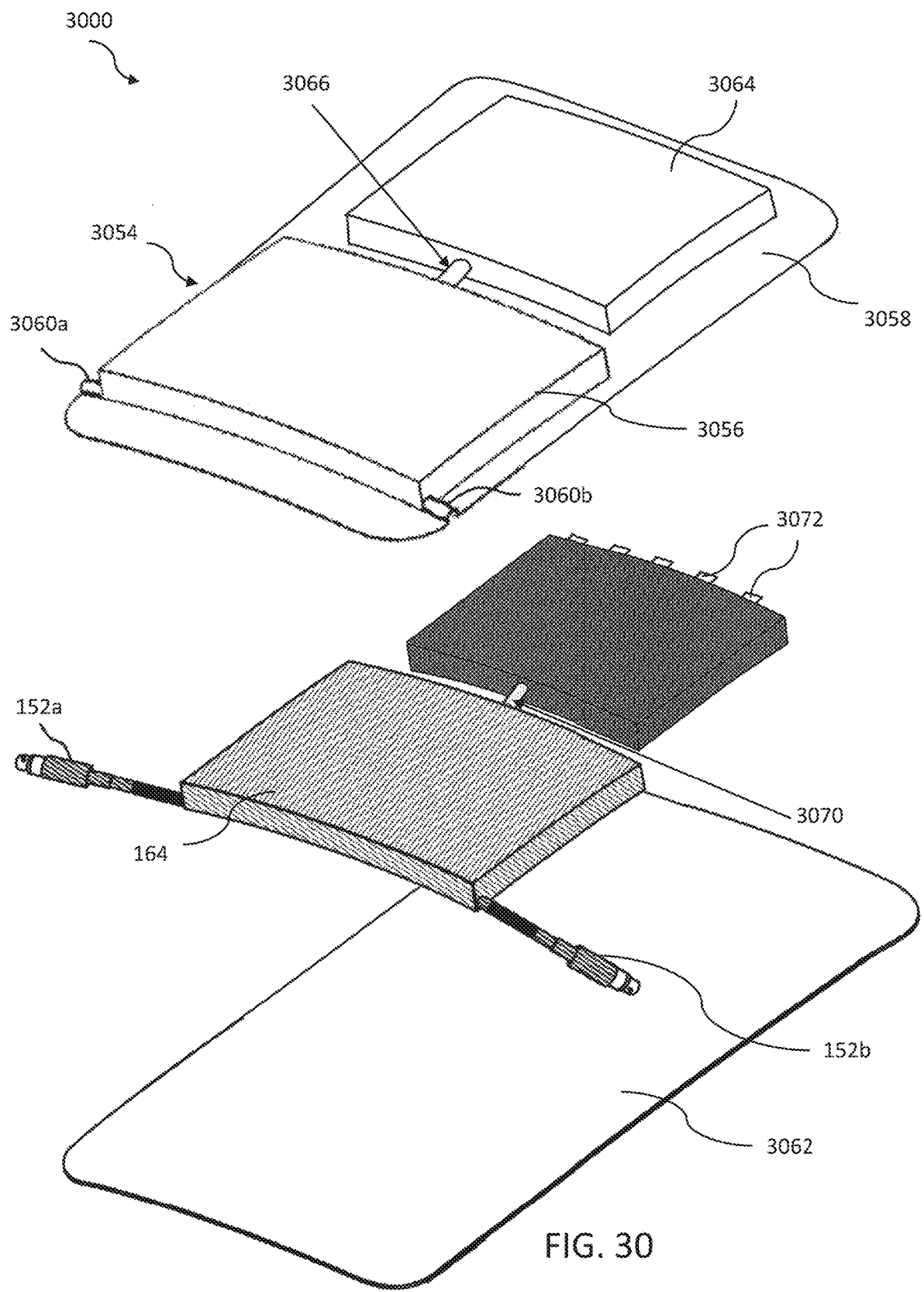
FIG. 30 is an exploded view of an example of a battery and a power distribution and data hub housed in the same enclosure.

FIG. 30 is an exploded view of an example of a battery and a power distribution and data hub housed in the same enclosure 3000. The enclosure 3000 includes a battery element 164 and a power distribution and data hub 3002 that is housed between a cover 3054 and a back plate 3062. The battery element 164 supplies the first lead 152a and the second lead 152b. The battery element 164 is formed of a plurality of sealed battery cells or individually contained battery cells, i.e. batteries with their own cases, removably disposed therein.

The power distribution and data hub 3002 is connected to the battery element 164 via a cable 3070. The power distribution and data hub 3002 includes at least one connector 3072. The at least one connector 3072 is panel mounted or an omnidirectional flexible lead (e.g., FIG. 16). In one embodiment, the at least one connector 3072 includes a dust cap (not shown) to cover a corresponding lead. Advantageously, the dust cap protects the at least one connector from dust and other environmental contaminants that may cause battery failure in the field.

The cover 3054 includes a battery compartment 3056 that is sized to receive at least one battery element 164. The cover 3054 includes a hub compartment 3064 that is sized to receive the power distribution and data hub 3002. In a preferred embodiment, the battery compartment 3056 is substantially rectangular in shape. In one embodiment, the hub compartment 3064 is substantially rectangular in shape. The battery compartment 3056 is connected to the hub compartment 3064 via a channel 3066 sized to receive the cable 3070. A top hat style rim 3058 is provided around a perimeter of the battery compartment 3056 and the hub compartment 3064. The cover 3054 includes at least one channel formed in the cover 3054 to accommodate a wire of a corresponding lead. The example in FIG. 30 shows two channels 3060 (e.g., channels 3060a, 3060b) formed in the cover 3054 (one on each side) to accommodate the wires of the first lead 152a and the second lead 152b passing therethrough. The cover 3054 includes at least one channel formed in the cover 3054 to accommodate the at least one connector 3072.

The cover 3054 and the back plate 3062 are formed of plastic using, for example, a thermoform process or an injection molding. The back plate 3062 can be mechanically attached to the rim 3058 of the cover 3054 via, for example, an ultrasonic spot welding process or an adhesive. Advantageously, the top hat style rim 3058 provides a footprint for the ultrasonic spot welding process and provides structural integrity for the battery and the power distribution and data hub housed in the same enclosure. In one embodiment, a water barrier material (e.g., silicone) is applied to the mating surfaces of the rim 3058 and the back plate 3062. In another embodiment, the cover 3054, the back plate 3062, the power distribution and data hub 3002, and/or the battery element 164 has a slight curvature or contour for conforming to, for example, the user's vest, backpack, or body armor. In one example, the curvature of the portable battery pack is engineered to match the outward curve of body armor. Advantageously, this means that the portable battery pack does not jostle as the operator moves, which results in less caloric energy expenditure when the operator moves. Alternatively, the cover 3054, the back plate 3062, the power distribution and data hub 3002, and/or the battery element 164 can have a slight outward curvature or contour for conforming to a user's body (e.g., back region, chest region, abdominal region, arm, leg). In yet another embodiment, the cover 3054, the back plate 3062, the power distribution and data hub 3002, and/or the battery element 164 can have a slight outward curvature or contour for conforming to a user's helmet or hat.

Figure 31:
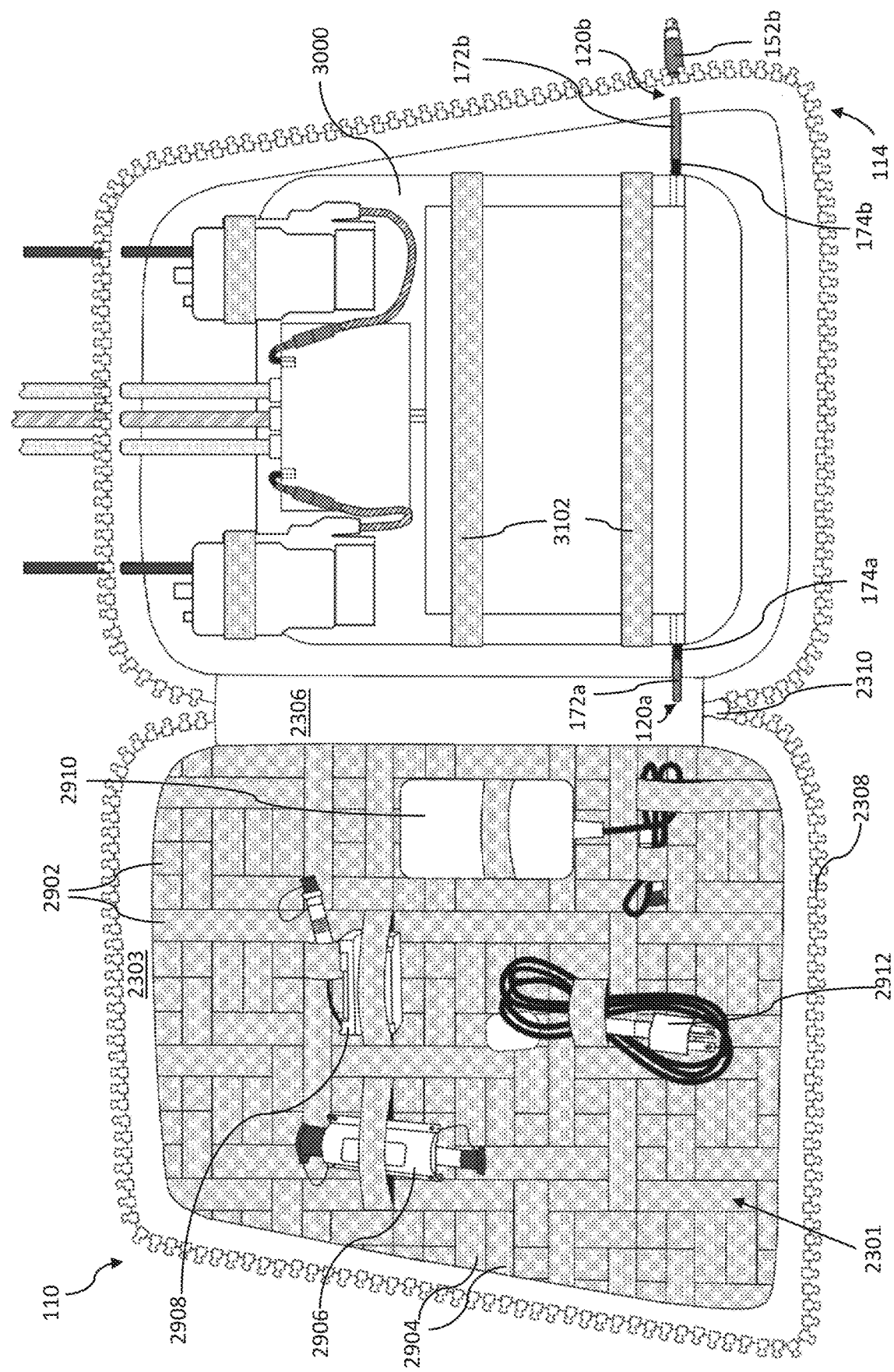
FIG. 31 illustrates an interior perspective view of an example of the portable battery pack that includes a battery and a power distribution and data hub housed in the same enclosure.

FIG. 31 illustrates an interior perspective view of an example of the portable battery pack that includes a battery and a power distribution and data hub housed in the same enclosure 3000. The first side 112 of the pouch 110 has an interior of the first side 2301. The second side 114 of the pouch 110 has an interior of the second side 2302. The first side 112 has a first side gusset 2303 and the second side 114 has a second side gusset 2304. The first side gusset 2303 and the second side gusset 2304 are attached at a top position of a fabric stop 2306 and a bottom position of the fabric stop 2306. A zipper 2308 with a zipper pull 2310 is attached to the first side gusset 2303 and the second side gusset 2304. Advantageously, this configuration allows the pouch 110 to lie flat when opened.

In the example shown in FIG. 31, the interior of the first side 2301 has an object retention system. The object retention system is shown holding a state of charge indicator 2906. An example of a state of charge indicator 2906 is disclosed in U.S. Publication Nos. 20170269162 and 20150198670, each of which is incorporated herein by reference in its entirety. The object retention system is also shown holding a universal DC power adaptor 2908. An example of a universal DC power adaptor 2908 is disclosed in U.S. Pat. No. 9,240,651, which is incorporated herein by reference in its entirety. The object retention system is shown holding a first half of an AC adapter 2910 and a second half of an AC adapter 2912.

The interior of the second side 2302 holds a battery and a power distribution and data hub housed in the same enclosure 3000. In a preferred embodiment, the battery and the power distribution and data hub housed in the same enclosure 3000 is held in place by at least one strap 3102. The at least one strap 3102 is preferably made of an elastic material. Alternatively, the at least one strap 3102 is made of a non-elastic material. In other embodiments, the at least one strap 3102 includes hook-and-loop tape.

A first wiring portion 172a of a first lead (not shown) extends out of the pouch 110 through a first lead opening 120a. A second wiring portion 172b of a second lead 152b extends out of the pouch 110 through a second lead opening 120b. A first spring 174a is provided around the first wiring portion 172a, such that a portion of the first spring 174a is inside the battery cover and a portion of the first spring 174a is outside the battery cover. The presence of the first spring 174a around the first wiring portion 172a of the first lead (not shown) allows the first lead to be flexed in any direction for convenient connection to equipment from any angle. The presence of the first spring 174a around the first wiring portion 172a of the first lead also allows the first lead to be flexed repeatedly without breaking or failing. A second spring 174b is provided around the second wiring portion 172b, such that a portion of the second spring 174b is inside the battery cover and a portion of the second spring 174b is outside the battery cover. The presence of the second spring 174b around the second wiring portion 172b of the second lead 152b allows the second lead 152b to be flexed in any direction for convenient connection to equipment from any angle. The presence of the second spring 174b around the second wiring portion 172b of the second lead 152b also allows the second lead 152b to be flexed repeatedly without breaking or failing. In one example, the first spring 174a and/or the second spring 174b is a steel spring that is from about 0.25 inches to about 1.5 inches long.

Figure 32:
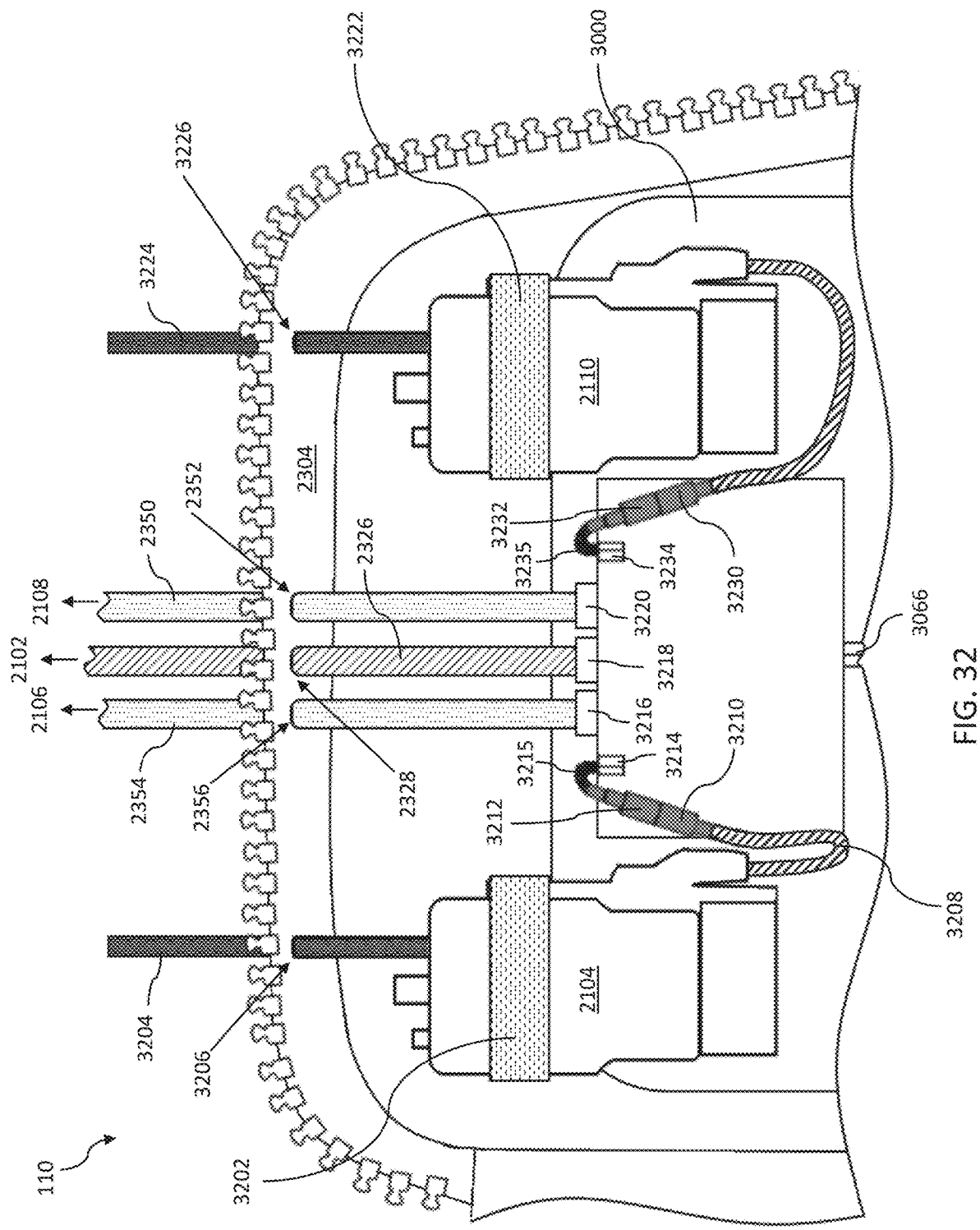
FIG. 32 is a detail view of the interior perspective view of the example of the portable battery pack shown in FIG. 31.

FIG. 32 is a detail view of the interior perspective view of the example of the portable battery pack shown in FIG. 31. As previously mentioned, the cover of the battery and the power distribution and data hub housed in the same enclosure 3000 includes a channel 3066 sized to receive a cable to connect the battery element and the power distribution and data hub. The power distribution and data hub of the battery and the power distribution and data hub housed in the same enclosure 3000 is connected to an end user device 2102 (e.g., tablet, smartphone, computer) via an end user device cable 2326 connected to a second panel mount connector 3218. The end user device cable 2326 extends out of the pouch 110 through an end user device cable opening 2328.

The power distribution and data hub of the battery and the power distribution and data hub housed in the same enclosure 3000 is operable to provide power to a first peripheral device 2104, a second peripheral device 2106, a third peripheral device 2108, and a fourth peripheral device 2110 through a personal area network (PAN). In the example shown in FIG. 32, the first peripheral device 2104 is a first radio. The first peripheral device 2104 is held in place by at least one strap 3202. The at least one strap 3202 is preferably made of an elastic material. Alternatively, the at least one strap 3202 is made of a non-elastic material. In other embodiments, the at least one strap 3202 includes hook-and-loop tape. In one embodiment, the first peripheral device 2104 has an antenna 3204 that extends out of the pouch 110 through a first antenna opening 3206 in the second side gusset 2304. The power distribution and data hub is connected to the first peripheral device 2104 via a first peripheral device cable 3208 with a connector 3210 that mates to a first flexible omnidirectional lead 3212 of the power distribution and data hub. The first flexible omnidirectional lead 3212 of the power distribution and data hub extends out of the cover of the battery and the power distribution and data hub housed in the same enclosure 3000 via a first channel 3214 in the cover.

A first spring 3215 is provided around the wiring portion of the first flexible omnidirectional lead 3212, such that a portion of the first spring 3215 is inside the cover of the battery and the power distribution and data hub housed in the same enclosure 3000 and a portion of the first spring 3215 is outside the cover of the battery and the power distribution and data hub housed in the same enclosure 3000. In one example, the first spring 3215 is a steel spring that is from about 0.25 inches to about 1.5 inches long. In another example, the first spring 3215 is a steel spring that is from about 0.25 inches to about 8 inches long. The wiring portion of the first flexible omnidirectional lead 3212 and the first spring 3215 are held securely in the first channel 3214 via a clamping mechanism. Alternatively, the wiring portion of the lead and the spring are held securely in the first channel using an adhesive, a retention pin, a hex nut, a hook anchor, and/or a zip tie. The presence of the first spring 3215 around the wiring portion of the first flexible omnidirectional lead 3212 allows the first flexible omnidirectional lead 3212 to be flexed in any direction for convenient connection to equipment from any angle. The presence of the first spring 3215 around the wiring portion of the first flexible omnidirectional lead 3212 also allows the first flexible omnidirectional lead 3212 to be flexed repeatedly without breaking or failing.

The power distribution and data hub is connected to the second peripheral device 2106 via a second peripheral device cable 2354 connected to a first panel mount connector 3216. The second peripheral device cable 2354 extends out of the pouch 110 through a second peripheral device cable opening 2356 in the second side gusset 2304. Alternatively, the second peripheral device cable 2354 extends out of the pouch 110 through an opening in the second side 114 of the pouch 110. The power distribution and data hub is connected to the third peripheral device 2108 via a third peripheral device cable 2350 connected to a third panel mount connector 3220. The third peripheral device cable 2350 extends out of the pouch 110 through a third peripheral device cable opening 2352 in the second side gusset 2304. Alternatively, the third peripheral device cable 2350 extends out of the pouch 110 through an opening in the second side 114 of the pouch 110.

In the example shown in FIG. 32, the fourth peripheral device 2110 is a second radio. The first peripheral device 2104 is held in place by at least one strap 3222. The at least one strap 3222 is preferably made of an elastic material. Alternatively, the at least one strap 3222 is made of a non-elastic material. In other embodiments, the at least one strap 3222 includes hook-and-loop tape. In one embodiment, the fourth peripheral device 2110 has an antenna 3224 that extends out of the pouch 110 through a second antenna opening 3226 in the second side gusset 2304. The power distribution and data hub is connected to the fourth peripheral device 2110 via a fourth peripheral device cable 3228 with a connector 3230 that mates to a second flexible omnidirectional lead 3232 of the power distribution and data hub. The second flexible omnidirectional lead 3232 of the power distribution and data hub extends out of the cover of the battery and the power distribution and data hub housed in the same enclosure 3000 via a second channel 3234 in the cover.

A second spring 3235 is provided around the wiring portion of the second flexible omnidirectional lead 3232, such that a portion of the second spring 3235 is inside the cover of the battery and the power distribution and data hub housed in the same enclosure 3000 and a portion of the second spring 3235 is outside the cover of the battery and the power distribution and data hub housed in the same enclosure 3000. In one example, the second spring 3235 is a steel spring that is from about 0.25 inches to about 1.5 inches long. In another example, the second spring 3235 is a steel spring that is from about 0.25 inches to about 8 inches long. The wiring portion of the second flexible omnidirectional lead 3232 and the second spring 3235 are held securely in the second channel 3234 via a clamping mechanism. Alternatively, the wiring portion of the lead and the spring are held securely in the first channel using an adhesive, a retention pin, a hex nut, a hook anchor, and/or a zip tie. The presence of the second spring 3235 around the wiring portion of the second flexible omnidirectional lead 3232 allows the second flexible omnidirectional lead 3232 to be flexed in any direction for convenient connection to equipment from any angle. The presence of the second spring 3235 around the wiring portion of the second flexible omnidirectional lead 3232 also allows the second flexible omnidirectional lead 3232 to be flexed repeatedly without breaking or failing.

As previously described, the power distribution and data hub includes at least one flexible omnidirectional lead in one embodiment. The flexible omnidirectional lead of the power distribution and data hub is preferably formed using a spring that is about 0.25 inches to about 8 inches long. In one embodiment, the spring of the power distribution and data hub extends out of the pouch through an opening in the second side gusset. In one embodiment, the opening includes a grommet. In another embodiment, the pouch has a seal around an opening for a corresponding lead of the power distribution and data hub. The seal is tight around the lead, which prevents water from entering the pouch through the opening. In one embodiment, the seal is formed of a rubber (e.g., neoprene).

In one embodiment, the power distribution and data hub includes at least one processor and at least one memory. Advantageously, this allows the power distribution and data hub to run software. In one embodiment, the end user device is a screen (e.g., touch screen). An additional advantage of running software off of the power distribution and data hub is that if the screen breaks, a user can leave the screen behind without a risk of confidential information being exposed. In another embodiment, the power distribution and data hub includes at least one data port. Advantageously, this allows the power distribution and data hub to receive information from another computing device (e.g., laptop, desktop computer).

In another embodiment, the power distribution and data hub includes at least one layer of a material to dissipate heat. In one embodiment, the at least one layer of a material to dissipate heat is housed within the power distribution and data hub. In one embodiment, at least one layer of a material to dissipate heat is housed within the power distribution and data hub on an external facing side. Advantageously, this protects the power distribution and data hub from external heat sources (e.g., a hot vehicle). In another embodiment, at least one layer of a material to dissipate heat is housed within the power distribution and data hub on a side of the power distribution and data hub facing the wearer. Advantageously, this protects the wearer from heat given off by the power distribution and data hub.

In yet another embodiment, the at least one layer of a material to dissipate heat is between the cover and the power distribution and data hub of the battery and the power distribution and data hub housed in the same enclosure. Advantageously, this protects the power distribution and data hub from external heat sources (e.g., a hot vehicle). In another embodiment, the at least one layer of a material to dissipate heat is between the back plate and the power distribution and data hub of the battery and the power distribution and data hub housed in the same enclosure. Advantageously, this protects the wearer from heat given off by the power distribution and data hub.

In one embodiment, the battery management system of the battery of the portable battery pack is housed in the power distribution and data hub. Advantageously, this separates heat generated by the battery management system from the plurality of electrochemical cells. In this embodiment, the power distribution and data hub preferably includes at least one layer of a material to dissipate heat. This embodiment may also provide additional benefits for distributing weight within the pouch.

In another embodiment, the power distribution and data hub includes a material to provide resistance to bullets, knives, shrapnel, and/or other projectiles. In one embodiment, the material to provide resistant to bullets, knives, shrapnel, and/or other projectiles is incorporated into a housing of the power distribution and data hub. In an alternative embodiment, the material to provide resistance to bullets, knives, shrapnel, and/or other projectiles is housed within the power distribution and data hub on an external facing side. Advantageously, this layer protects the electronics housed in the power distribution and data hub as well as the user. Additionally or alternatively, the material to provide resistance to bullets, knives, shrapnel, and/or other projectiles is housed within the power distribution and data hub on a side of the power distribution and data hub facing the wearer. Advantageously, this layer provides additional protection to the user. In another embodiment, the material to provide resistance to bullets, knives, shrapnel, and/or other projectiles is incorporated into the cover and/or back plate of the battery and the power distribution and data hub housed in the same enclosure.

Figure 33:
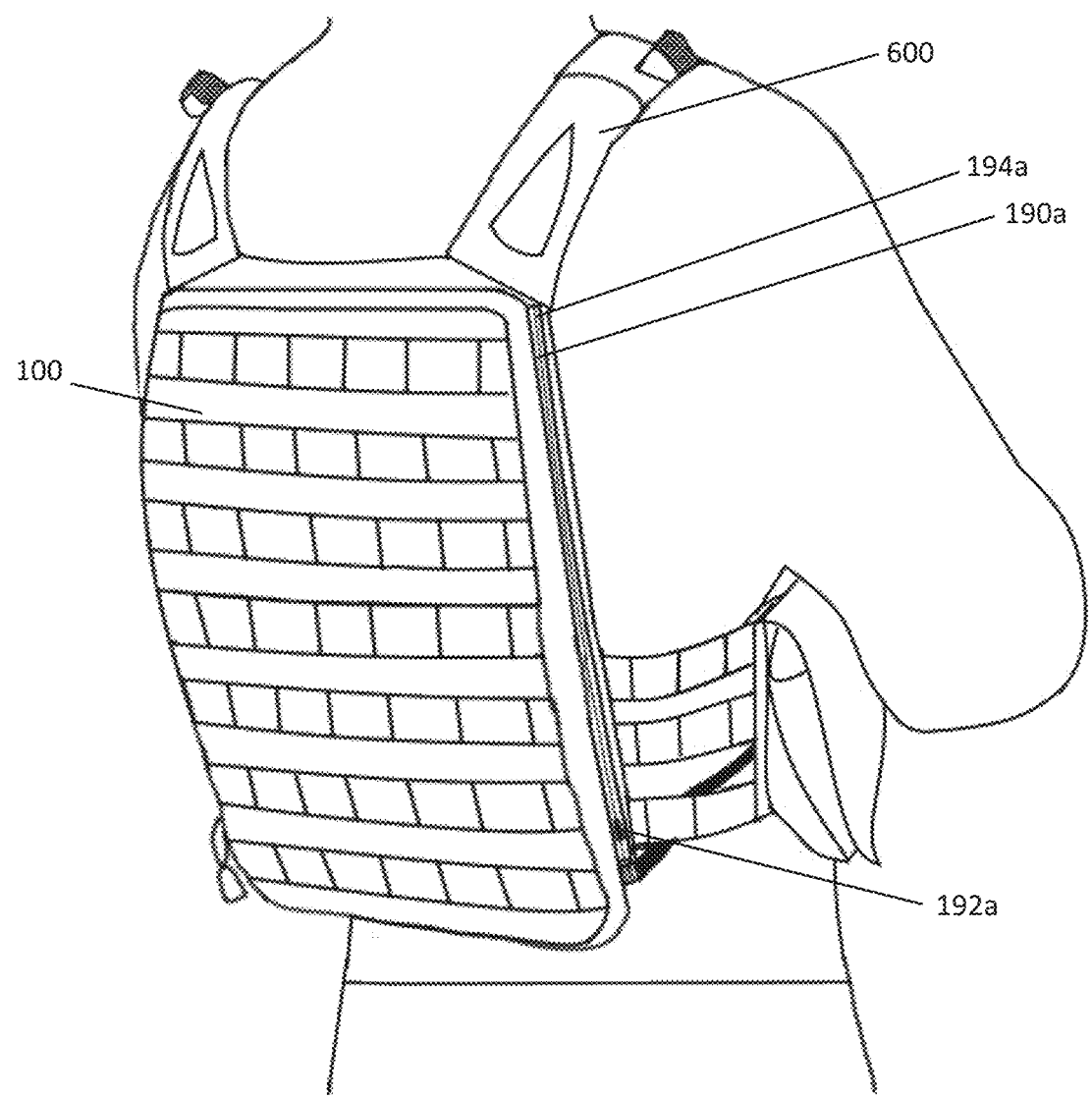
FIG. 33 illustrates a side perspective view of another example of a portable battery pack affixed to a vest using zippers.

FIG. 33 illustrates a side perspective view of another example of a portable battery pack 100 affixed to a vest 600 using zippers. In the example shown in FIG. 33, the pouch of the portable battery pack 100 is sized to hold the battery and additional devices or components. A first single width of zipper tape 190a is shown mated with a corresponding first single width of zipper tape 194a on a right side of the vest 600 using a first zipper slider 192a, thereby attaching the portable battery pack 100 to the vest 600. Similarly, a second single width of zipper tape (not shown) is mated with a corresponding second single width of zipper tape (not shown) on a left side of the vest 600 using a second zipper slider (not shown).

Solar Panel

Figure 34:
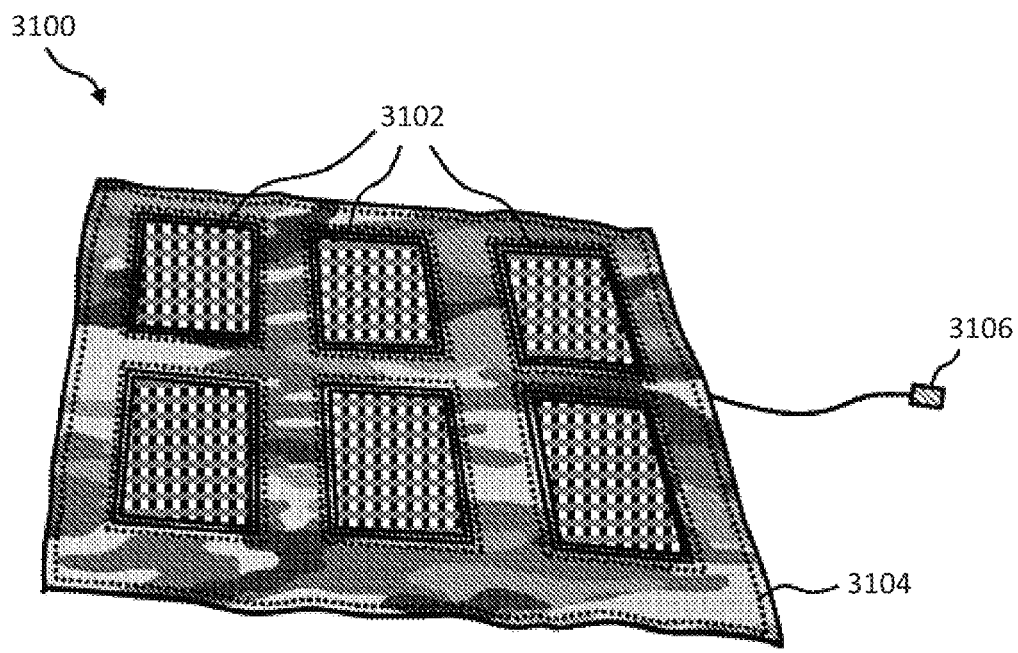
FIG. 34 illustrates a front view of one example of a solar panel.
Figure 35:
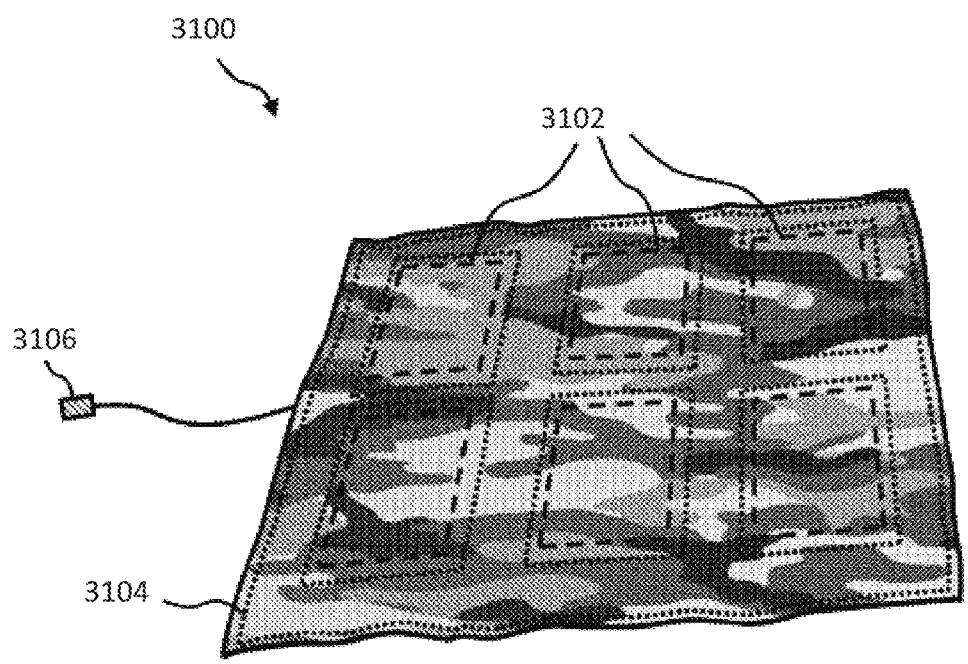
FIG. 35 illustrates a rear view of one example of a solar panel.

FIGS. 34-35 illustrate an example of a solar panel 3100. The solar panel 3100 is a multilayer structure that includes at least one solar module 3102 mounted on a substrate, wherein the substrate with the at least one solar module 3102 is sandwiched between two layers of fabric. In one embodiment, openings, e.g., windows, are formed in at least one of the two layers of fabric for exposing the at least one solar module 3102. In a preferred embodiment, the two layers of fabric are waterproof or water resistant. The outer two layers of fabric can be any color or pattern. In the example shown in FIG. 34 and FIG. 35, the outer two layers of fabric have a camouflage pattern thereon. Representative camouflages include, but are not limited to, Universal Camouflage Pattern (UCP), also known as ACUPAT or ARPAT or Army Combat Uniform; MULTICAM®, also known as Operation Enduring Freedom Camouflage Pattern (OCP); Universal Camouflage Pattern-Delta (UCP-Delta); Airman Battle Uniform (ABU); Navy Working Uniform (NWU), including variants, such as, blue-grey, desert (Type II), and woodland (Type III); MARPAT, also known as Marine Corps Combat Utility Uniform, including woodland, desert, and winter/snow variants; Disruptive Overwhite Snow Digital Camouflage, Urban Digital Camouflage, and Tactical Assault Camouflage (TACAM).

A hem 3104 is provided around a perimeter of the solar panel 3100 in one embodiment. The output of any arrangement of the at least solar module 3102 in the solar panel 3100 is a direct current (DC) voltage. Accordingly, the solar panel 3100 includes at least one output connector 3106 (e.g., male FISCHER® 105 A087 connectors, TAJIMI™ Electronics part number R04-P5m, FISCHER® LP360) that is wired to the arrangement of the at least one solar module 3102. The at least one output connector 3106 is used for connecting any type of DC load to the solar panel 3100. In one example, the solar panel 3100 is used for supplying power to a device, such as a DC-powered radio. In another example, the solar panel 3100 is used for charging a battery. In yet another example, the solar panel 3100 is used for charging the battery of a portable battery pack.

Figure 36:
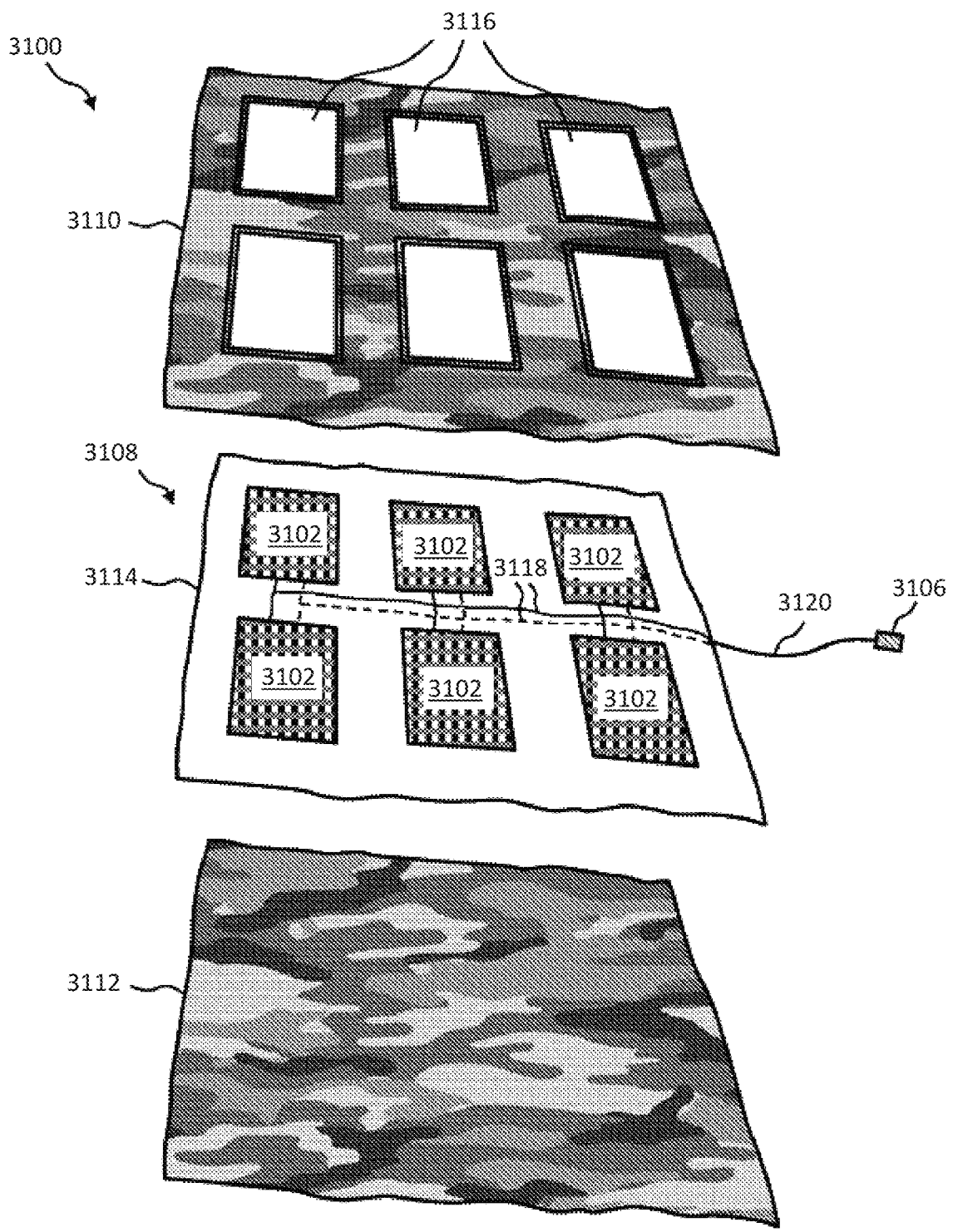
FIG. 36 illustrates an exploded view of one example of a solar panel.

FIG. 36 illustrates an exploded view of one example of the solar panel 3100, wherein the solar panel 3100 comprises a multilayer structure. Namely, the solar panel 3100 includes a solar panel assembly 3108 that is sandwiched between a first fabric layer 3110 and a second fabric layer 3112. The solar panel assembly 3108 of the solar panel 3100 includes the at least one solar module 3102 mounted on a substrate 3114. Materials for forming the at least one solar module 3102 include, but are not limited to, amorphous silicon, an anti-reflection coating, cadmium telluride (CdTe), a carbon fullerene, copper indium gallium (di)selenide (CIGS), copper phthalocyanine, copper zinc tin sulfide (CZTS), copper zinc tin selenide (CZTSe), copper zinc tin sulfide/selenide (CZTSSe), dye-sensitized solar cells (DSSCs), fullerene derivatives (e.g., phenyl-C61-butyric acid methyl ester (PCBM)), gallium arsenide (GaAs), gallium indium phosphide (GaInP), germanium, graphene, Gratzel cells, kesterite, lanthanide-doped materials (e.g., $Er^{3+}$, $Yb^{3+}$, $Ho^{3+}$), monocrystalline silicon, multicrystalline silicon, multijunction solar cells, organic solar cells, perovskite solar cells, polycrystalline silicon on glass, polymer solar cells, polyphenylene vinylene, quantum dot solar cells, silicon nitride, thin film solar cells, and/or titanium dioxide. In a preferred embodiment, the at least one solar module and/or the solar cells have camouflage, an image (e.g., logo), text, and/or other patterns printed on or within the at least one solar module and/or the solar cells. In another embodiment, the solar panel includes at least one blocking diode and/or at least one bypass diode.

The size of the at least one solar module 3102 can be, for example, from about 1 inch to about 48 inches on a side. In one example, the at least one solar module 3102 is about 3 inches by about 6 inches. In another example, the at least one solar module 3102 is about 4 inches by about 8 inches.

In a preferred embodiment, the first fabric layer 3110, the solar panel assembly 3108, and the second fabric layer 3112 are intimately adhered together using a hook-and-loop system and/or stitching. In one embodiment, stitching passes through all of the layers of the solar panel 3100 (i.e., through the first fabric layer 3110, the substrate 3114, and the second fabric layer 3112). In another embodiment, a hook-and-loop system is used to secure an edge of the first fabric layer 3110 around a corresponding edge of the at least one solar module 3102. In one embodiment, the substrate 3114 is secured to the second fabric layer 3112 using a hook-and-loop system and/or stitching. In yet another embodiment, the first fabric layer 3110, the solar panel assembly 3108, and the second fabric layer 3112 are intimately adhered together using an adhesive, a glue, or an epoxy. Advantageously, this increases the water resistance of the solar panel.

The first fabric layer 3110 and the second fabric layer 3112 can be formed of any flexible, durable, and waterproof or water-resistant material, such as but not limited to, polyester, PVC-coated polyester, vinyl-coated polyester, nylon, canvas, PVC-coated canvas, and polycotton canvas. The first fabric layer 3110 and the second fabric layer 3112 can be any color or pattern, such as the camouflage pattern shown in FIG. 36. Additionally, the first fabric layer 3110 and the second fabric layer 3112 can be the same color or pattern or can be different colors or patterns.

In a preferred embodiment, at least one window or opening 3116 is provided in the first fabric layer 3110 for exposing a face of the at least one solar module 3102. The size and position of the at least one window or opening 3116 in the first fabric layer 3110 substantially correspond to the size and position of the at least one solar module 3102 on the substrate 3114.

The substrate 3114 is preferably formed of a material that is lightweight, flexible (i.e., foldable or rollable), and waterproof or water resistant. In one embodiment, the substrate 3114 is formed of polyethylene, for example, a flashspun high-density polyethylene such as DUPONT™ TYVEK® material. A flashspun high-density polyethylene substrate is flexible, such that it can be folded and stowed for storage, and tear resistant. The solar modules 3102 can be mounted on the substrate 3114 using, for example, an adhesive, hook and loop tape, or rivets. When the solar panel 3100 is assembled, the solar panel assembly 3108 is substantially hidden from view between the first fabric layer 3110 and the second fabric layer 3112, except for the face of the at least one solar module 3102 showing through the at least one window or opening 3116.

Wherein flashspun high-density polyethylene is conventionally used as a vapor barrier material in weatherization systems in buildings, one aspect of the presently disclosed solar panel 3100 is the use of flashspun high-density polyethylene material as a substrate for electronics in a flexible panel. A pattern of wiring traces 3118 for electrically connecting any configuration of the at least one solar module 3102 is easily printed on the flashspun high-density polyethylene substrate using, for example, electrically conductive ink, while at the same time the flashspun high-density polyethylene substrate is flexible such that it can be folded and provides a layer of water barrier to protect the at least one solar module 3102.

One end of a cable or wire 3120 is electrically connected to the wiring traces 3118, while the at least one output connector 3106 is on an opposite end of the cable or wire 3120. The at least one output connector 3106 can be any type or style of connector needed to mate to the equipment to be used with the solar panel 3100. The solar panel assembly 3108 is not limited to one connector or to one type or style of connector. Examples of connectors used with the solar panel assembly 3108 include circular connectors, barrel connectors, Molex connectors, IEC connectors, fiber optic connectors, rectangular connectors, RF connectors, power connectors (e.g., NEMA sockets and/or plugs), USB, micro USB, mini USB, HDMI, firewire, and lightning. Additionally, a plurality of connectors (of the same type or different types) can be connected to the cable or wire 3120. In this way, the solar panel 3100 can be used to supply multiple devices at the same time, albeit the multiple devices must have substantially the same power requirements. For example, by providing a plurality of connectors, the solar panel 3100 can be used to charge multiple batteries at the same time or to power multiple pieces of equipment at the same time.

In one embodiment, a solar converter is placed on the at least one output cable to step up or step down the voltage of the solar panel. Advantageously, this allows the solar panel to charge batteries of different voltages. In a preferred embodiment, a battery includes an integrated battery management system that allows the battery to be charged by the solar panel without the use of a solar converter. Advantageously, this reduces the weight and complexity of the system for an end user.

In other embodiments, instead of printing the wiring traces on the substrate, a discrete flexible wiring harness (not shown) is provided for electrically connecting the at least one solar module and the at least one output connector. When the solar panel is assembled, the wiring harness is substantially hidden from view between the first fabric layer and the second fabric layer, except for the at least one output connector extending outward from one edge.

The solar panel 3100 is modular and configurable to provide any output voltage. While FIGS. 34-36 show six solar modules 3102 in the solar panel 3100, this is exemplary only. The solar panel 3100 can include any number of solar modules 3102 configured in series, configured in parallel, or configured in any combination of series and parallel arrangements. In particular, the configuration of the at least one solar module 3102 in the solar panel 3100 can be tailored in any way to provide a certain output voltage and current. More details of the solar panel 3100 are shown and described herein below with reference to FIGS. 37-39. Additionally, example configurations of the at least one solar module 3102 are shown and described herein below with reference to FIGS. 40-43.

In one embodiment, at least two solar modules of solar module are changed from working in parallel to working in series via a voltage sensing circuit. Alternatively, the at least two solar modules are wired to a connector that includes separate pins for parallel and series output. In one example, parallel output is wired to pins 1-2 of a 7-pin connector and series output is wired to pins 6-7 of the 7-pin connector. Advantageously, this allows the voltage output of the solar panel to be selected based on usage requirements.

Figure 37:
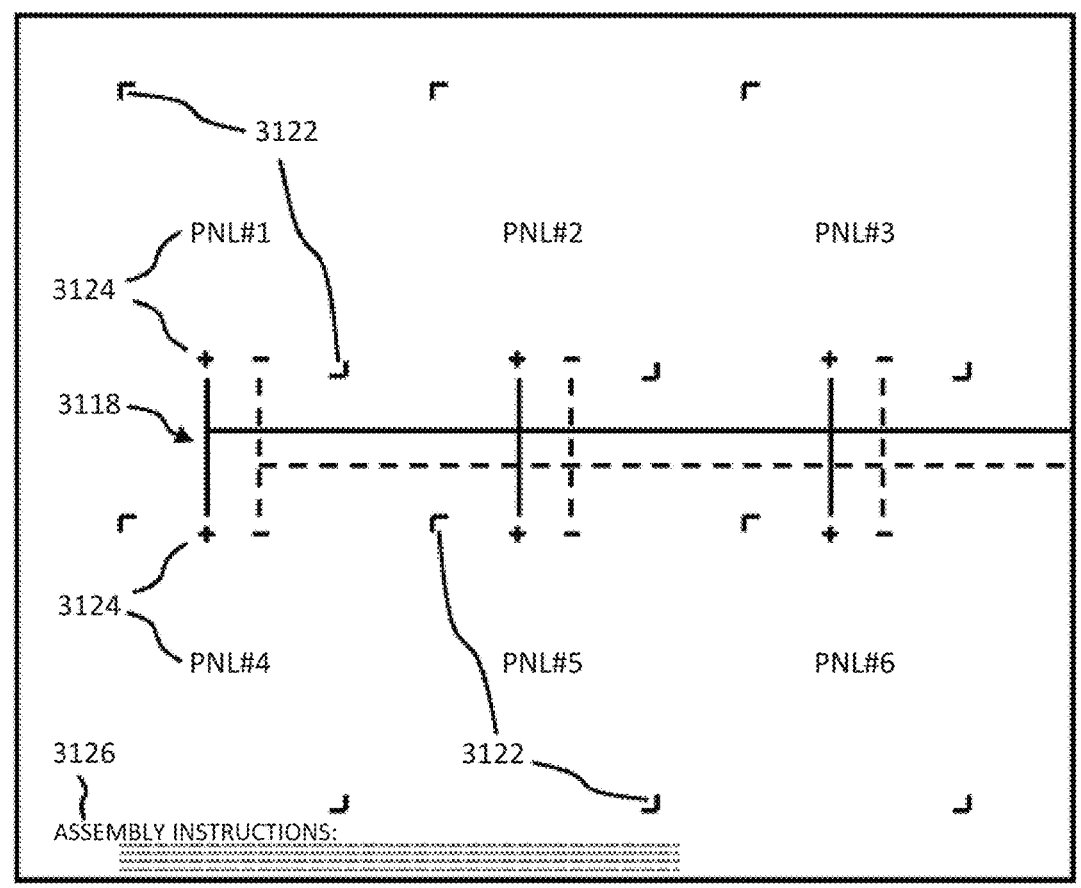
FIG. 37 illustrates a plan view of a substrate of one example of a solar panel.

In a preferred embodiment, the substrate of the solar panel is printable (e.g., DUPONT™ TYVEK®), allowing manufacturing assembly instructions and/or any other markings to be printed thereon for assisting the assembly of the solar modules on the substrate. For example, FIG. 37 illustrates a plan view of the substrate 3114 of the solar panel 3100. In this example, FIG. 37 shows wiring traces 3118 printed on the substrate 3114 using, for example, electrically conductive ink. FIG. 37 also shows a set of alignment features 3122 that mark the corners of each of the at least one solar module 3102. Additionally, each position of the at least one solar module 3102 may have certain text 3124 printed thereon, such as PNL #1, PNL #2, PNL #3, PNL #4, PNL #5, and PNL #6, and polarity indicators (+ and −). Further, step-by-step assembly instructions 3126 can be printed in any available space on the substrate 3114. The alignment features 3122, the text 3124, and the manufacturing assembly instructions 3126 can be printed using standard permanent ink. Standard printing processes can be used for both the electrically conductive ink and the permanent ink.

Figure 38A:
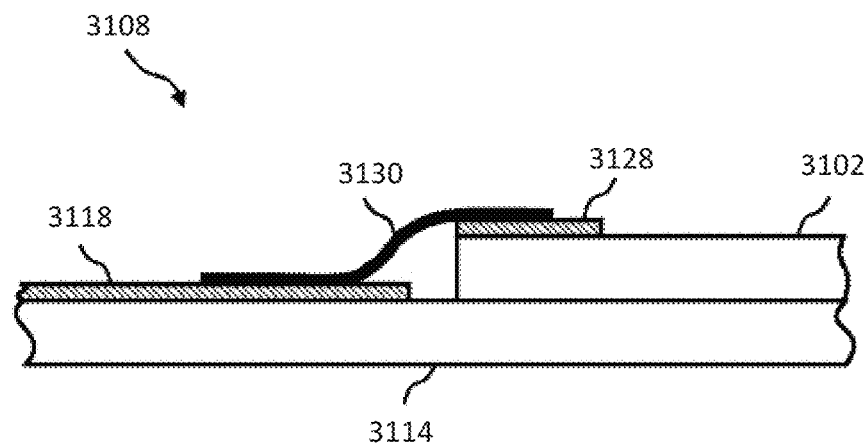
FIG. 38A illustrates a side view of a portion of the solar panel assembly, showing an example of electrically connecting the solar module to the substrate using a conductor.
Figure 38B:
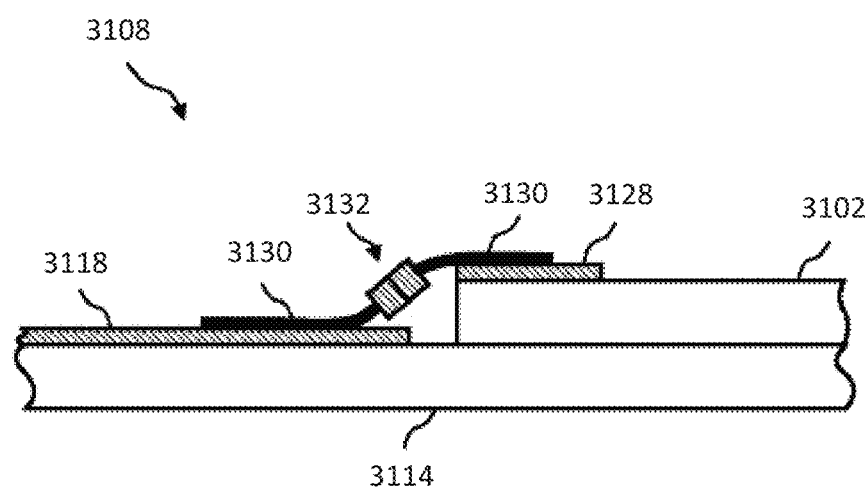
FIG. 38B illustrates a side view of a portion of the solar panel assembly, showing an example of electrically connecting the solar module to the substrate with a connector installed along the length of a conductor.

FIG. 38A and FIG. 38B illustrate side views of a portion of the solar panel assembly 3108, showing two example methods of electrically connecting a solar module 3102 to the substrate 3114. In one example, FIG. 38A shows an output pad 3128 of a solar module 3102 in close proximity to a wiring trace 3118 on the substrate 3114. A conductor 3130, such as a flexible conductor, is used to electrically connect the output pad 3128 of the solar module 3102 to the wiring trace 3118. For example, a first end of the conductor 3130 is soldered to the output pad 3128 of the solar module 3102 and a second end of the conductor 3130 opposite of the first end of the conductor 3130 is soldered to the wiring trace 3118. In this example, to replace the solar module 3102, the conductor 3130 is desoldered and removed, the solar module 3102 is removed from the substrate 3114, a replacement solar module is mounted on the substrate 3114, and the conductor 3130 is soldered to the output pad 3128 of the replacement solar module and the wiring trace 3118.

In another example, FIG. 38B shows a connector 3132 installed along the length of the conductor 3130. In this example, to replace the solar module 3102, the connector 3132 is disconnected, the solar module 3102 is removed from the substrate 3114, a replacement solar module is mounted on the substrate 3114, and the connector 3132 is reconnected. Advantageously, the connector method simplifies field repair of the solar panel.

Figure 39:
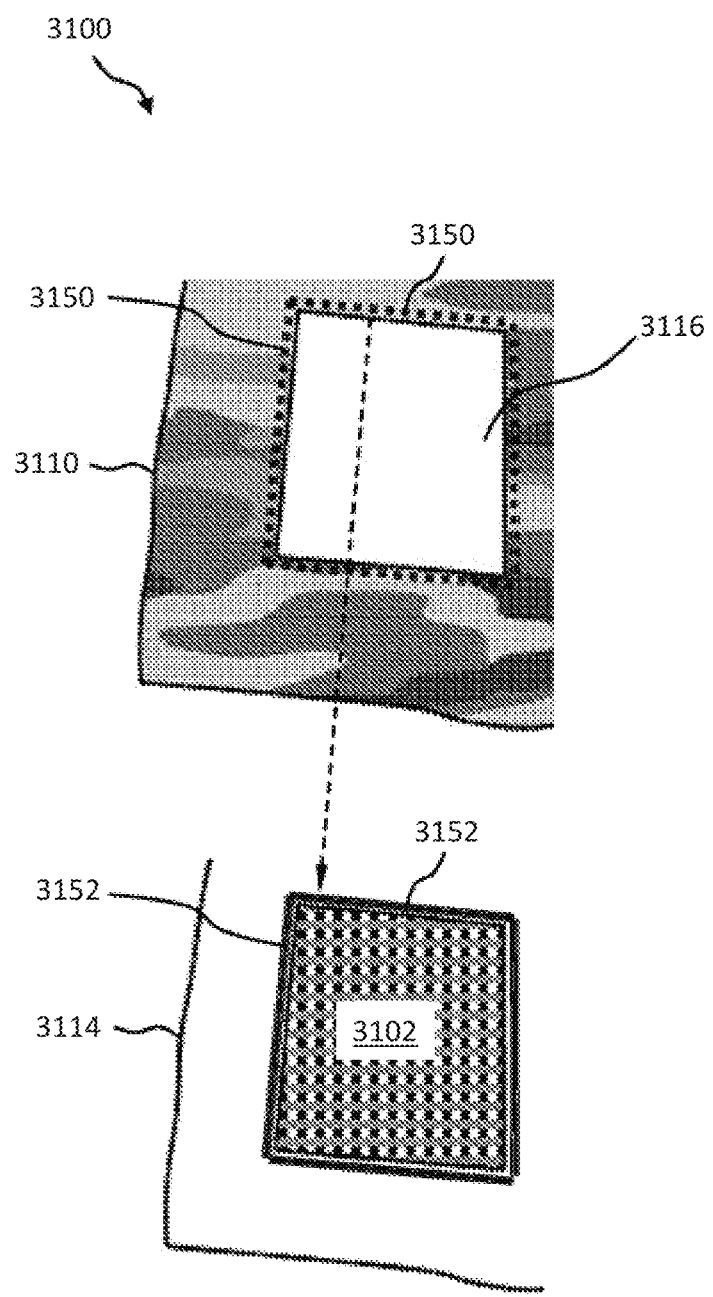
FIG. 39 illustrates a portion of one example of a solar panel, showing a hook-and-loop system for securing the edges of the fabric around the edges of the solar modules.
Figure 40:
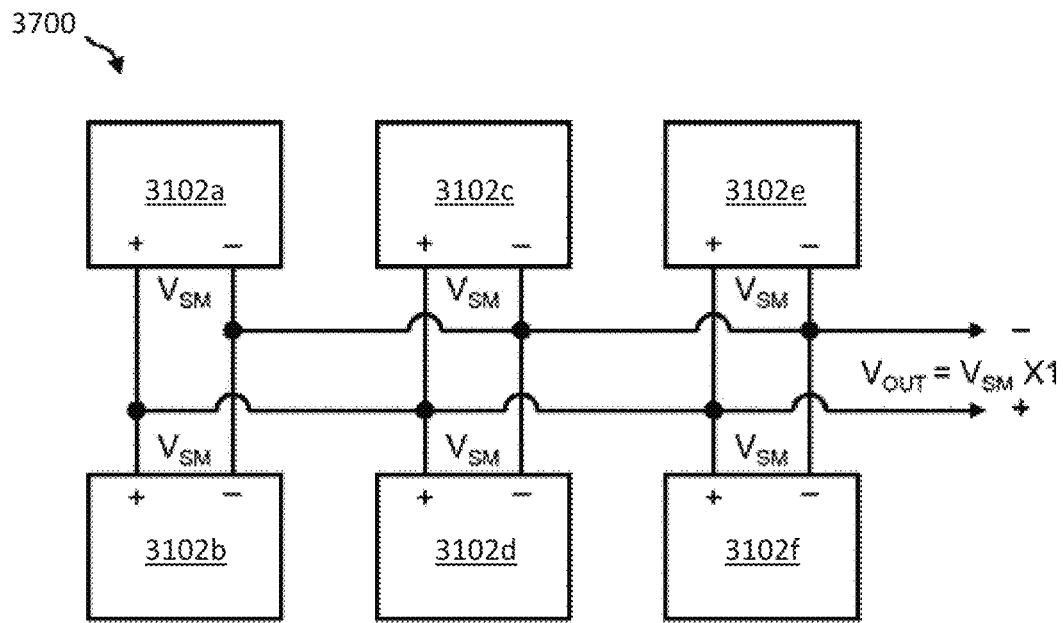
FIG. 40 shows a schematic view of an example configuration of the solar modules in the solar panel.
Figure 41:
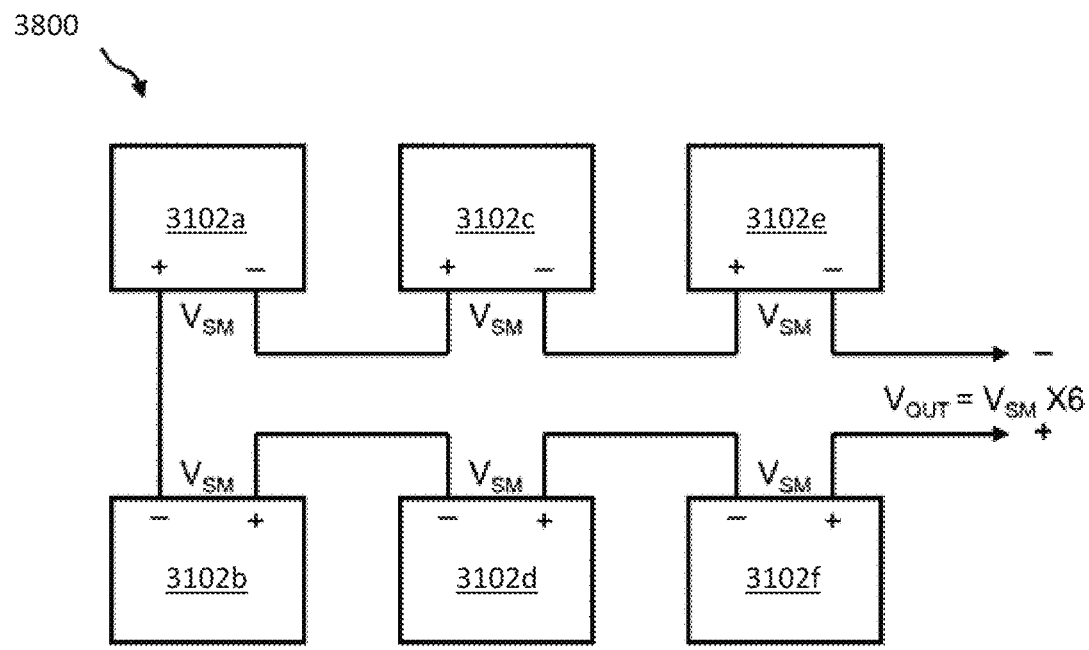
FIG. 41 shows a schematic view of another example configuration of the solar modules in the solar panel.
Figure 42:
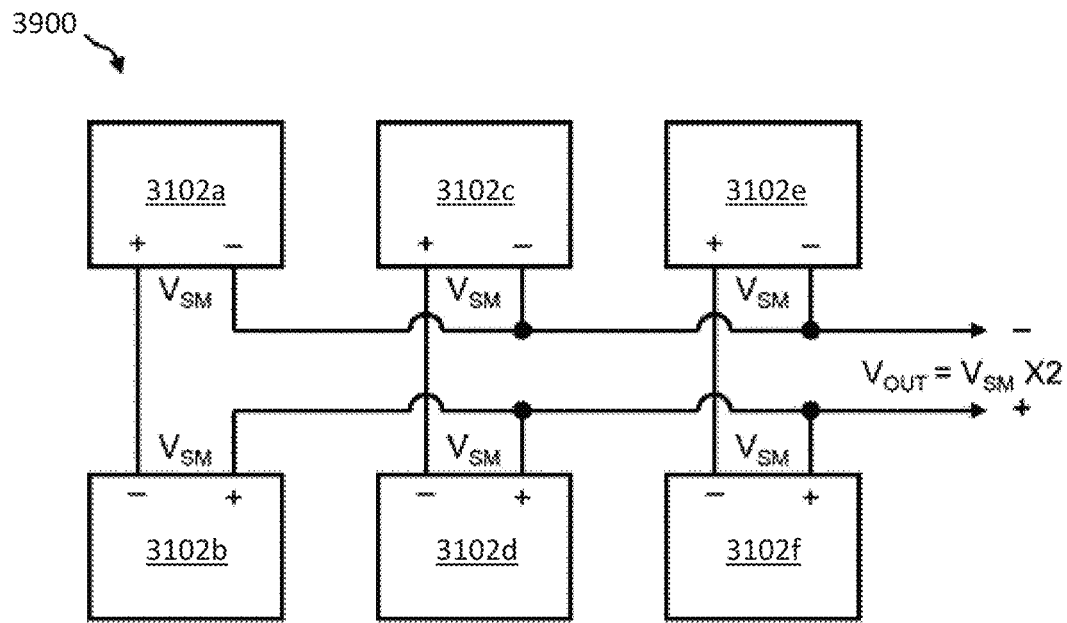
FIG. 42 shows a schematic view of yet another example configuration of the solar modules in the solar panel.
Figure 43:
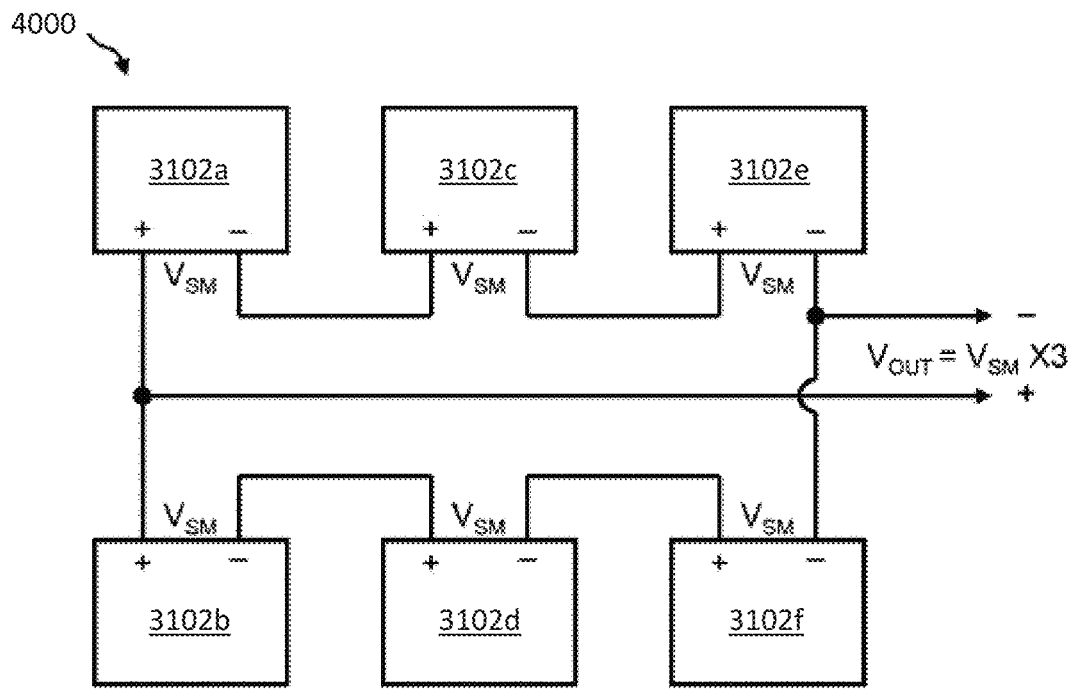
FIG. 43 shows a schematic view of still another example configuration of the solar modules in the solar panel.

FIG. 39 illustrates a portion of the solar panel 3100 showing a hook-and-loop system for securing at least one edge of the first fabric layer 3110 around at least one edge of the at least one solar module 3102. By way of example, FIG. 39 shows one window or opening 3116 in the first fabric layer 3110 and one solar module 3102 of the solar panel assembly 3108. An arrangement of hook strips 3150 is provided on the first fabric layer 3110 around the edges of the window or opening 3116 and an opposing arrangement of loop strips 3152 is provided on the substrate 3114 around the edges of solar module 3102. In another embodiment, the loop strips 3152 are on the first fabric layer 3110 and the hook strips 3150 are on the substrate 3114. The hook strips 3150 and the loop strips 3152 are, for example, components of a VELCRO® hook-and-loop fastening system.

In yet another embodiment, instead of using a hook-and-loop fastening system, stitching is provided around the windows or openings 3116, wherein the stitching passes through all of the layers of the solar panel 3100 (i.e., through the first fabric layer 3110, the substrate 3114, and the second fabric layer 3112). In this example, however, it must be ensured that the stitching not interfere with any wiring traces on the substrate 3114.

FIGS. 40-43 show schematic views of examples of configuring the at least one solar module 3102 in the solar panel 3100. Again, FIGS. 40-43 show six solar modules 3102, but this is exemplary only. The solar panel 3100 can include any number of solar modules 3102.

Namely, FIG. 40, FIG. 41, FIG. 42, and FIG. 43 show a first configuration 3700, a second configuration 3800, a third configuration 3900, and a fourth configuration 4000, respectively, wherein each of the configurations includes six solar modules 3102. Namely, the configurations 3700, 3800, 3900, and 4000 each include the solar modules 3102a, 3102b, 3102c, 3102d, 3102e, and 3102f. Additionally, each of the solar modules 3102a, 3102b, 3102c, 3102d, 3102e, and 3102f provides substantially the same output voltage ($V_{SM}$).

In the first configuration 3700, the solar modules 3102a, 3102b, 3102c, 3102d, 3102e, and 3102f are connected in parallel. Therefore, using the first configuration 3700, the output voltage ($V_{OUT}$) of the solar panel 3100 is $V_{SM} \times 1$. In one example, if $V_{SM}=3$ volts, then $V_{OUT}$ of the solar panel 3100=3 volts.

In the second configuration 3800, the solar modules 3102a, 3102b, 3102c, 3102d, 3102e, and 3102f are connected in series. Therefore, using the second configuration 3800, the output voltage ($V_{OUT}$) of the solar panel 3100 is $V_{SM} \times 6$. In one example, if $V_{SM}=3$ volts, then $V_{OUT}$ of the solar panel 3100=18 volts.

In the third configuration 3900, the solar modules 3102a and 3102b are connected in series, the solar modules 3102c and 3102d are connected in series, and the solar modules 3102e and 3102f are connected in series. Therefore, each series-connected pair of solar modules 3102 provides an output voltage of $V_{SM} \times 2$. Then, the three series-connected pairs of solar modules 3102 are connected in parallel with each other. Namely, the series-connected pair of solar modules 3102a and 3102b, the series-connected pair of solar modules 3102c and 3102d, and the series-connected pair of solar modules 3102e and 3102f are connected in parallel with each other. Therefore, using the third configuration 3900, the output voltage ($V_{OUT}$) of the solar panel 3100 is $V_{SM} \times 2$. In one example, if $V_{SM}=3$ volts, then $V_{OUT}$ of the solar panel 3100=6 volts.

In the fourth configuration 4000, the solar modules 3102a, 3102c, and 3102e are connected in series and the solar modules 3102b, 3102d, and 3102f are connected in series. Therefore, each series-connected arrangement of solar modules 3102 provides an output voltage of $V_{SM} \times 3$. Then, the two series-connected arrangements of solar modules 3102 are connected in parallel with each other. Namely, the series-connected arrangement of solar modules 3102a, 3102c, and 3102e and the series-connected arrangement of solar modules 3102b, 3102d, and 3102f are connected in parallel with each other. Therefore, using the fourth configuration 4000, the output voltage ($V_{OUT}$) of the solar panel 3100 is $V_{SM} \times 3$. In one example, if $V_{SM}=3$ volts, then $V_{OUT}$ of the solar panel 3100=9 volts.

In the event of failure of one or more solar modules 3102 in the solar panel 3100, one skilled in the art will recognize that parallel arrangements of the solar modules 3102 provide certain advantages over series arrangements of the solar modules 3102. For example, if one or more solar modules 3102 fail in the first configuration 3700 of FIG. 40, the output voltage ($V_{OUT}$) of the solar panel 3100 is not changed, albeit the current capacity is reduced. By contrast, if one solar module 3102 fails in the second configuration 3800 of FIG. 41, the output voltage ($V_{OUT}$) of the solar panel 3100 is reduced by an amount equal to the $V_{SM}$ of the failing solar module.

In one embodiment, at least one bypass diode is installed across at least one solar cell. The at least one bypass diode provides a current path around shaded cells to prevent the shaded cells from overheating or burning out. In one example, a solar module contains 36 solar cells and two bypass diodes.

Figure 44:
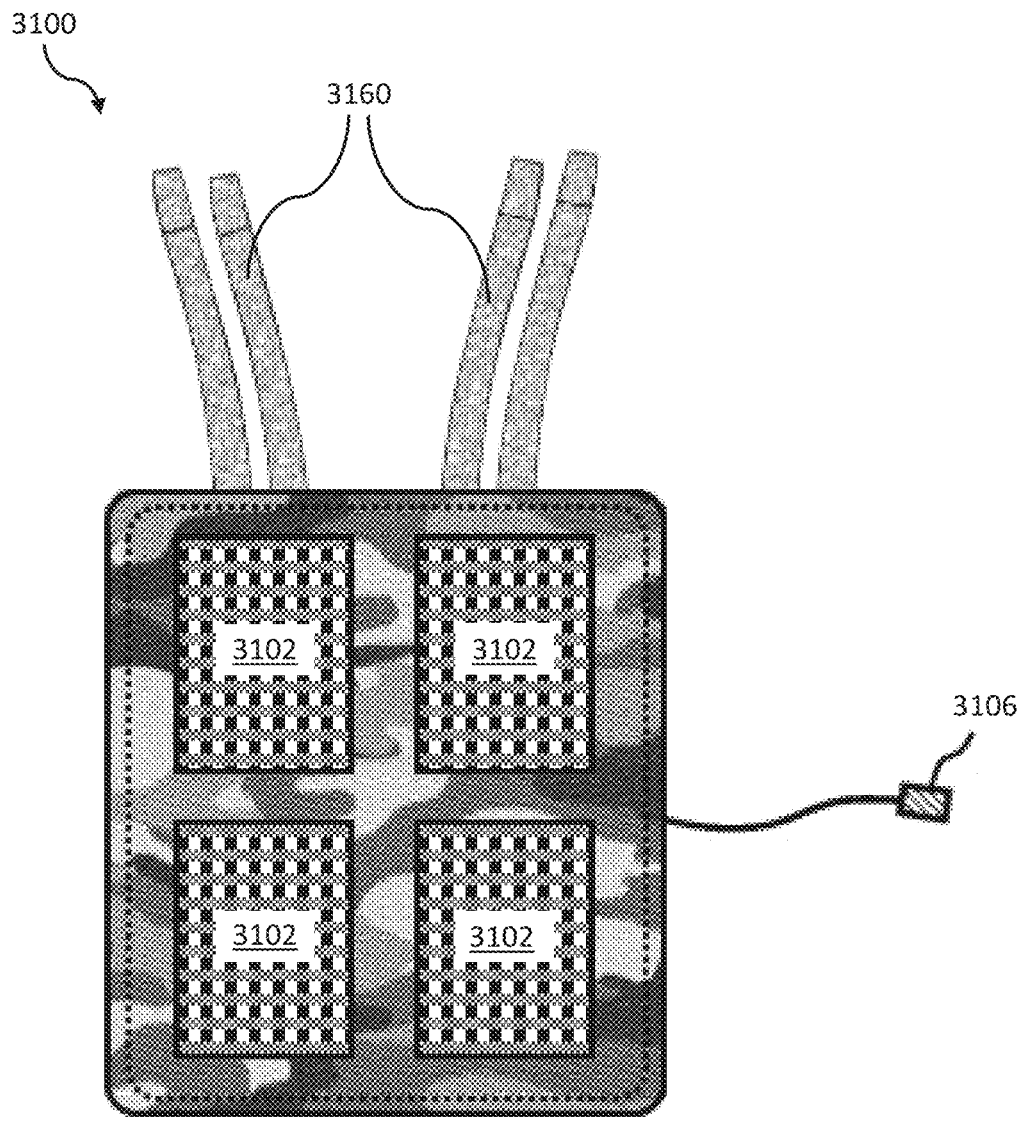
FIG. 44 illustrates a front perspective view of an example of a solar panel incorporating a pouch attachment ladder system.
Figure 45:
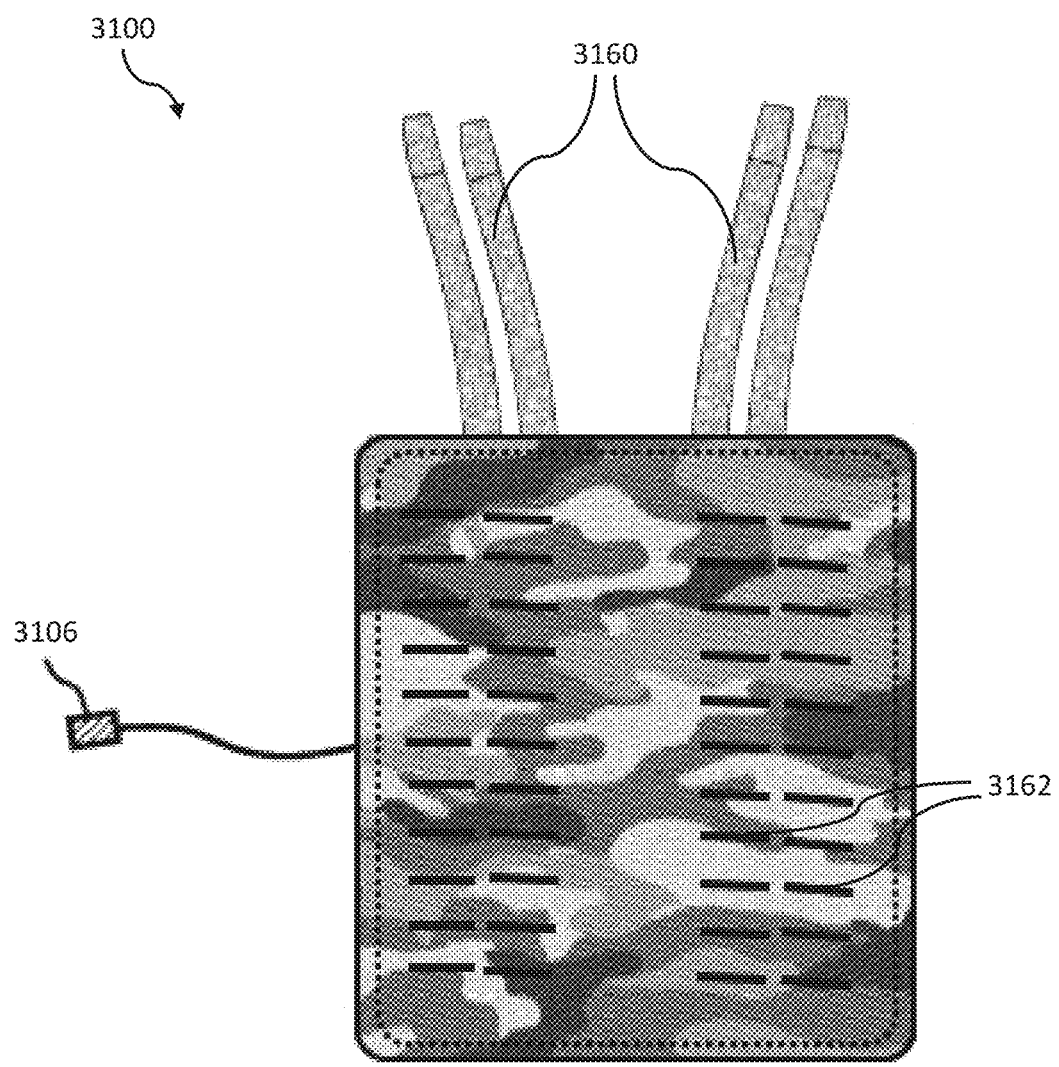
FIG. 45 illustrates a back perspective view of an example of a solar panel incorporating a pouch attachment ladder system.

In a preferred embodiment, the solar panel is MOLLE-compatible. In one embodiment, the solar panel incorporates a pouch attachment ladder system (PALS), which is a grid of webbing used to attach smaller equipment onto load-bearing platforms, such as vests and backpacks. For example, the PALS grid consists of horizontal rows of 1-inch (2.5 cm) webbing, spaced about one inch apart, and attached to the backing at 1.5-inch (3.8 cm) intervals. In one embodiment, the webbing is formed of nylon (e.g., cordura nylon webbing, MIL-W-43668 Type III nylon webbing). Accordingly, a set of straps 3160 (e.g., four straps 3160) are provided on one edge of the solar panel 3100 as shown in FIGS. 44-45. Additionally, rows of slots or slits 3162 (e.g., eleven rows of slots or slits 3162) are provided on the back side of the solar panel 3100, as shown in FIG. 45. In a preferred embodiment, the set of straps 3160 and the rows of slots or slits 3162 attach to the MOLLE underneath the solar panel 3100 on the load bearing equipment (e.g., vest, backpack, rucksack, body armor).

Figure 46:
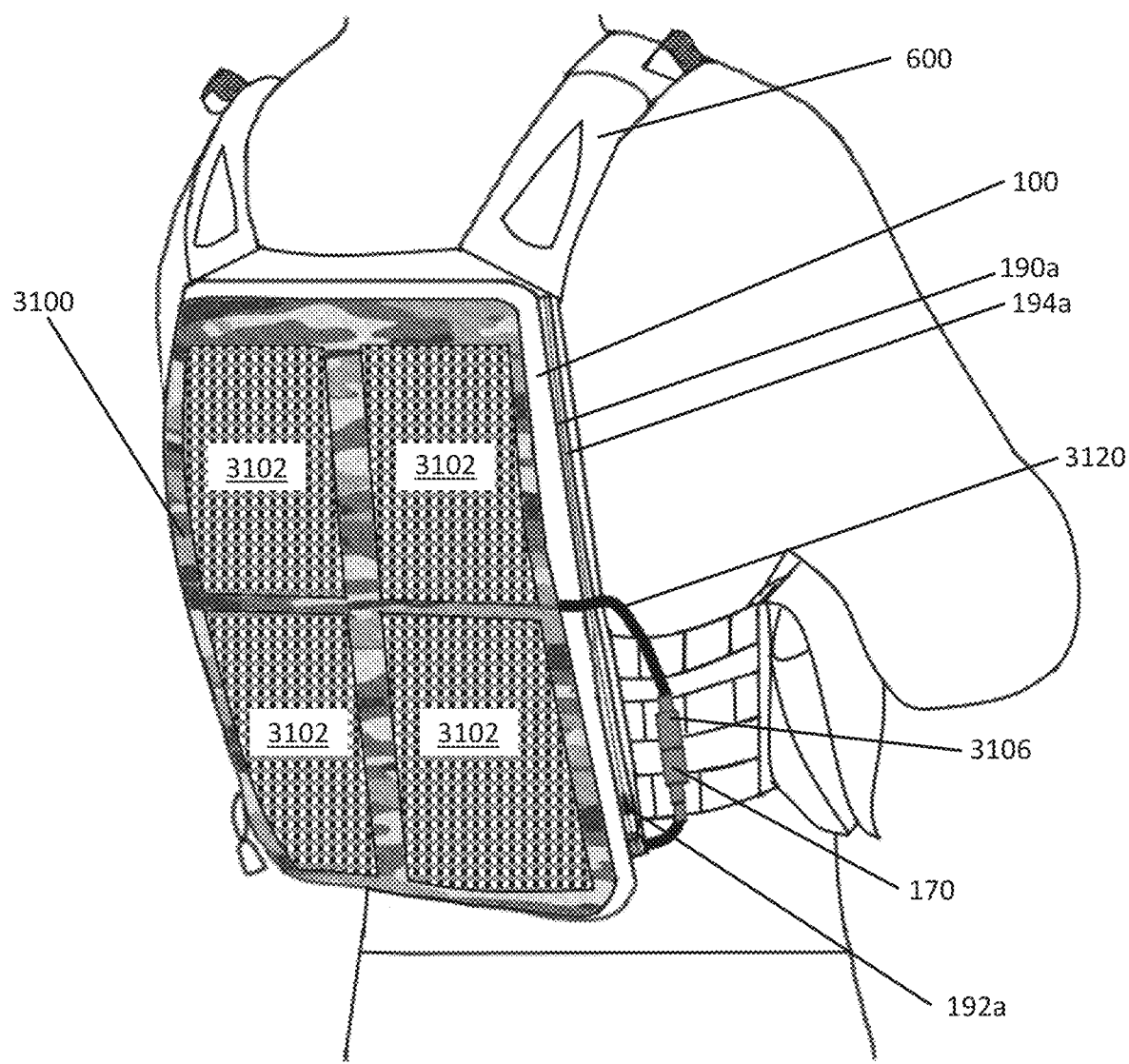
FIG. 46 illustrates a side perspective view of an example of a solar panel affixed to a portable battery pack.

FIG. 46 illustrates a side perspective view of an example of a solar panel 3100 affixed to a portable battery pack 100. The solar panel 3100 has at least one output connector 3106 electrically connected to the at least one solar module 3102 (e.g., four solar modules 3102) via a cable or wire 3120. A connector portion 170 of the battery of the portable battery pack 100 is shown mated to the at least one output connector 3106 of the solar panel 3100. In the example shown in FIG.

46, the pouch of the portable battery pack 100 is sized to hold a battery and additional devices or components (e.g., signal marker panel, state of charge indicator, AC adapter, power distribution and data hub, GPS). The portable battery pack 100 is affixed to a vest 600 using zippers. A first single width of zipper tape 190a is shown mated with a corresponding first single width of zipper tape 194a on a right side of the vest 600 using a first zipper slider 192a, thereby attaching the portable battery pack 100 to the vest 600. Similarly, a second single width of zipper tape (not shown) is mated with a corresponding second single width of zipper tape (not shown) on a left side of the vest 600 using a second zipper slider (not shown). Alternatively, an exterior surface of the pouch of the portable battery pack includes the solar panel.

In a preferred embodiment, the at least one solar module is formed of microsystem enabled photovoltaic (MEPV) material, such as that disclosed in U.S. Pat. Nos. 8,736,108, 9,029,681, 9,093,586, 9,143,053, 9,141,413, 9,496,448, 9,508,881, 9,531,322, 9,548,411, and 9,559,219 and U.S. Publication Nos. 20150114444 and 20150114451, each of which is incorporated herein by reference in its entirety.

In another preferred embodiment, the at least one solar module is formed of SUNPOWER™ MAXEON™ Gen III solar cells. In one embodiment, the solar cells are formed of monocrystalline silicon. The solar cells preferably have an antireflection coating. The solar cells have a tin-coated, copper metal grid backing. SUNPOWER™ MAXEON™ Gen III solar cells are described in an article entitled "Generation III High Efficiency Lower Cost Technology: Transition to full scale Manufacturing" by authors Smith, et al., published in Photovoltaic Specialists Conference (PVSC), 2012 38$^{th}$ IEEE, doi: 10.11009/PVSC.2012.6317899, which is incorporated herein by reference in its entirety.

Figure 47:
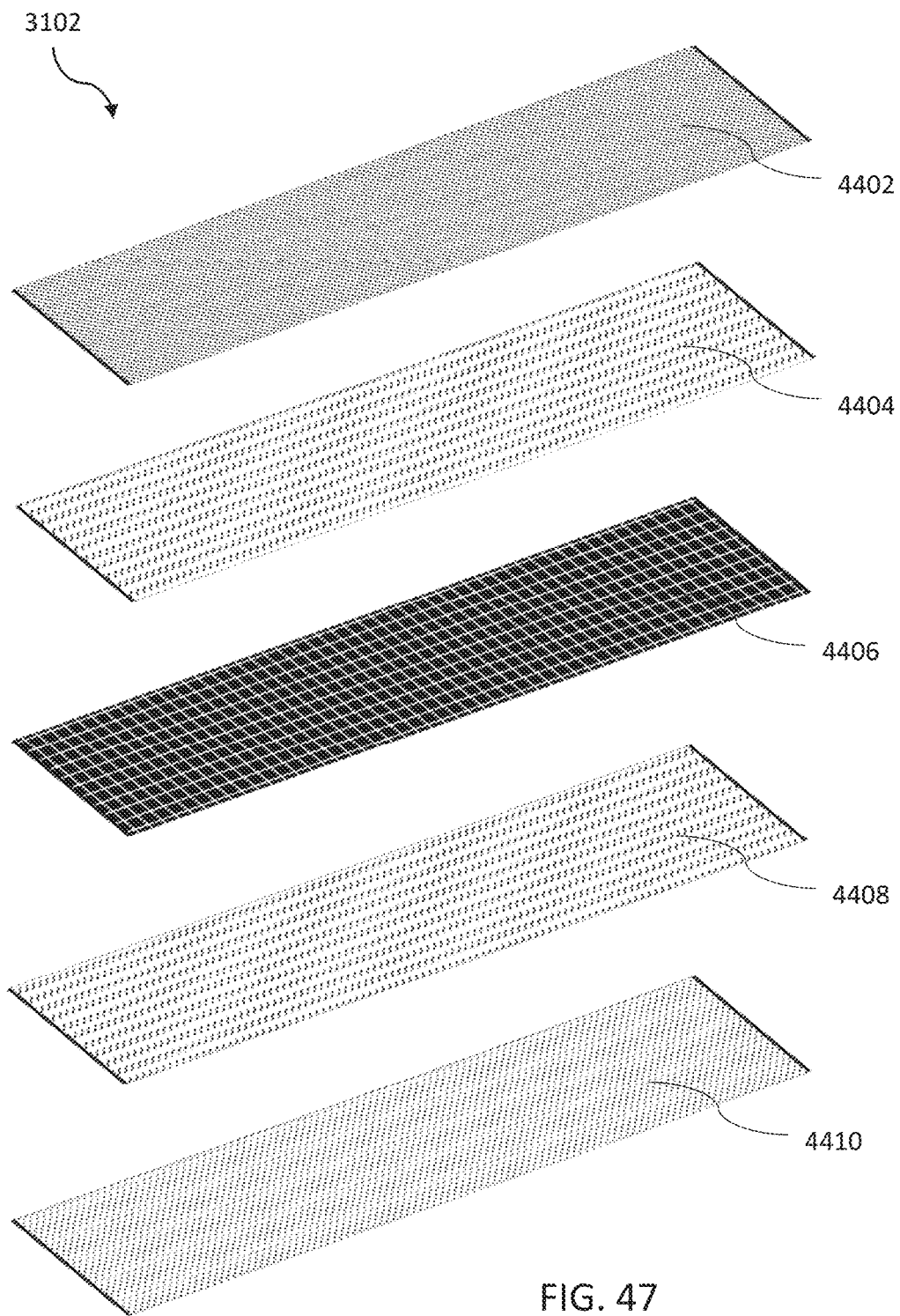
FIG. 47 illustrates one example of a solar module used with the solar panel.

FIG. 47 illustrates another example of a solar module 3102 used with the solar panel. The solar module 3102 includes a layer of ethylene tetrafluoroethylene (ETFE) 4402, a first layer of ethylene-vinyl acetate (EVA) 4404, a layer containing at least one solar cell 4406, a second layer of EVA 4408, and a layer of fiberglass 4410. In a preferred embodiment, the at least one solar module is less than about 0.04 inches thick. In a preferred embodiment, the at least one solar module weighs less than about 1 oz. In one embodiment, the at least one solar module has dimensions of about 4 inches by about 8 inches. The at least one solar module is preferably flexible. In one embodiment, the at least one solar module produces about 1 W of power. In one embodiment, the at least one solar module produces a voltage of about 6 V. In one embodiment, the at least one solar module produces a current of about 160 mA. Advantageously, the at least one solar module is operable to extend the life/run time of a rechargeable battery using this lower current (e.g., about 160 mA) in a constant-voltage phase while the battery is over 85% charged and the battery is in its state of highest internal resistance.

In yet another preferred embodiment, the solar panel is made of glass free, flexible thin film solar modules. The solar modules are formed of amorphous silicon with triple junction cell architecture. Alternatively, the solar modules are formed of multicrystalline silicon. These solar modules continue to deliver power when damaged or perforated. Additionally, these panels provide higher production and a higher output in overcast conditions than comparable glass panels. These panels also provide better performance at a non-ideal angle of incidence.

Figure 48:
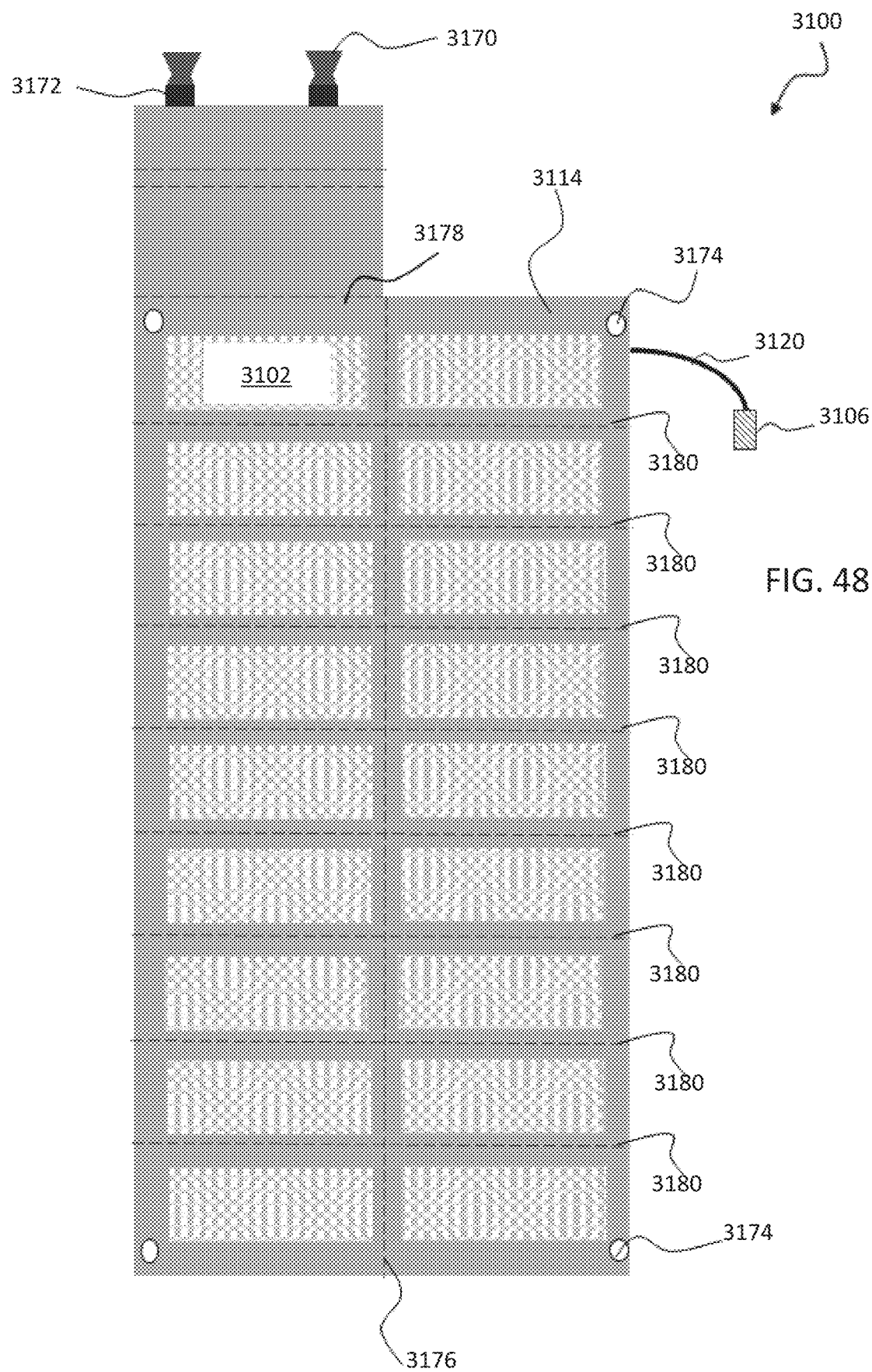
FIG. 48 illustrates one example of a solar panel made with glass free, thin film solar modules.

FIG. 48 illustrates a solar panel 3100 made with glass free, thin film solar modules. The solar panel 3100 includes at least one solar module 3102 mounted on a substrate 3114. While FIG. 48 shows eighteen solar modules 3102 in the solar panel 3100, this is exemplary only. The solar panel 3100 can include any number of solar modules 3102 configured in series, configured in parallel, or configured in any combination of series and parallel arrangements. In particular, the configuration of solar modules 3102 in the solar panel 3100 can be tailored in any way to provide a certain output voltage and current. The output of any arrangement of solar modules 3102 in the solar panel 3100 is a direct current (DC) voltage. Accordingly, the solar panel 3100 includes at least one output connector 3106 that is electrically connected to the arrangement of solar modules 3102 via a cable or wire 3120. The at least one output connector 3106 is used for connecting any type of DC load to the solar panel 3100. In one embodiment, the cable or wire 3120 of the at least one output connector 3106 includes a blocking diode to prevent power from running back into the solar panel 3100. In a preferred embodiment, the at least one output connector 3106 is a circular connector (e.g., male FISCHER® 105 A087 connector, FISCHER® LP360). In one example, the solar panel is used for supplying power to a device, such as a DC-powered radio. In another example, the solar panel is used for charging a battery. In yet another example, the solar panel is used for charging the battery of a portable battery pack.

In one embodiment, the at least one connector includes one or more connectors that allow a first solar panel to connect to a second solar panel in series or in parallel. This allows a plurality of solar panels 3100 to be connected together in series, in parallel, or any combination of series and parallel arrangements. Advantageously, connecting a plurality of panels together allows the output current and/or output voltage to be raised.

The solar panel 3100 is preferably foldable. Prior art solar panels that are rollable require a tube to roll the solar panel. The solar panel 3100 of the present invention does not require a tube, which provides a weight and volume savings advantage over prior art. The weight and dimensions of the solar panel is important because it must be easily transported by a human. Soldiers often carry 60-100 lbs. of gear, including equipment (e.g., radios, solar panels, batteries) in their rucksack or attached to their vest. Additional weight slows soldiers down and also makes it more likely that they will suffer injuries to their body (e.g., injuries to the back, shoulders, hips, knees, ankles, and feet). Additional volume also impedes the movement of the soldiers.

The solar panel 3100 includes clips (female clip 3170 shown) to secure the solar panel 3100 when not in use in one embodiment. The female clip 3170 is attached to the solar panel 3100 via top webbing 3172. The solar panel 3100 includes eyelets 3174, which allows the solar panel to be secured to the ground or another surface. While FIG. 48 shows a total of four eyelets 3174 (one in each corner), this is exemplary only. The solar panel 3100 can include any number of eyelets 3174. The solar panel 3100 has a vertical fold axis 3176, a top horizontal fold axis 3178, and a plurality of horizontal fold axes 3180.

In one embodiment, the solar panel 3100 includes eighteen solar modules 3102 as shown in FIG. 48. In one embodiment, the solar modules are formed of amorphous silicon. The maximum power is about 118 W in one embodiment. The voltage at maximum power is about 28.8V in one embodiment. The current at maximum power is about 4.1 A in one embodiment. The dimensions of the solar panel 3100 are about 8 feet by about 3 feet when deployed in one embodiment. The weight of the solar panel 3100 is preferably less than about 10 pounds. The solar panel 3100 weighs about 9 pounds in one embodiment. The dimensions of the solar panel 3100 are about 10 inches by about 15 inches by about 2 inches when folded.

In a preferred embodiment, the solar panel includes 6 solar modules. In one embodiment, the solar modules are formed of multicrystalline silicon. The maximum power is 102 W in one embodiment. The voltage at maximum power is about 30.8V in one embodiment. The current at maximum power is about 3.3 A in one embodiment. The dimensions of the solar panel are about 3 feet by about 2.5 feet when deployed in one embodiment. The weight of the solar panel is preferably less than about 8 pounds. The solar panel weighs about 6.5 pounds in one embodiment. The dimensions of the solar panel are about 15 inches by about 12 inches by about 1 inch when folded.

Figure 49:
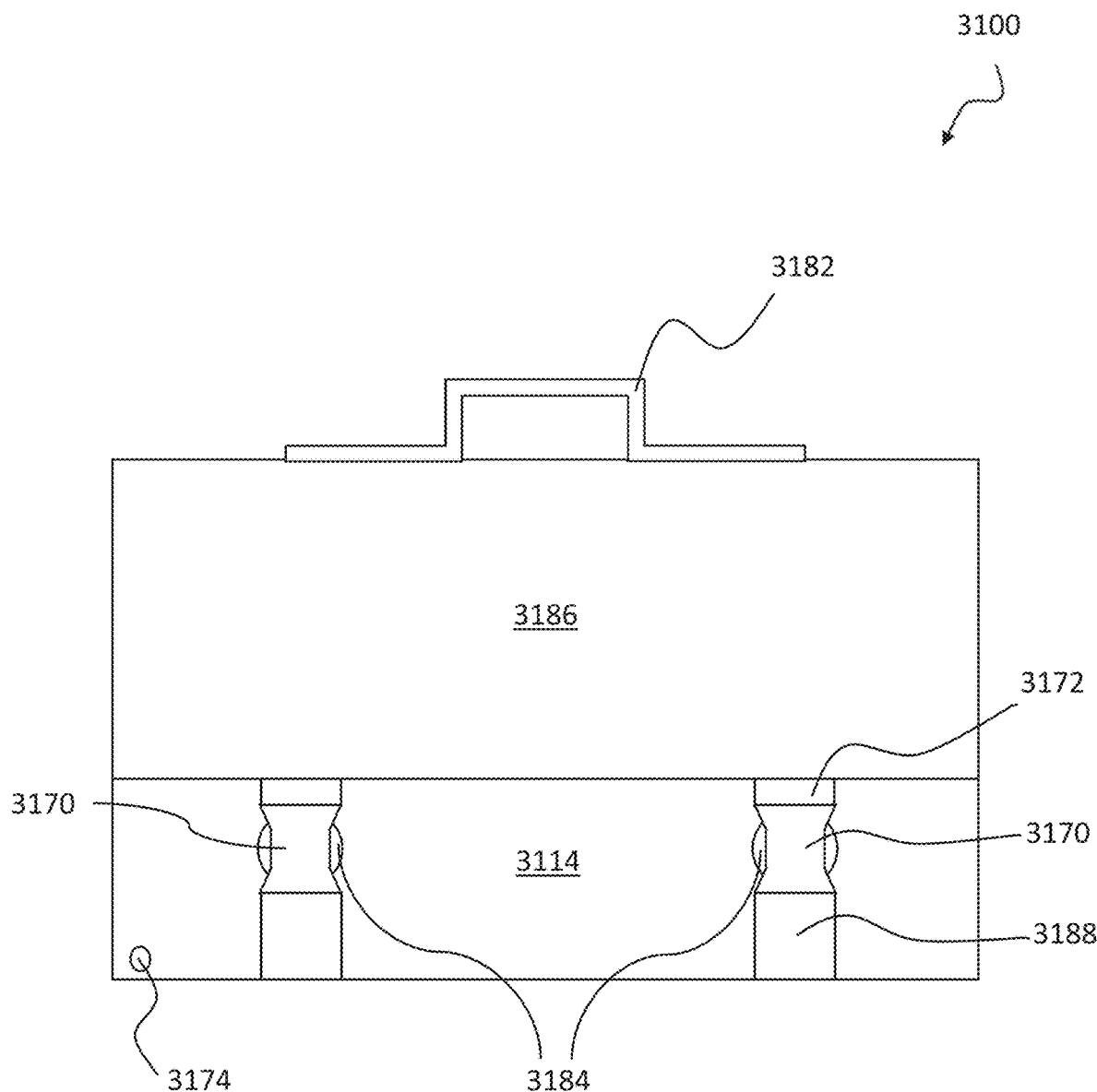
FIG. 49 illustrates a front perspective view of the solar panel in FIG. 48 while folded.

FIG. 49 shows a front perspective view of the solar panel 3100 while folded. The solar panel 3100 includes a handle 3182. The solar panel 3100 also includes clips (e.g., female clip 3170, male clip 3184) to secure the solar panel 3100 when not in use in one embodiment. The female clips 3170 are attached to a front flap 3186 via top webbing 3172. The male clips 3184 are attached to bottom webbing 3188. The front flap 3186 partially covers a back side of the substrate 3114 in one embodiment. The bottom webbing 3188 is in two pieces that are secured by hook-and-loop tape in one embodiment.

Figure 50:
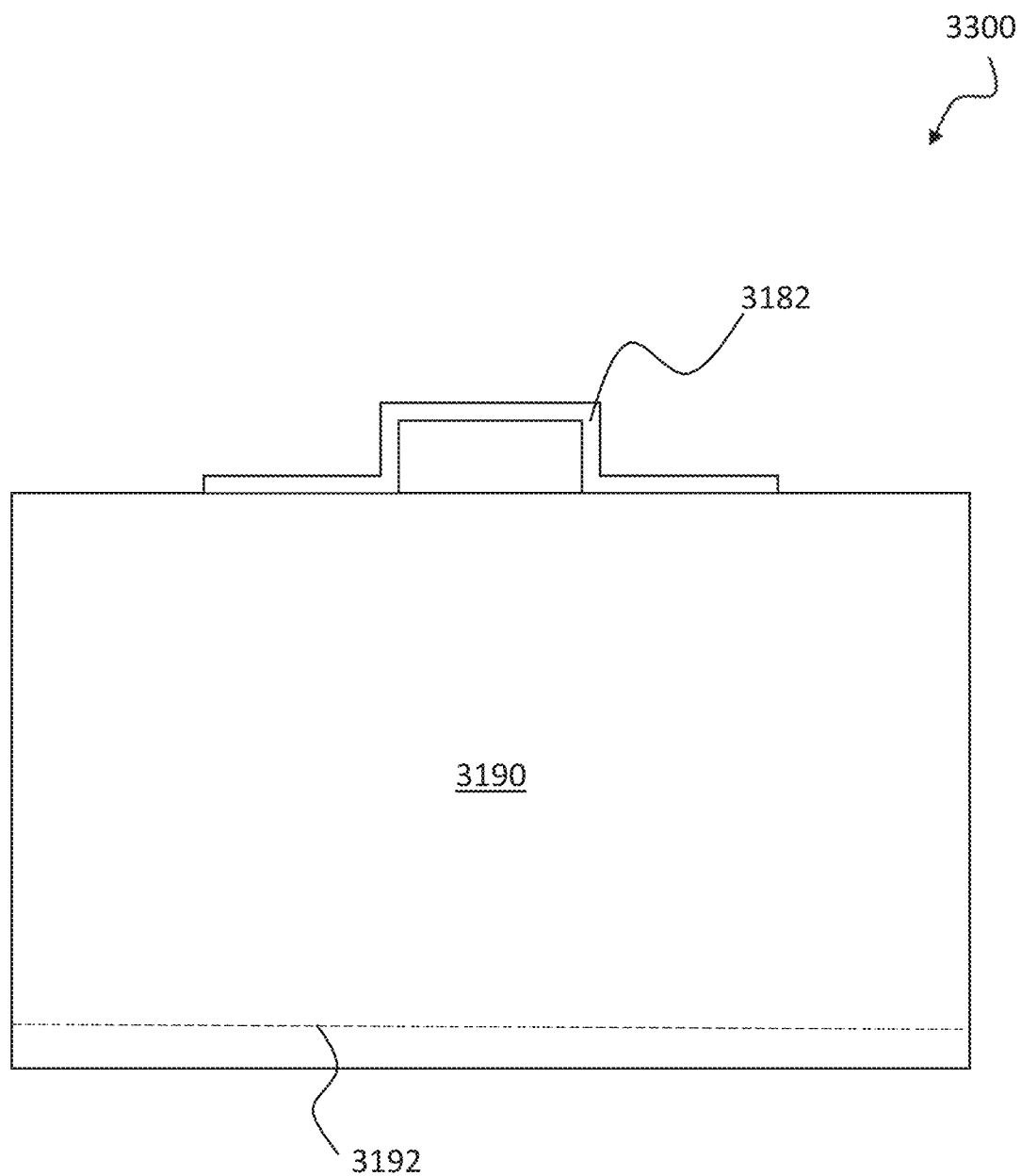
FIG. 50 illustrates a back perspective view of the solar panel in FIG. 48 while folded.

FIG. 50 shows a back perspective view of one embodiment of the solar panel 3100 while folded. In one embodiment, the integrated pocket 3190 is used to store the at least one output connector (not shown) and/or a signal marker panel when not in use. The integrated pocket 3190 has an opening 3192. The opening 3192 of the integrated pocket 3190 is preferably closed using a hook-and-loop fastener system. Alternatively, the opening 3192 of the integrated pocket 3190 is closed using ties, an arrangement of buttons or snaps, or a zipper.

Figure 51:
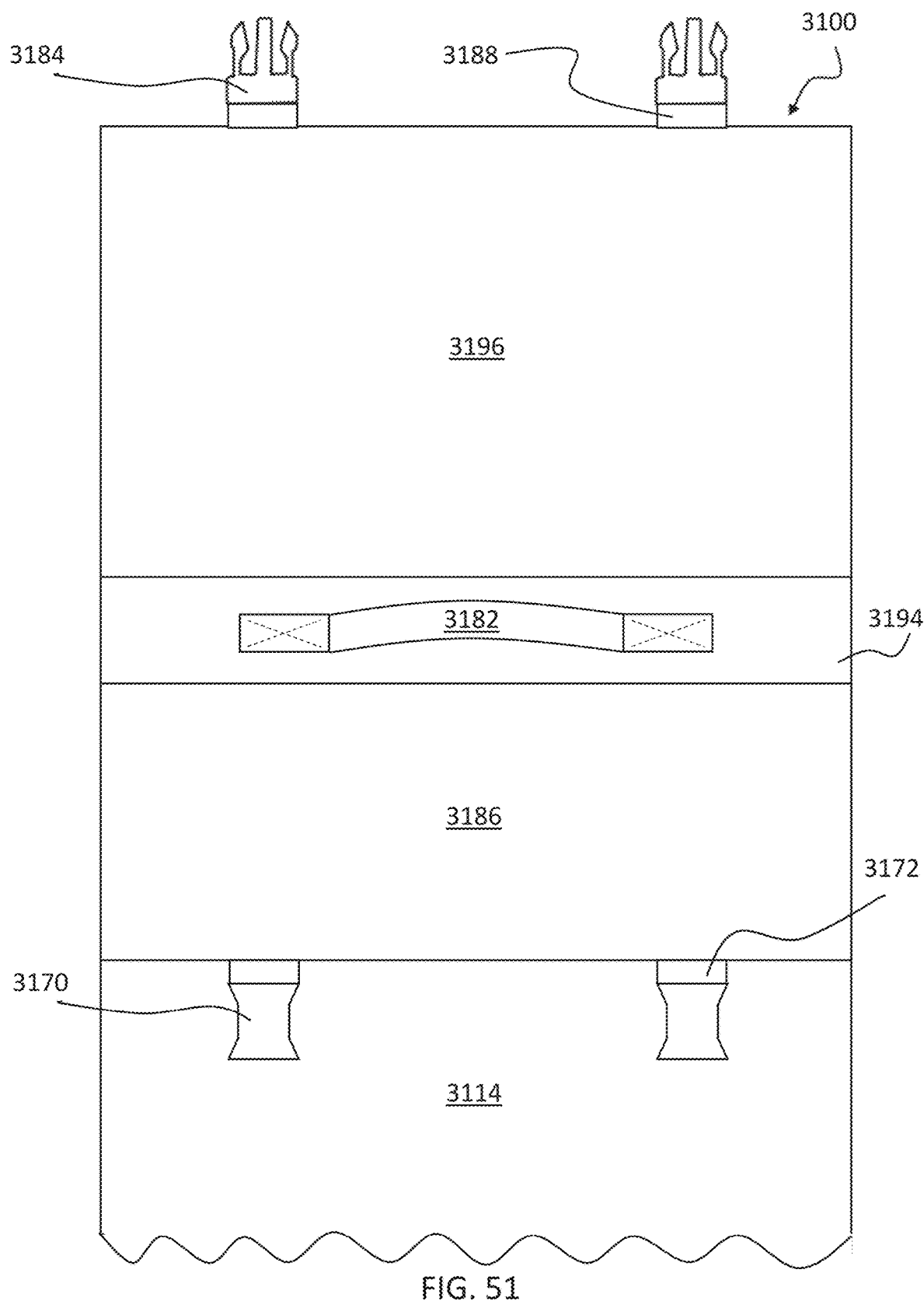
FIG. 51 illustrates a top perspective view of one embodiment of the solar panel in FIG. 48 while unfolded.

FIG. 51 illustrates a top perspective view of one embodiment of the solar panel 3100 while unfolded. The front flap 3186 is connected to the female clips 3170 via top webbing 3172. The front flap 3186 is connected to a top section 3194. The handle 3182 is attached to the top section 3194. The top section 3194 is also connected to a back flap 3196. The back flap 3196 contains the integrated pocket (not shown). In a preferred embodiment, the integrated pocket is on the reverse side of the back flap 3196 such that the integrated pocket is not exterior facing when the solar panel 3100 is folded. This protects the contents of the integrated pocket from accidentally spilling out. This also protects the cable or wire electrically connecting the at least one connector to the solar modules from getting caught on other gear, vehicle components, etc. The back flap 3196 is also connected to the male clips 3184 via bottom webbing 3188.

Figure 52:
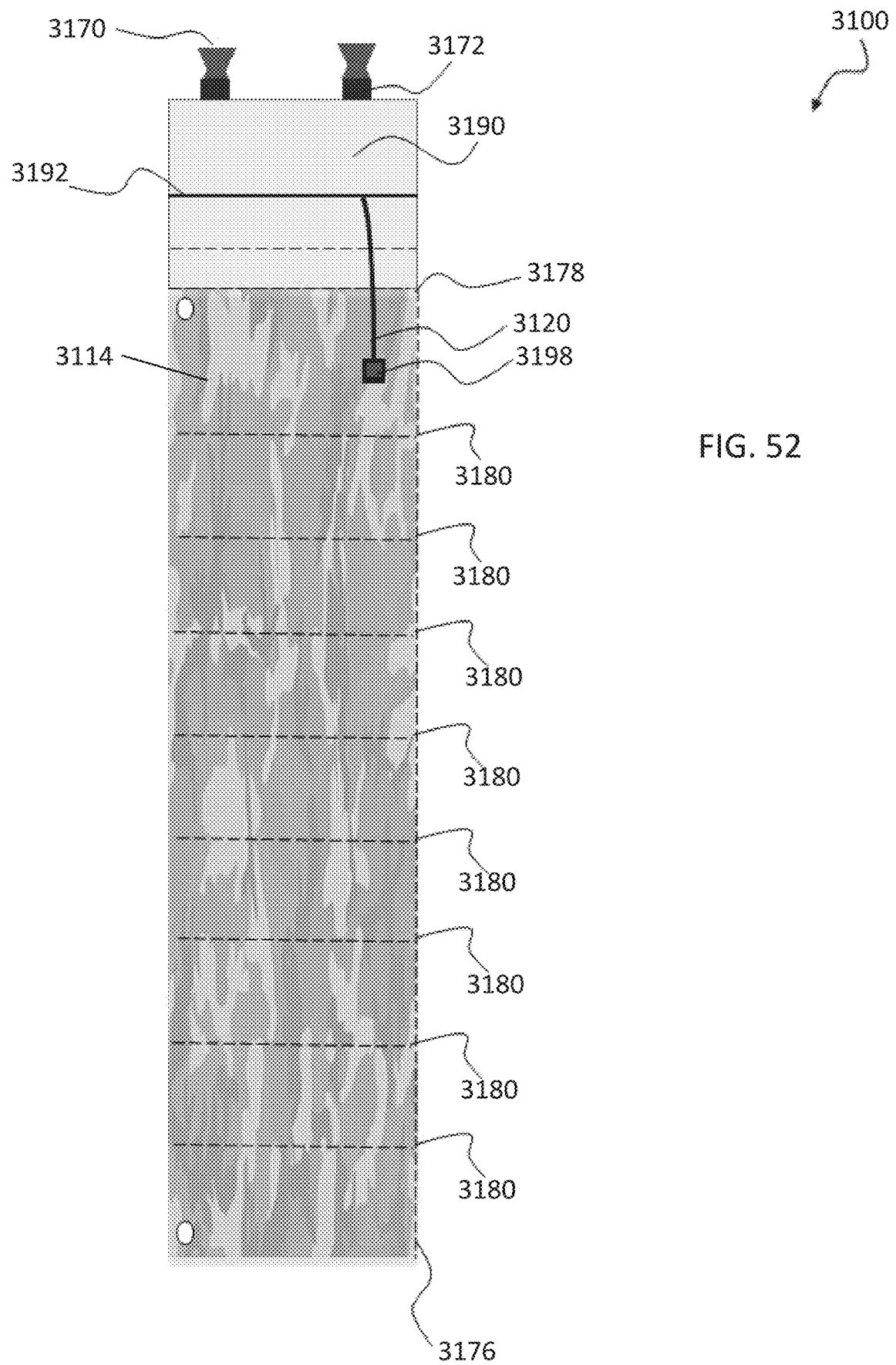
FIG. 52 illustrates another portion of the solar panel in FIG. 48.

FIG. 52 illustrates another portion of a solar panel 3100. The cable or wire 3120 is electrically connected to the at least one solar module (not shown) via a junction box 3198. The at least one output connector (not shown) is secured in the integrated pocket 3190.

In the embodiment shown in FIG. 52, the back side of the substrate 3114 is shown in a camouflage pattern. Alternatively, the substrate is a solid color (e.g., black, blue, brown, tan, green, white). In a preferred embodiment, the front flap, the top section, and the back flap are made of a canvas or nylon material. The front flap, the top section, and the back flap are formed of a camouflage pattern or a solid color (e.g., black, blue, brown, tan, green, white). Representative camouflages include, but are not limited to, Universal Camouflage Pattern (UCP), also known as ACUPAT or ARPAT or Army Combat Uniform; MULTICAM®, also known as Operation Enduring Freedom Camouflage Pattern (OCP); Universal Camouflage Pattern-Delta (UCP-Delta); Airman Battle Uniform (ABU); Navy Working Uniform (NWU), including variants, such as, blue-grey, desert (Type II), and woodland (Type III); MARPAT, also known as Marine Corps Combat Utility Uniform, including woodland, desert, and winter/snow variants; Disruptive Overwhite Snow Digital Camouflage, Urban Digital Camouflage, and Tactical Assault Camouflage (TACAM).

Figure 53:
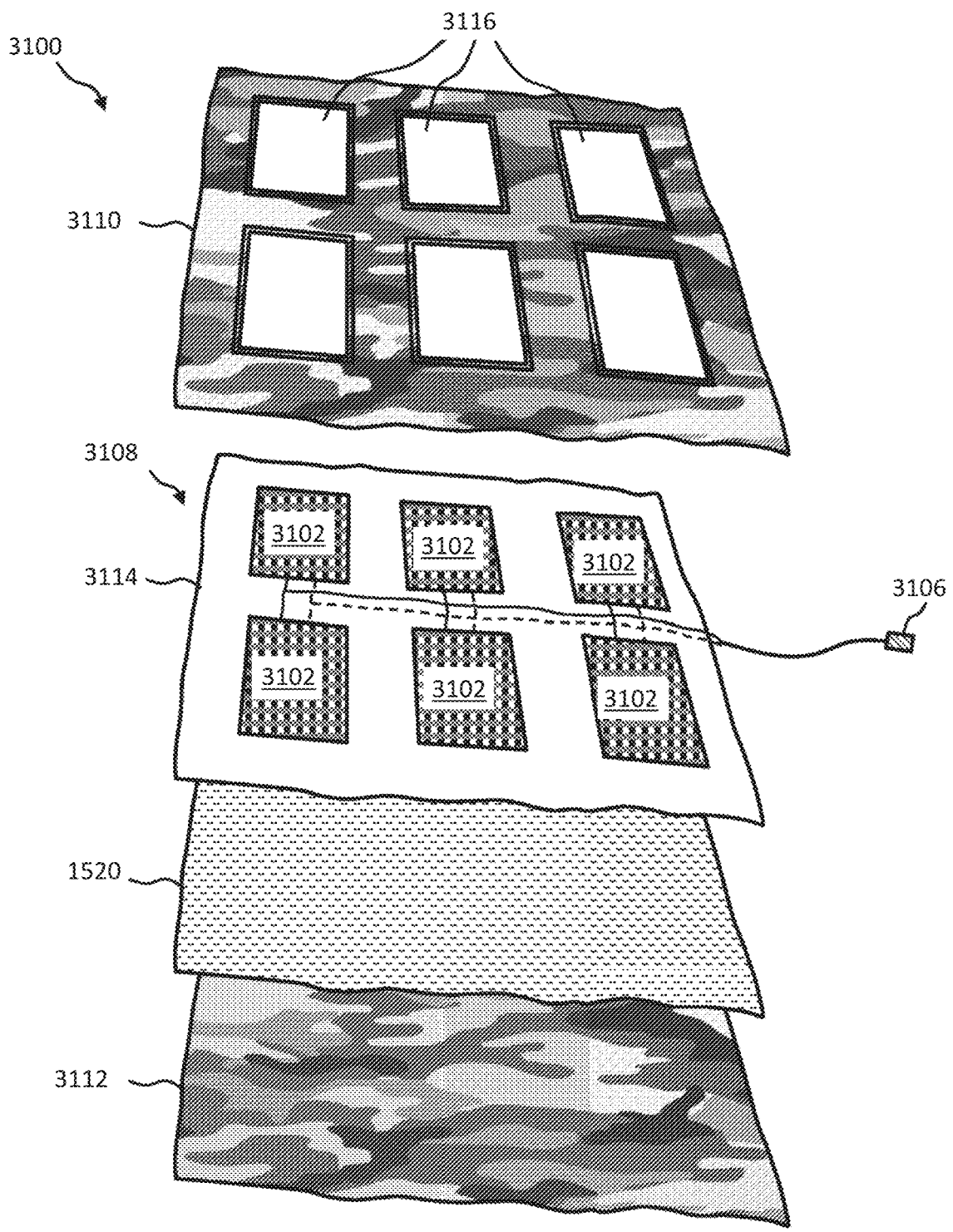
FIG. 53 is an exploded view of an example of a solar panel into which a heat dissipating material is installed.

In one embodiment, the at least one solar panel includes at least one layer of a material for dissipating heat. FIG. 53 is an exploded view of an example of a solar panel 3100 into which a heat-shielding or blocking and/or heat-dissipating layer 1520 is installed. In this example, the heat-dissipating layer 1520 is incorporated into the layers of fabric that form the solar panel 3100, in similar fashion to the structure 1500 of FIG. 17A. Namely, the heat-dissipating layer 1520 is provided at the back of solar modules 3102, between the substrate 3114 and the second fabric layer 3112. In this example, the first fabric layer 3110, the substrate 3114, the heat-dissipating layer 1520, and the second fabric layer 3112 are held together by stitching and/or by a hook-and-loop fastener system. In this example, the heat-shielding or blocking and/or heat-dissipating layer 1520 protects the user from heat from the back of the solar panel 3100, the heat-shielding or blocking and/or heat-dissipating layer 1520 protects the back of the solar panel 3100 from any external heat source (not shown), and the heat-dissipating layer 1520 reduces the heat profile of the solar panel 3100.

Combination Solar Panel and Signal Marker Panel

Conventional signal marker panels and solar panels typically are provided separately and used independently of one another. In contrast, the present invention includes a combination signal marker panel and solar panel. Namely, in the combination signal marker panel and solar panel, a signal marker panel is detachably secured to a flexible solar panel. The combination signal marker panel and solar panel is lightweight, flexible (i.e., foldable or rollable), and waterproof or water resistant. As a result, the combination signal marker panel and solar panel is well-suited for portability and for use in adverse conditions.

An aspect of the combination signal marker panel and solar panel is that both the signal marker panel and the solar panel fulfill their traditional functions unhindered. The signal marker panel and the solar panel can be used simultaneously, or the signal marker panel can be used alone, or the solar panel can be used alone.

Yet another aspect of the combination signal marker panel and solar panel is that the solar panel is modular and configurable to provide any output voltage. The solar panel can include any number of solar modules configured in series, configured in parallel, or configured in any combination of series and parallel arrangements.

In one embodiment of the present invention, the signal marker panel can be positioned to provide secondary protection to the solar panel, and solar modules thereof, when folded up and stowed.

Another aspect of the combination signal marker panel and solar panel is that the output voltage of the solar panel is provided in an unregulated state. As a result, the complexity of the solar panel is reduced as compared with conventional solar panels because it does not include voltage conditioning circuitry at its output.

Figure 54:
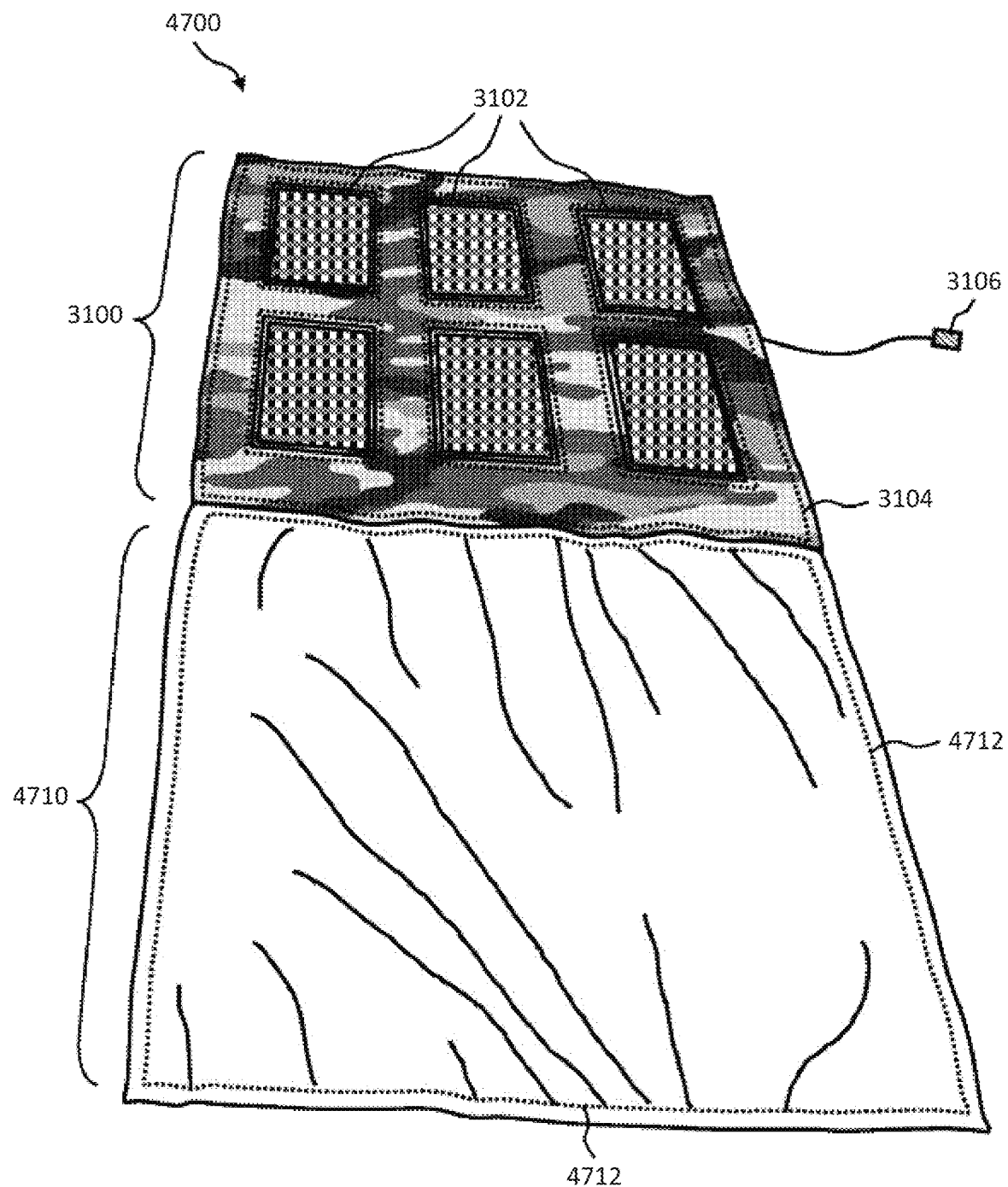
FIG. 54 illustrates a front perspective view of an example of a combination signal marker panel and solar panel.
Figure 55:
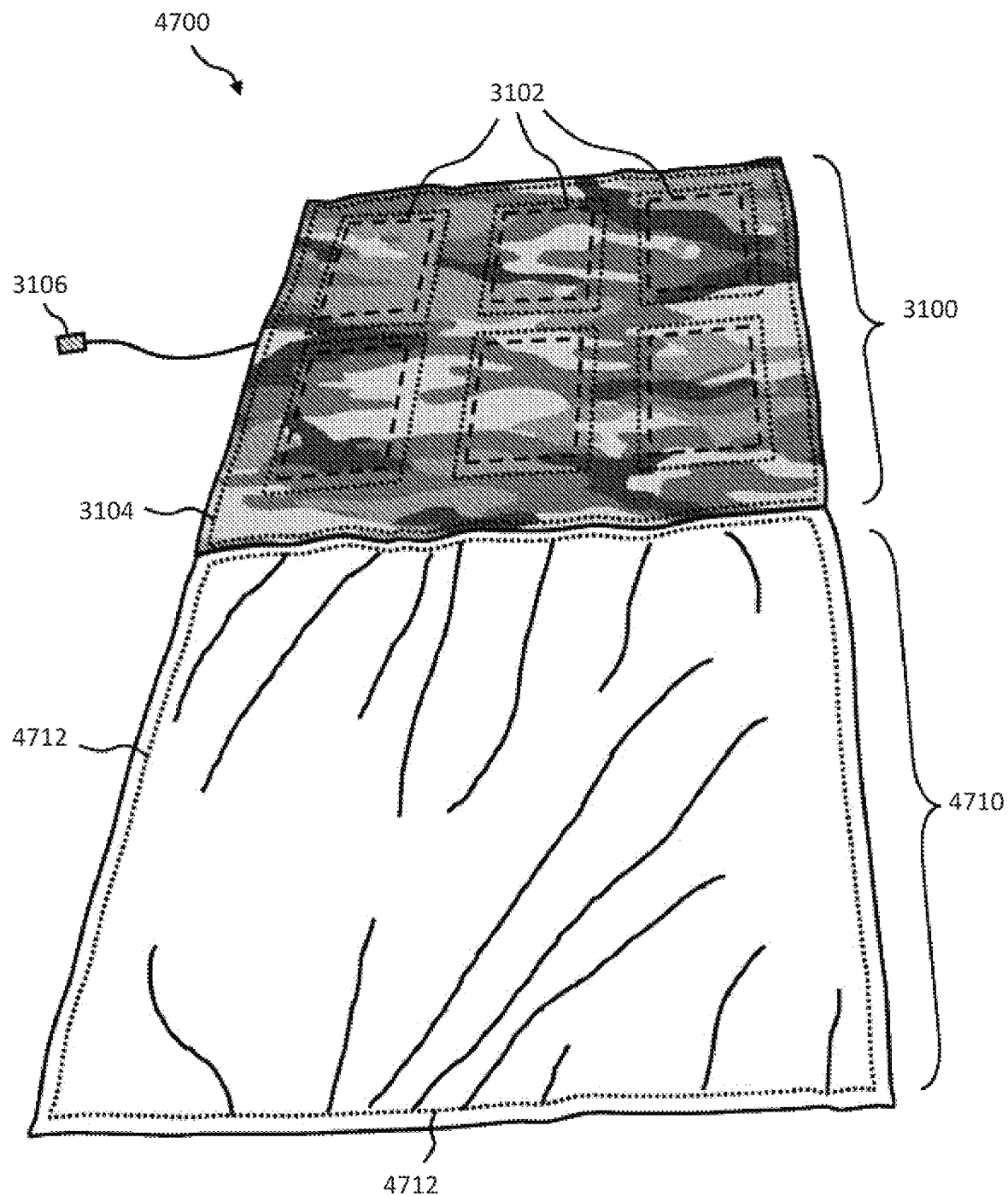
FIG. 55 illustrates a back perspective view of an example of a combination signal marker panel and solar panel.

FIG. 54 and FIG. 55 illustrate front and rear perspective views, respectively, of an example of a combination signal marker panel and solar panel 4700 that is lightweight, foldable, waterproof or water resistant, and well-suited for portability. The combination signal marker panel and solar panel 4700 includes a signal marker panel 4710 that is detachably secured to a solar panel 3100.

In one embodiment, the solar panel 3100 of the combination signal marker panel and solar panel 4700 is a multilayer structure that includes a plurality, e.g., one or more, of solar modules 3102 mounted on a substrate, wherein the substrate with the plurality of solar modules 3102 is sandwiched between two layers of waterproof or water-resistant fabric. In one embodiment, openings, e.g., windows, are formed in at least one of the two layers of fabric for exposing the solar modules 3102. The outer two layers of fabric can be any color or pattern. In the example shown in FIG. 54 and FIG. 55, the outer two layers of fabric have a camouflage pattern thereon. One of ordinary skill in the art would recognize that the two layers of fabric can have any camouflage pattern including, but not limited to, Universal Camouflage Pattern (UCP), also known as ACUPAT or ARPAT or Army Combat Uniform; MULTICAM®, also known as Operation Enduring Freedom Camouflage Pattern (OCP); Universal Camouflage Pattern-Delta (UCP-Delta); Airman Battle Uniform (ABU); Navy Working Uniform (NWU), including variants, such as, blue-grey, desert (Type II), and woodland (Type III); MARPAT, also known as Marine Corps Combat Utility Uniform, including woodland, desert, and winter/snow variants; Disruptive Overwhite Snow Digital Camouflage, Urban Digital Camouflage, and Tactical Assault Camouflage (TACAM).

A hem 3104 is provided around the perimeter of the solar panel 3100 in one embodiment. The output of any arrangement of solar modules 3102 in the solar panel 3100 is a direct current (DC) voltage. Accordingly, the solar panel 3100 includes at least one output connector 3106 that is wired to the arrangement of solar modules 3102. The at least one output connector 3106 is used for connecting any type of DC load to the solar panel 3100. In one example, the solar panel 3100 is used for supplying power to a device, such as a DC-powered radio. In another example, the solar panel 3100 is used for charging a battery. In yet another example, the solar panel 3100 is used for charging the battery of a portable battery pack.

In one embodiment, the at least one connector 3106 includes one or more connectors that allow a first solar panel to connect to a second solar panel in series or in parallel. This allows a plurality of solar panels 3100 of multiple combination signal marker panel and solar panels 4700 to be connected together in series, parallel, or any combination of series and parallel arrangements.

The signal marker panel 4710 of the combination signal marker panel and solar panel 4700 is preferably formed of any flexible, durable, and waterproof or water-resistant material used in conventional signal marker panels. For example, the signal marker panel 4710 can be formed of polyester, polyvinyl chloride (PVC)-coated polyester, vinyl-coated polyester, nylon, canvas, PVC-coated canvas, or polycotton canvas. The signal marker panel 4710 can be any color suitable for signaling, such as, but not limited to, red, orange, yellow, pink, and white. In one embodiment, the signal marker panel 4710 includes a U.S. Coast Guard-approved distress signal (e.g., a black square and circle) on a top surface and/or a bottom surface of the signal marker panel 4710. In another embodiment, the signal marker panel 4710 incorporates reflective material and/or thermal identification material on the top surface and/or the bottom surface. A hem 4712 is provided around a perimeter of the signal marker panel 4710 in this embodiment of the present invention.

In one embodiment, the solar panel and/or the signal marker panel include tie straps, loops, eyelets, and/or grommets. The tie straps, loops, eyelets, and/or grommets allow the solar panel and/or the signal marker panel to attach to different surfaces (e.g., the ground, trees, or a backpack). In one embodiment, tie straps are made of the same material as the signal marker panel, nylon, elastic, or parachute cord. The solar panel and/or the signal marker panel are operable to attach to the ground with stakes through the eyelets, grommets, and/or loops.

The length of the signal marker panel can be about the same or can be different than the width. The footprint of the signal marker panel can be, for example, square or rectangular. The length and width of the signal marker panel can be, for example, from about 8 inches to about 48 inches. In one example, the signal marker panel is about 36 inches by about 36 inches.

Similarly, the length of the solar panel can be about the same or can be different than the width. The footprint of the solar panel can be, for example, square or rectangular. The length and width of the solar panel can be, for example, from about 8 inches to about 48 inches. In one example, the solar panel is about 36 inches by about 36 inches.

Figure 56A:
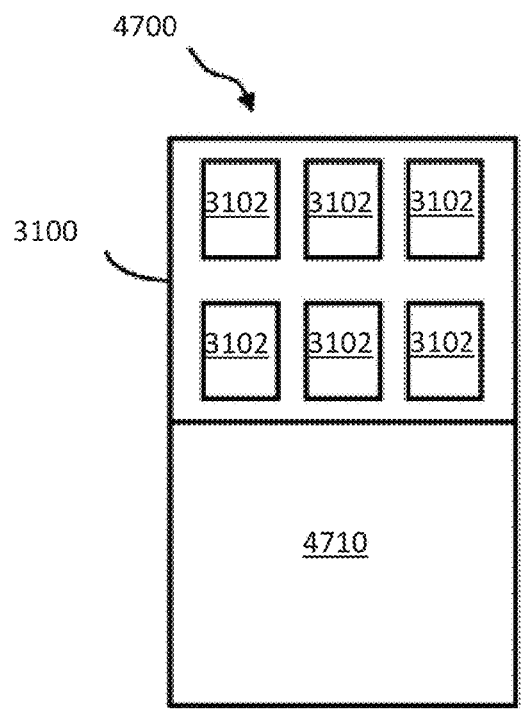
FIG. 56A shows an example of the combination signal marker panel and solar panel wherein the signal marker panel and the solar panel are substantially the same size.
Figure 56B:
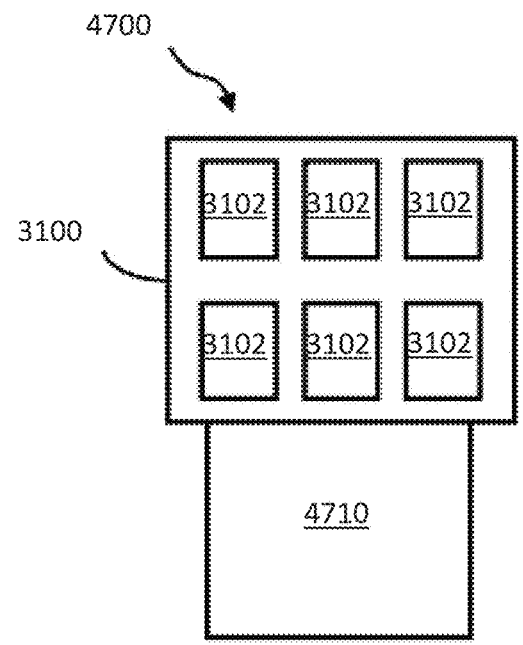
FIG. 56B shows an example of the combination signal marker panel and solar panel wherein a smaller signal marker panel is joined to a larger solar panel.
Figure 56C:
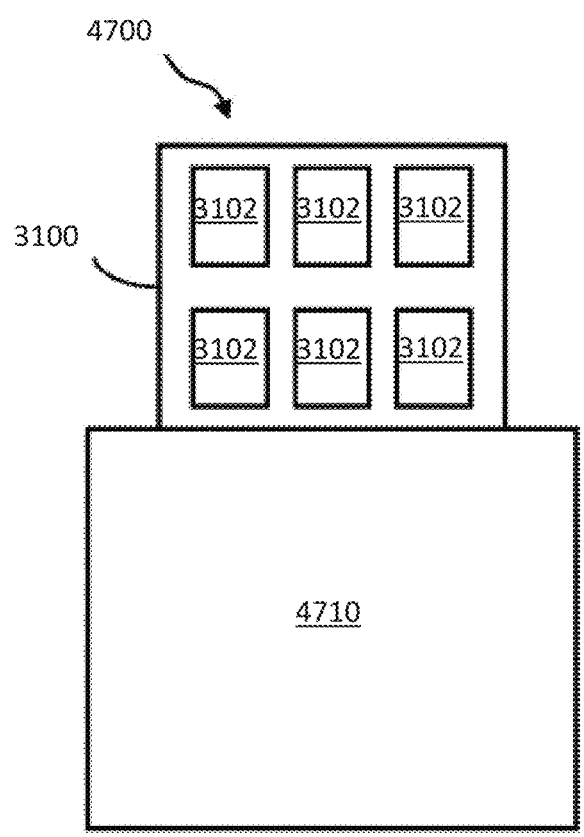
FIG. 56C shows an example of the combination signal marker panel and solar panel wherein a larger signal marker panel is joined to a smaller solar panel.

The signal marker panel 4710 and the solar panel 3100 can be substantially the same size or can be different sizes and still be joined together. For example, FIG. 54, FIG. 55, and FIG. 56A show an example of the combination signal marker panel and solar panel 4700 wherein the signal marker panel 4710 and the solar panel 3100 are substantially the same size. FIG. 56B, however, shows an example of the combination signal marker panel and solar panel 4700 wherein a smaller signal marker panel 4710 is joined to a larger solar panel 4700. Further, FIG. 56C shows an example of the combination signal marker panel and solar panel 4700 wherein a larger signal marker panel 4710 is joined to a smaller solar panel 3100.

In one embodiment of the combination signal marker panel and solar panel, one edge of the signal marker panel is sewed, adhered, or otherwise fastened to one edge of the solar panel in a substantially permanent fashion. In another embodiment, however, the signal marker panel is detachable from the solar panel. For example, one edge of the signal marker panel is fastened to one edge of the solar panel using a zipper, an arrangement of buttons or snaps, ties, and/or a hook-and-loop fastener system.

In a preferred embodiment, the hook-and-loop fastener system is a first strip including hooks and a second strip including loops. The first strip and the second strip are adhered, e.g., glued, sewn, or otherwise attached, to opposing surfaces to be fastened. For example, in some embodiments, the first strip including hooks is attached to the signal marker panel and the second strip including loops is attached to the solar panel. In other embodiments, the first strip including hooks is attached to the solar panel and the second strip including loops is attached to the signal marker panel. When the first strip and the second strip are pressed together, the hooks catch in the loops and the two strips reversibly bind or fasten. The two strips can be separated by pulling apart. The hook-and-loop fastener system can be made of any appropriate material known in the art including, but not limited to, nylon, polyester, TEFLON®, and the like. VELCRO® is an example of a hook-and-loop fabric fastener system.

The signal marker panel is preferably a single layer of lightweight fabric, which reduces the overall weight of the combination signal marker panel and solar panel. In an alternative embodiment, the signal marker panel has two layers. One layer can be any color suitable for signaling, such as, but not limited to, red, orange, yellow, pink, and white. The other layer can be a different color or a pattern (e.g., camouflage).

Figure 57:
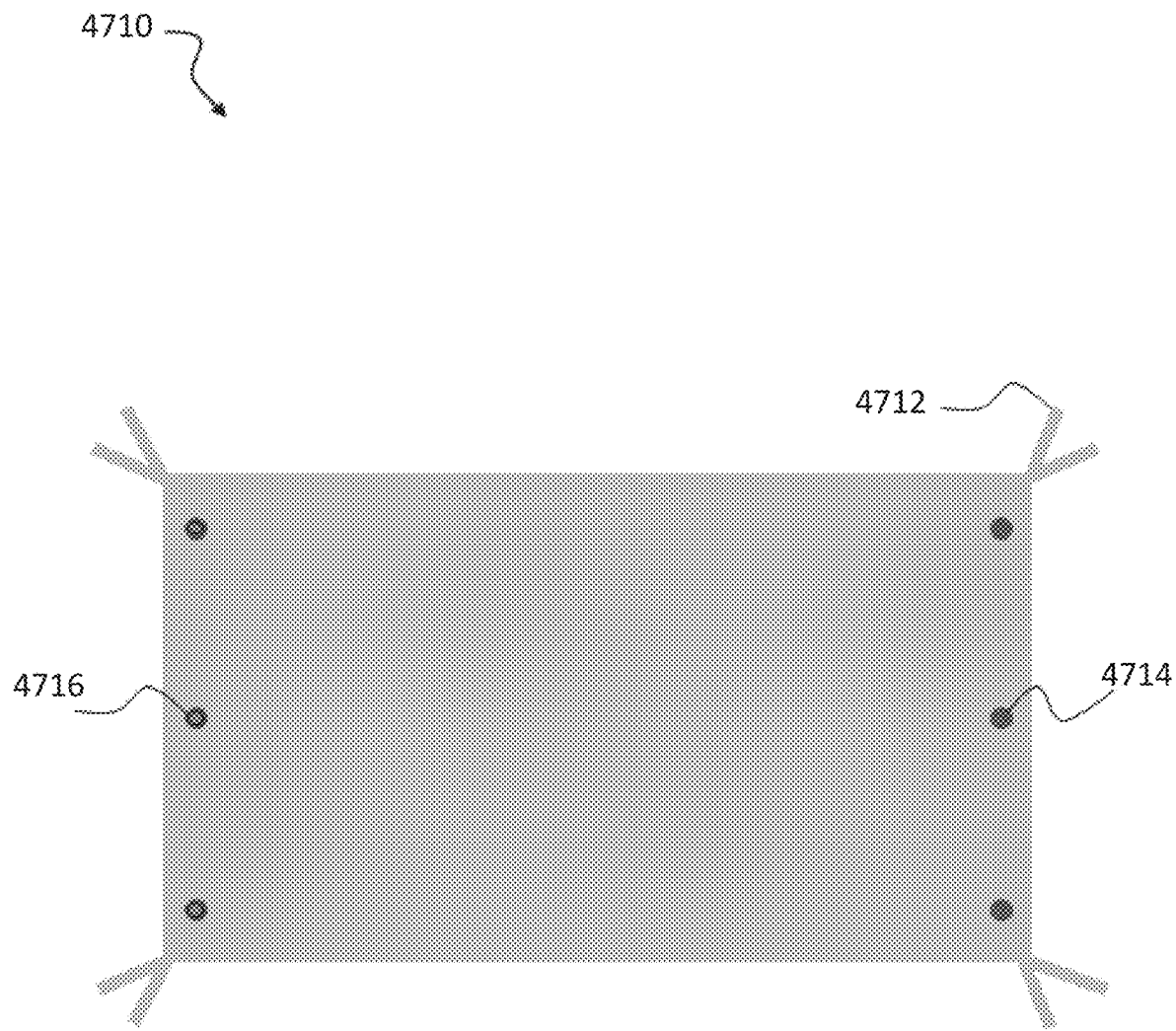
FIG. 57 illustrates one example of a signal marker panel.

FIG. 57 illustrates one embodiment of a signal marker panel 4710. The signal marker panel 4710 is preferably rectangular or square in shape. In a preferred embodiment, the signal marker panel 4710 is fluorescent orange (or "international orange") on a first side and cerise on a second side. In a preferred embodiment, the signal marker panel 4710 is formed of ripstop nylon. In the example shown in FIG. 57, the signal marker panel 4710 includes tie straps 4712, which allows the signal marker panel 4710 to attach to different surfaces (e.g., the ground, trees, a backpack). In one embodiment, the tie straps 4712 are made out of the same material as the signal marker panel 4710, nylon, elastic, hook-and-loop tape, or parachute cord. In one embodiment, the signal marker panel 4710 includes snaps, which allows multiple signal marker panels 4710 to be connected together. The snaps include sockets 4714 (cap shown) and studs 4716.

In a preferred embodiment, the signal marker panel includes a cerise side and an international orange side. In one embodiment, the signal marker panel includes grommets on two opposing ends. The signal marker panel preferably includes at least one piece of hook tape and at least one piece of loop tape on both sides of the signal marker panel (i.e., on both the cerise and international orange sides). In an alternative embodiment, the signal marker panel includes at least one piece of hook tape and at least one piece of loop tape on only one side. The signal marker panel includes at least one piece of hook tape and/or at least one piece of loop tape on two opposing ends of at least one side of the signal marker panel in another embodiment. In one embodiment, the signal marker panel is about 3 feet wide and about 3 feet long.

Figure 58A:
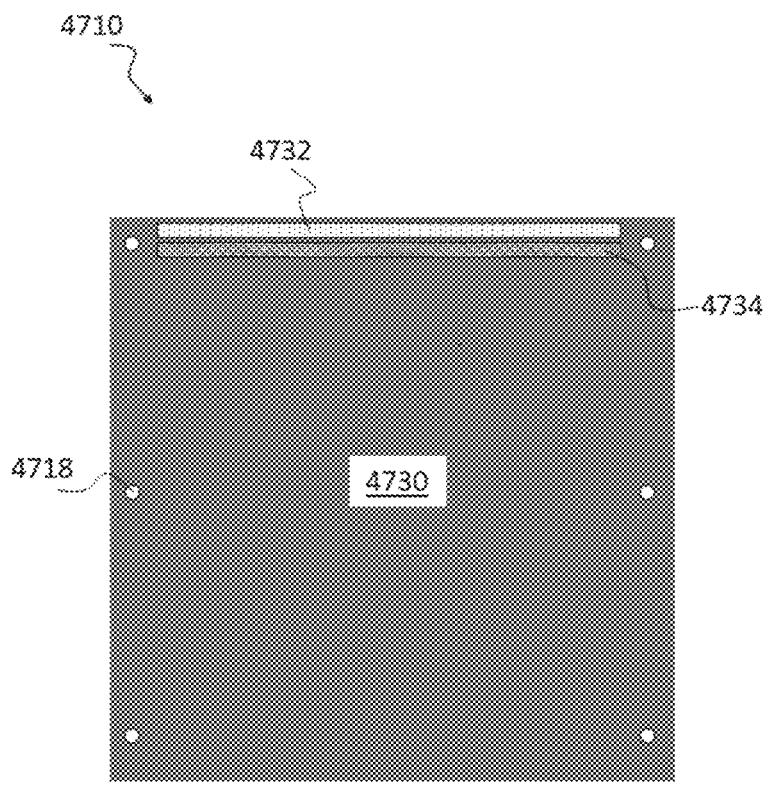
FIG. 58A illustrates an example of a first side of a signal marker panel.
Figure 58B:
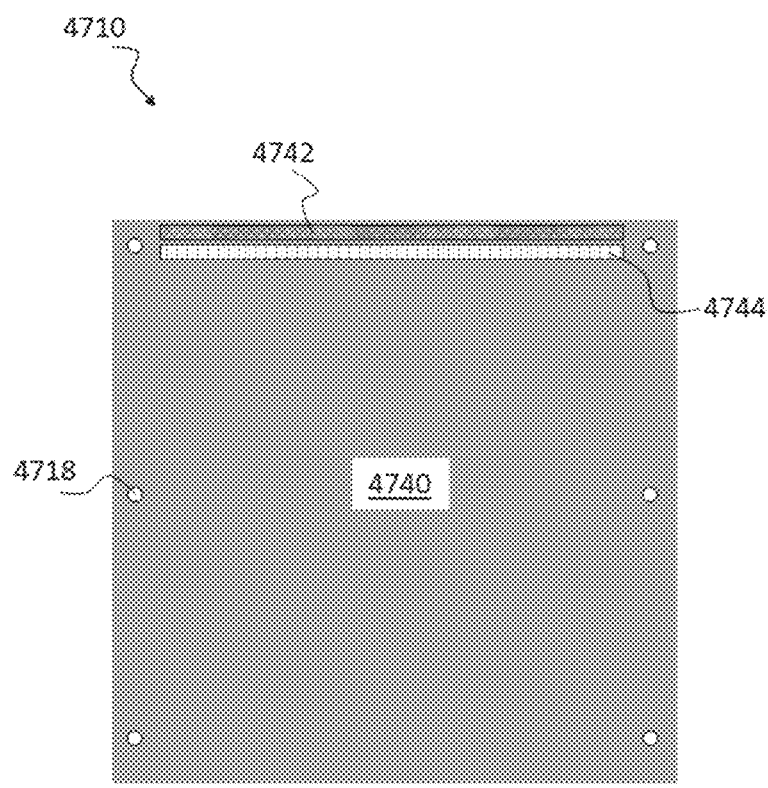
FIG. 58B illustrates an example of a second side of a signal marker panel.

FIGS. 58A-58B illustrate another embodiment of a signal marker panel 4710. FIG. 58A illustrates a first side 4730 of the signal marker panel 4710. In the example shown in FIG. 58A, the first side 4730 is cerise. The signal marker panel 4710 includes grommets 4718 on two opposing ends. The first side 4730 includes a first piece of hook tape 4732 and a first piece of loop tape 4734. In the embodiment shown in FIG. 58A, the first piece of hook tape 4732 is shown above the first piece of loop tape 4734. In an alternative embodiment, the first piece of hook tape 4732 is below the first piece of loop tape 4734.

FIG. 58B illustrates a second side 4740 of the signal marker panel 4710. In the example shown in FIG. 58B, the second side 4740 is international orange. The second side 4740 includes a second piece of loop tape 4742 and a second piece of hook tape 4744. In the embodiment shown in FIG. 58B, the first piece of loop tape 4742 is shown above the first piece of hook tape 4744. In an alternative embodiment, the first piece of loop tape 4742 is below the first piece of hook tape 4744.

Advantageously, the dual hook and loop configuration (i.e., 4 strips of hook and loop tape with a piece of hook tape and a piece of loop tape on each side) shown in FIGS. 58A-58B facilitates installation of the signal marker panel into any pocket that closes with hook and loop tape. Further, the dual hook and loop configuration allows the pocket to maintain its closing operability. Examples of pockets that close with hook and loop tape include a base of a plate carrier, a long pocket in a vest, and the opening of the integrated pocket of the solar panel.

The combination signal marker panel and solar panel can include other features. In one embodiment, the combination signal marker panel and solar panel includes an elastic band or strap (not shown) that is used for wrapping around the combination signal marker panel and solar panel when folded or rolled. Alternatively, the combination signal marker panel and solar panel includes side release buckles, backpack clips, toggle clips, friction buckles, tongue buckles, quick connect buckles, and/or magnetic closures to secure the combination signal marker panel and solar panel when folded or rolled.

In one example application-a military application, the combination signal marker panel and solar panel provides the following advantages over using separate signal marker panels and solar panels:

1) The combination signal marker panel and solar panel can be used to harvest solar energy while simultaneously marking the user's position to friendlies in the battle space, both on the ground and in the air.

2) The combination signal marker panel and solar panel has a small footprint that allows it to be draped over the user's backpack or rucksack, which allows the solar panel portion to be used while on the move.

3) The small footprint of the combination signal marker panel and solar panel facilitates stationary charging in tight spaces, and makes the overall folded or rolled dimension light enough and small enough to be carried by the user instead of the user carrying additional batteries. Advantageously, this allows device use in austere environments over longer periods of time when resupply is not possible (e.g., due to weather, natural disaster, battle).

In summary and referring now to FIG. 1 through FIG. 58B, the present invention provides a system for supplying power to a portable battery pack including one or more batteries enclosed in a wearable pouch using at least one solar panel, wherein the one or more batteries include at least one battery element, a battery cover, a battery back plate, and one or more flexible omnidirectional leads that include a connector portion and a wiring portion, wherein a flexible spring is provided around the wiring portion such that a portion of the flexible spring is positioned inside the battery cover and a portion of the flexible spring is positioned outside the battery cover.

In other embodiments, the present invention provides a portable battery pack including a wearable pouch and one or more batteries enclosed in the wearable pouch, wherein the pouch has a first side and an opposite second side, a closable opening through which the one or more batteries can be fitted into the pouch, one or more openings through which one or more leads from the one or more batteries can be accessed, and wherein the pouch includes a pouch attachment ladder system (PALS) adapted to attach the pouch to a load-bearing platform.

In some embodiments, the pouch is formed of a flexible, durable, and waterproof and/or water-resistant material. In particular embodiments, the material forming the pouch is selected from the group consisting of polyester, polyvinyl chloride (PVC)-coated polyester, vinyl-coated polyester, nylon, canvas, PVC-coated canvas, and polycotton canvas.

In yet more particular embodiments, the pouch has an exterior finish with a camouflage pattern. In representative embodiments, the camouflage pattern is selected from the group consisting of Universal Camouflage Pattern (UCP), also known as ACUPAT or ARPAT or Army Combat Uniform; MULTICAM®, also known as Operation Enduring Freedom Camouflage Pattern (OCP); Universal Camouflage Pattern-Delta (UCP-Delta); Airman Battle Uniform (ABU); Navy Working Uniform (NWU), including variants, such as, blue-grey, desert (Type II), and woodland (Type III); MAR-PAT, also known as Marine Corps Combat Utility Uniform, including woodland, desert, and winter/snow variants; Disruptive Overwhite Snow Digital Camouflage, Urban Digital Camouflage, and Tactical Assault Camouflage (TACAM).

In some embodiments, the closable opening can be closed by a mechanism selected from the group consisting of a zipper, a hook and loop system, one or more buttons, one or more snaps, one or more ties, one or more buckles, one or more clips, and one or more hooks.

In particular embodiments, the load-bearing platform is selected from the group consisting of a vest (e.g., bulletproof vest, Rhodesian vest), a backpack, body armor, a belt (e.g., tactical belt), a chair, a seat, a boat, a kayak, a canoe, a body of a user (e.g., back region, chest region, abdominal region, arm, leg), a vehicle (e.g., truck, high mobility multipurpose wheeled vehicle (Humvee), all-terrain vehicle (ATV), sport utility vehicle (SUV)), a cargo rack, a helmet, or a hat. In certain embodiments, the portable battery pack is Modular Lightweight Load-carrying Equipment (MOLLE)-compatible. In yet more certain embodiments, the pouch attachment ladder system is formed of a plurality of straps, a plurality of horizontal rows of webbing, a plurality of slits, and combinations thereof.

In some embodiments, the one or more batteries include a battery element, a battery cover, and a battery back plate. In particular embodiments, one or more of the battery element, battery cover, and battery back plate have a curvature or contour adapted to conform to a curvature or contour of the load-bearing platform.

In further embodiments, the one or more batteries includes one or more flexible omnidirectional leads, wherein each lead includes a connector portion and a wiring portion, and wherein at least a portion of the wiring portion is encompassed by a flexible spring.

In certain embodiments, the battery has a length having a range from about 12 inches to about 8 inches, a width having a range from about 10 inches to about 7 inches, and a thickness having a range from about 2 inches to about 0.5 inches.

The above-mentioned examples are provided to serve the purpose of clarifying the aspects of the invention, and it will be apparent to one skilled in the art that they do not serve to limit the scope of the invention. By way of example, the battery may include more than two flexible omnidirectional leads. Also by way of example, the pouch may have different dimensions than those listed. By nature, this invention is highly adjustable, customizable and adaptable. The above-mentioned examples are just some of the many configurations that the mentioned components can take on. All modifications and improvements have been deleted herein for the sake of conciseness and readability but are properly within the scope of the present invention.

The invention claimed is:

1. A system for charging a portable battery pack comprising:
the portable battery pack including one or more batteries enclosed in a wearable pouch;
wherein the one or more batteries include:
at least one battery element;
a battery cover including one or more channels to accommodate wires of one or more flexible omnidirectional leads and a compartment sized to receive the at least one battery element;
a battery back plate attached to the battery cover; and
the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover;
wherein the wearable pouch includes:
a closeable opening through which the one or more batteries are operable to be removed from the wearable pouch; and
one or more openings through which the one or more flexible omnidirectional leads from the one or more batteries can be accessed; and
wherein the one or more flexible omnidirectional leads are operable to charge the one or more batteries.

2. The system of claim 1, wherein the closable opening can be closed by a mechanism selected from the group consisting of a zipper, a hook and loop system, one or more buttons, one or more snaps, one or more ties, one or more buckles, one or more clips, and one or more hooks.

3. The system of claim 1, wherein one or more of the at least one battery element, the battery cover, and the battery back plate have a curvature or a contour adapted to conform to a curvature or a contour of a load-bearing platform or a wearer.

4. The system of claim 1, wherein the wearable pouch and/or the one or more batteries include a material resistant to bullets, knives, shrapnel, and/or other projectiles.

5. The system of claim 1, wherein an interior of the wearable pouch includes a first set of straps and a second set of straps, wherein the first set of straps is oriented substantially perpendicular to the second set of straps, wherein each strap in the first set of straps is oriented substantially parallel to other straps in the first set of straps, and wherein each strap in the second set of straps is oriented substantially parallel to other straps in the second set of straps.

6. The system of claim 1, wherein the one or more flexible omnidirectional leads charge the one or more batteries using at least one charging device, wherein the at least one charging device is at least one solar panel, and wherein the at least one solar panel includes one or more solar modules electrically connected to one another and to at least one output connector.

7. The system of claim 6, wherein the portable battery pack and/or the at least one solar panel is Modular Lightweight Load-carrying Equipment (MOLLE)-compatible.

8. The system of claim 6, wherein the portable battery pack and/or the at least one solar panel is operable to affix to a vest, a plate carrier, or body armor using at least one zipper.

9. The system of claim 6, wherein the wearable pouch, the at least one solar panel, and/or the one or more batteries include at least one layer of a material resistant to heat.

10. The system of claim 6, wherein an interior of the wearable pouch and/or the at least one solar panel includes at least one integrated pocket.

11. The system of claim 6, wherein the one or more solar modules includes at least two solar modules, and wherein the at least two solar modules are electrically connected to one another in a configuration selected from the group consisting of series, parallel, or combinations thereof.

12. The system of claim 6, wherein the at least one output connector includes one or more connectors that allow the at least one solar panel to connect to a second solar panel in series or in parallel.

13. The system of claim 6, wherein the one or more solar modules are mounted to a substrate, wherein a first layer of fabric and a second layer of fabric are positioned on a top and a bottom of the substrate, wherein at least one of the first layer of fabric and the second layer of fabric comprises one or more openings, wherein the one or more openings have one or more dimensions substantially equivalent to one or more dimensions of the one or more solar modules.

14. A system for charging a portable battery pack comprising:
the portable battery pack including one or more batteries enclosed in a wearable pouch;
wherein the one or more batteries are rechargeable and include:
at least one battery element;
a battery cover including one or more channels to accommodate wires of one or more flexible omnidirectional leads and a compartment sized to receive the at least one battery element;
a battery back plate attached to the battery cover; and
the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover;
wherein the wearable pouch includes:
a closeable opening through which the one or more batteries are operable to be removed from the wearable pouch; and
one or more openings through which the one or more flexible omnidirectional leads from the one or more batteries can be accessed;
wherein the one or more flexible omnidirectional leads are operable to charge at least one of the one or more batteries;
wherein the one or more flexible omnidirectional leads are operable to charge the one or more batteries; and
wherein the one or more flexible omnidirectional leads are operable to supply power to a power consuming device.

15. The system of claim 14, wherein the one or more flexible omnidirectional leads are operable to simultaneously charge at least one of the one or more batteries and supply power to the power consuming device.

16. The system of claim 14, wherein the one or more flexible omnidirectional leads charge the one or more batteries using at least one charging device, wherein the at least one charging device is at least one solar panel, and wherein the at least one solar panel includes one or more solar modules electrically connected to one another and to at least one output connector.

17. A system for supplying power to a portable battery pack using at least one charging device comprising:
the portable battery pack including one or more batteries enclosed in a wearable pouch; and
the at least one charging device;
wherein the one or more batteries include:
at least one battery element;
a battery cover including one or more channels to accommodate wires of one or more flexible omnidirectional leads and a compartment sized to receive the at least one battery element;
a battery back plate attached to the battery cover; and
the one or more flexible omnidirectional leads including a connector portion and a wiring portion, wherein a flexible spring is provided around the wiring portion, wherein the wiring portion and the flexible spring are held securely in the one or more channels in the battery cover such that a portion of the flexible spring is positioned inside the battery cover and a portion of the flexible spring is positioned outside the battery cover;
wherein the wearable pouch includes:
a closeable opening through which the one or more batteries are operable to be removed from the wearable pouch; and
one or more openings through which the one or more flexible omnidirectional leads from the one or more batteries can be accessed;
wherein the wearable pouch includes a pouch attachment ladder system (PALS) operable to attach the wearable pouch to a load-bearing platform; and
wherein the at least one charging device is operable to supply power to the one or more batteries.

18. The system of claim 17, wherein the load-bearing platform is selected from the group consisting of a vest, a backpack, a helmet, a chair, a seat, a boat, a kayak, and body armor.

19. The system of claim 17, wherein the pouch attachment ladder system comprises a plurality of straps, a plurality of horizontal rows of webbing, a plurality of slits, and combinations thereof.

20. The system of claim 17, wherein the at least one charging device is at least one solar panel, and wherein the at least one solar panel includes one or more solar modules electrically connected to one another and to at least one output connector.

* * * * *